(12) United States Patent
Katakura et al.

(10) Patent No.: US 7,123,175 B2
(45) Date of Patent: Oct. 17, 2006

(54) ANGLE DETECTION APPARATUS COMPUTING PHASE DIFFERENCES BETWEEN FIRST AND SECOND PHASE ANGLES

(75) Inventors: Masayuki Katakura, Kanagawa (JP); Asako Toda, Kanagawa (JP); Yuichi Takagi, Kanagawa (JP); Hiroshi Kushihara, Nagano Prefecture (JP)

(73) Assignees: Sony Corporation, Tokyo (JP); Tamagawa Seiki Co., Ltd., Nagano (JP)

( * ) Notice: Subject to any disclaimer, the term of this patent is extended or adjusted under 35 U.S.C. 154(b) by 0 days.

(21) Appl. No.: 11/205,079

(22) Filed: Aug. 17, 2005

(65) Prior Publication Data
US 2006/0132338 A1 Jun. 22, 2006

(30) Foreign Application Priority Data
Aug. 23, 2004 (JP) ............................. 2004-242664

(51) Int. Cl.
*H03M 1/48* (2006.01)
(52) U.S. Cl. ..................... 341/112; 341/111
(58) Field of Classification Search ................ 341/112, 341/116, 111; 318/608, 661, 654, 605; 340/870.18, 340/870.25; 375/346; 700/195; 702/87, 702/151; 708/809; 324/207.25
See application file for complete search history.

(56) References Cited

U.S. PATENT DOCUMENTS

| | | | | |
|---|---|---|---|---|
| 3,579,268 A | * | 5/1971 | Steiger ...................... 708/809 |
| 3,800,228 A | * | 3/1974 | Acker ........................ 375/346 |
| 4,204,257 A | * | 5/1980 | Hungerford ................. 700/195 |
| 4,710,770 A | * | 12/1987 | Hakata et al. ......... 340/870.18 |
| 4,795,954 A | * | 1/1989 | Sakurai et al. .............. 318/661 |
| 4,857,926 A | * | 8/1989 | Neglia et al. ............... 341/116 |
| 4,972,186 A | * | 11/1990 | Morris ................... 340/870.25 |
| 4,989,001 A | * | 1/1991 | Serev ......................... 341/116 |
| 5,796,231 A | * | 8/1998 | Kyodo ........................ 318/608 |
| 5,796,357 A | | 8/1998 | Kushihara ................... 341/116 |
| 6,104,328 A | * | 8/2000 | Alhorn et al. .............. 341/112 |
| 6,278,388 B1 | | 8/2001 | Kushihara ................... 341/112 |
| 6,925,401 B1 | * | 8/2005 | Kameya ...................... 702/87 |
| 6,972,700 B1 | * | 12/2005 | Kanekawa et al. ......... 341/116 |

FOREIGN PATENT DOCUMENTS

JP     11-083544     3/1999

* cited by examiner

*Primary Examiner*—Rexford Barnie
*Assistant Examiner*—Joseph Lauture
(74) *Attorney, Agent, or Firm*—Rader, Fishman & Grauer PLLC; Ronald P. Kananen

(57) ABSTRACT

A resolver use angle detection IC subjected to a phase lock operation so as to follow not an angle $\theta(t)$ for detection, but a phase angle $\omega_0 t \pm \theta(t)$ having an offset of a frequency $\omega_0 t$ in the phase lock units. For this reason, when the excitation frequency $\omega_0 t$ is set sufficiently high with respect to the frequency of the angle $\theta(t)$, the phase angle $\omega_0 t \pm \theta$ to be followed in the phase lock units will not become zero. For this reason, an angle having a high precision can be found in real time regardless of the configuration not including the conventional apparatus in which the configuration is complex and the power consumption is large like a bipolar VCO and an up/down type counter.

19 Claims, 28 Drawing Sheets

FIG. 3A
FIG. 3B
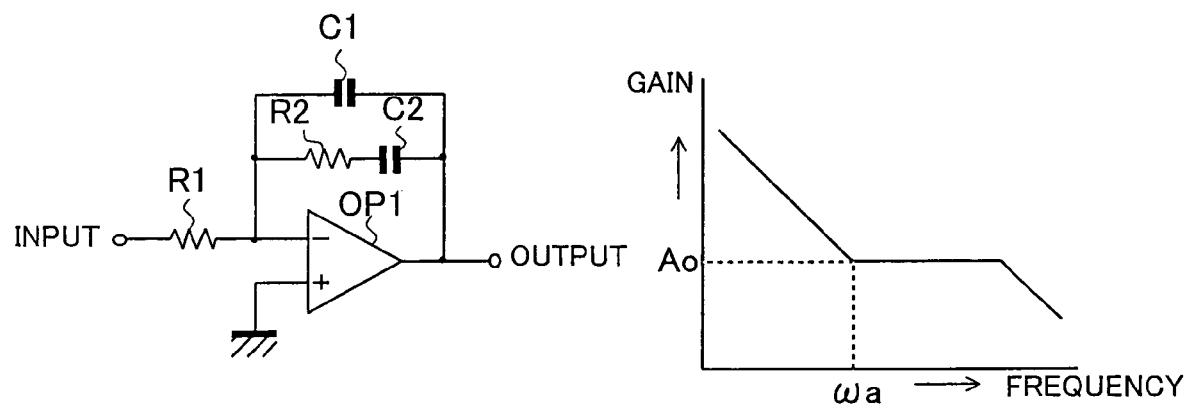
FIG. 4
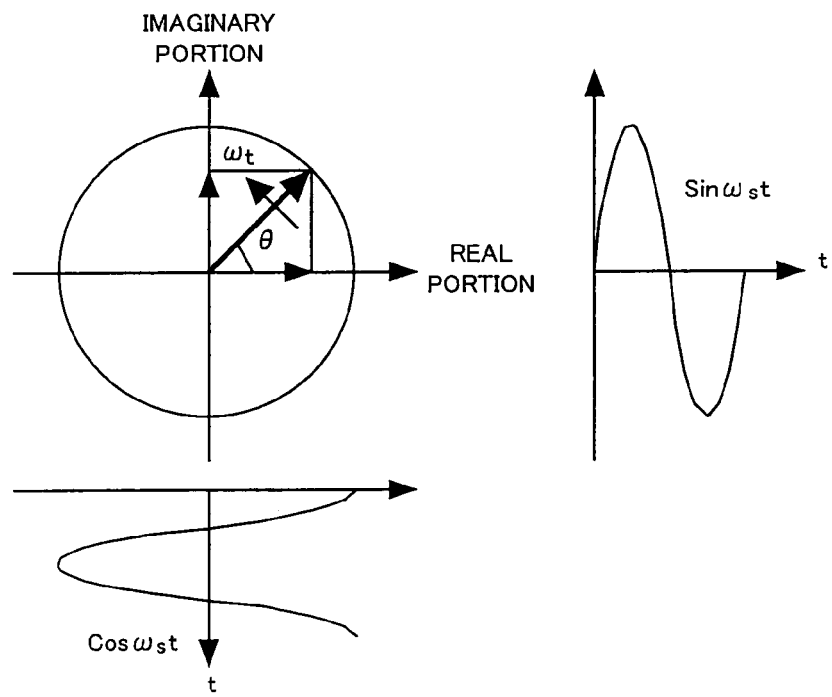

$$V_I = V_o \cdot \cos\omega_0 t \cdot \cos\theta_{(t)}$$

$$V_Q = V_o \cdot \cos\omega_0 t \cdot \sin\theta_{(t)}$$

$$V = V_o \cdot \sin\omega_0 t \cdot \sin\theta_{(t)}$$

FIG. 10
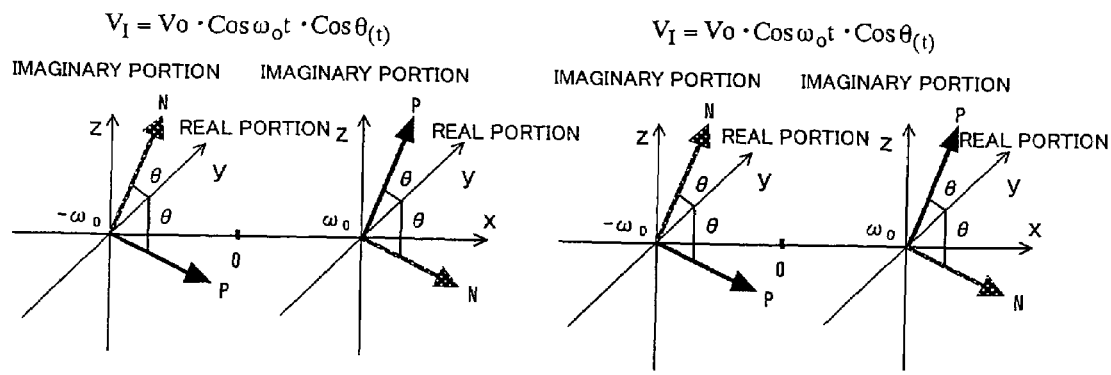
−SUBTRACTION  +ADDITION
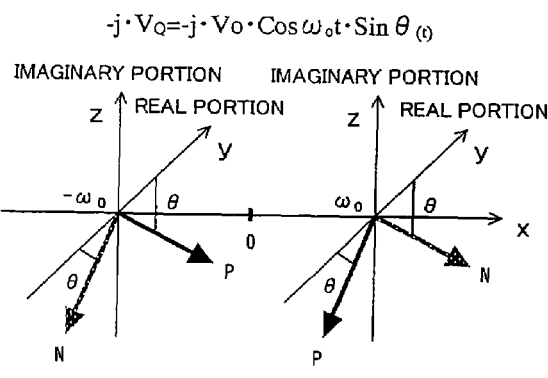 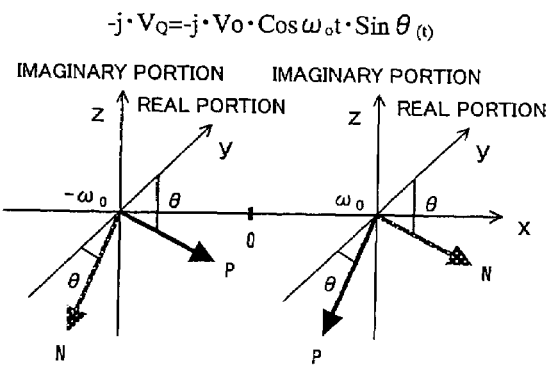
 
SUBTRACTION OUTPUT: $V_{CP}$   ADDITION OUTPUT: $V_{CN}$
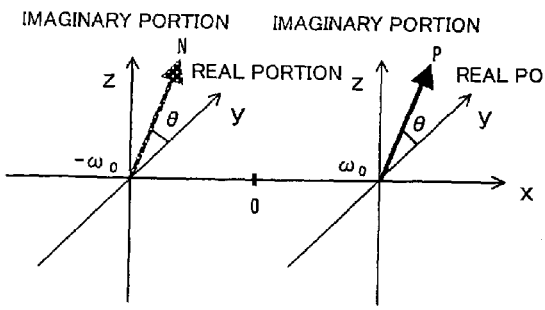 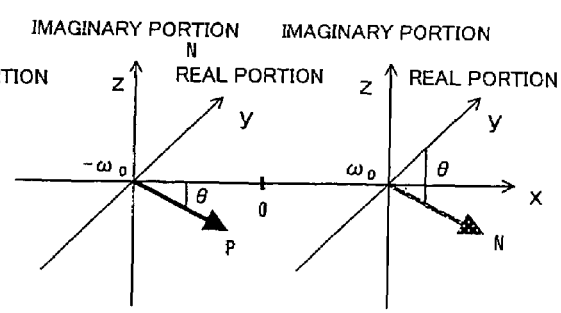

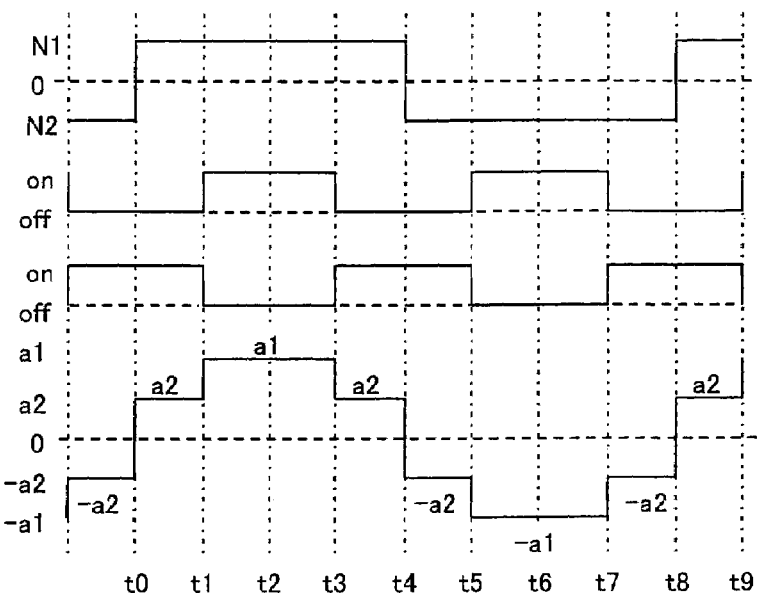
FIG. 20
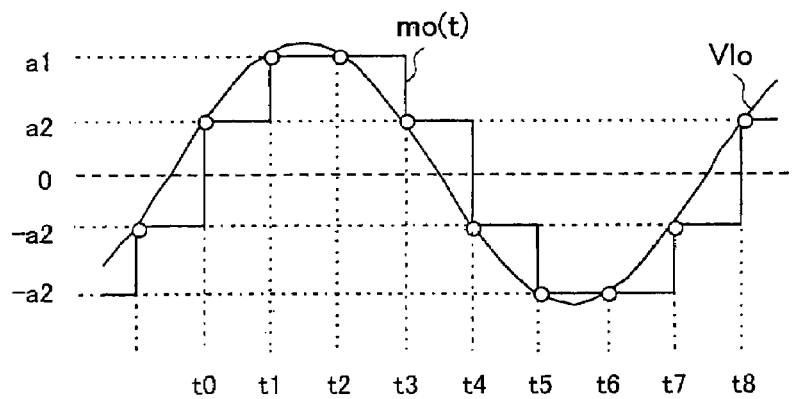

ANGLE DETECTION APPARATUS COMPUTING PHASE DIFFERENCES BETWEEN FIRST AND SECOND PHASE ANGLES

CROSS REFERENCES TO RELATED APPLICATIONS

The present invention contains subject matter related to Japanese Patent Application No. 2004-242664 filed in the Japan Patent Office on Aug. 23, 2004, the entire contents of which being incorporated herein by reference.

BACKGROUND OF THE INVENTION

1. Field of Invention

The present invention relates to an angle detection signal processing apparatus for processing an angle detection signal of a resolver to finding angle data.

2. Description of the Related Art

In a variety of mechanical devices, determining the positional information of rotary shafts and moving parts is a fundamental function. For example, in a motor, in order to impart the optimum torque to a rotor, it is necessary to control the rotating magnetic field to the optimum field in accordance with the position of the rotor. For example, for automobiles, highly reliable, low cost angle sensors are demanded in the motors and power steering of hybrid cars. Further, there are manifold applications of such angle sensors, for example, bulldozers and other construction machines, various machine tools, production facilities, and further aerospace systems.

An extremely large variety of methods have been devised for detecting and controlling angles. For example, for the easiest control of angles, a stepping motor is used. This uses the number of pulses generated accompanied with rotation as information on the angle. However, the method using a stepping motor cannot detect slippage by the stepping motor per se when slippage occurs during the rotation, so cannot be said to be high in reliability.

For angle control with a high reliability, some sort of angle sensor is generally used. As a representative angle sensor, for example a sensor using a Hall-effect sensor to magnetically detect the relative positions of a magnetization pattern and a Hall-effect sensor and another sensor detecting the angle by an optical method such as an optical encoder are known. However, these are not sufficient for applications where an extremely high reliability is required. The use of a Hall-effect sensor cannot be said to be rugged against heat and vibration, while the optical method is susceptible to fouling by oil etc. and in addition requires a light source, therefore it suffers from the disadvantage of reliability.

At the present time, as a rugged angle sensor having the highest reliability, an angle sensor utilizing electromagnetic induction is known. This angle sensor is referred to as a "resolver" and has a structure resembling that of the motor in principle as shown in FIG. 29.

A coil 52 wound around a rotor 51 is excited by an excitation signal $V_E$ having a frequency of $\omega_o$. Two coils 54 and 55 are arranged in a stator 53 at right angles. When the rotor 51 rotates by exactly an angle $\theta(t)$ about a shaft, the following signals $V_I$ and $V_Q$ are induced in the coils 54 and 55 as in the following equations:

$$V_I = V_O \cdot \cos \omega_o t \cdot \cos \theta_{(t)} \quad (1)$$

$$V_Q = V_O \cdot \cos \omega_o t \cdot \sin \theta_{(t)} \quad (2)$$

An angle detection signal processing apparatus detects the angle $\theta(t)$ by this signal. Particularly, a signal processing apparatus outputting the angle in the form of digital data is called a "resolver-digital (R-D) converter". A resolver basically has only a rotor, a stator, and a coil made of magnetic bodies, therefore, it has the features of being rugged and resistant to environmental effects such as dirt or temperature. For this reason, the resolver is the angle detection system most suitable for automobiles, bulldozers and other construction machines, machine tools, production facilities, and further aerospace systems and other applications where a high reliability is required.

For actual resolvers, a variety of structures have been proposed. FIG. 29 shows a basic structure. With this, a rotation brush is required for supplying an excitation current to the rotor. In order to eliminate that, a structure using a rotary converter or a newer structure in which the rotor is not given a coil, the rotor is excited by the coil of the stator, and a change in magnetic flux due to a change of the clearance between the rotor and the stator is sensed by the stator has been proposed. A resolver outputting the signals represented by equation (1) and equation (2) will be referred to as a "one-phase excitation two-phase output type" in the following description.

As explained above, among the variety of structures, when focusing on the signals obtained from the resolver as output, as shown in equation (1) and equation (2), a one-phase excitation two-phase output type resolver having a shaft rotation angle $\theta(t)$ and outputting a signal obtained by modulating the excitation signal by a cosine function Cos $\theta(t)$ and a sine function Sin $\theta(t)$ is most generally used.

On the other hand, when considering this from the ease of signal processing, a resolver outputting a product $\cos\theta_o t \times \cos\theta(t)$ of cosine functions and a product $\sin\theta_o t \times \sin\theta(t)$ of sine functions is better. However, the resolver outputting such signals must provide two independent rotors 56 and 57 and stators 58 and 59 on the same axis as shown in FIG. 30. Such a method is referred to as a "two-phase excitation two-phase output type". The signal processing becomes very easy. However, it suffers from a large disadvantage in the structure, for example two independent pairs of rotors and stators become necessary, the mechanical structure is complex, and the structure becomes very thick, so this is used rarely.

The reason why the signal processing of the two-phase excitation two-phase output type becomes easy will be explained in brief next. The signals $V_I$ and $V_Q$ output from the two-phase excitation two-phase output type resolver may be represented by the following equations:

$$V_I = \cos\omega_o t \cdot \cos\theta_{(t)} = 1/2\{\cos(\omega_o t + \theta_{(t)}) + \cos(\omega_o t - \theta_{(t)})\} \quad (3)$$

$$V_Q = \sin\omega_o t \cdot \sin\theta_{(t)} = 1/2\{-\cos(\omega_o t + \theta_{(t)}) + \cos(\omega_o t - \theta_{(t)})\} \quad (4)$$

From the above equations, a cosine signal $\cos(\omega_o t+\theta(t))$ and $\cos(\omega_o t-\theta(t))$ are easily obtained by obtaining the difference and sum as shown below:

$$V_P = V_I - V_Q = \cos(\omega_o t + \theta(t)) \quad (5)$$

$$V_N = V_I + V_Q = \cos(\omega_o t - \theta(t)) \quad (6)$$

When the signals can be converted in this way, for example, by measuring the time difference at the zero cross point of the two signals, the angle $\theta(t)$ can be very easily found. FIG. 31 is a block diagram expressing that signal processing. First, by subtraction and addition of the signals $V_I$ and $V_Q$, the signals $V_P$ and $V_N$ are found. Next, through a comparator, the zero cross of the signals $V_P$ and $V_N$ is found. Then, for example if calculating the rising edges thereof by a differentiation circuit and counting the number of clock pulses between the rising edges of the signals $V_P$ and $V_N$ by a counter, this becomes proportional to the found angle θ(t). Accordingly, from the count of this counter, an output obtained by digital conversion of the angle θ(t) can be extracted.

Next, an explanation will be given of an R-D converter widely used in a one-phase excitation two-phase output type resolver. FIG. 32 shows an example of the configuration thereof. For example, in order to obtain angle data of 12 bits, a read only memory (ROM) for storing a sine signal and a cosine signal having at least 11 bits of resolution, desirably 12 bits of resolution, is prepared, and a sine signal Sin φ(t) and a cosine signal Cos φ(t) are generated with respect to any angle φ(t). They are converted to analog signals at a D/A converter (DAC). In order to make the angle φ(t) correspond to the angle θ(t) to be found, the signal $V_I$ output from the resolver is multiplied by the sine signal Sin φ(t) and, at the same time, the signal $V_Q$ is multiplied by the cosine signal Cos φ(t). Then, the former is inverted and added to the latter, whereby the signal V1 shown in the following equation is generated.

$$V1 = -\cos\omega_o t \cdot \cos\theta_{(t)} \cdot \sin\varphi_{(t)} + \cos\omega_o t \cdot \sin\theta_{(t)} \cdot \cos\varphi_{(t)} \quad (7)$$
$$= \cos\omega_o t \{\sin(\theta_{(t)} - \varphi_{(t)})\}$$

Further, the signal V1 of equation (7) is multiplied with the cosine signal Cos $\omega_o t$ for synchronization wave detection. By this, the component of the sine signal Sin$\{\theta_{(t)}-\phi_{(t)}\}$ is extracted.

$$V2 = V1 \cdot \cos\omega_o t \quad (8)$$
$$= \cos^2\omega_o t \{\sin(\theta_{(t)} - \varphi_{(t)})\}$$
$$= (1 + \cos 2\omega_o t)/2\{\sin(\theta_{(t)} - \varphi_{(t)})\} \Rightarrow (1/2)\sin(\theta_{(t)} - \varphi_{(t)})$$

The cosine term Cos $2\omega_o t$ in equation (8) has a high frequency, therefore is attenuated in a loop filter and only the low frequency term at the end of equation is extracted. The output of this loop filter is input to a bipolar voltage controlled oscillator (VCO). The bipolar VCO, as shown in FIG. 33, generates a pulse signal having a frequency proportional to an absolute value of the input signal and a polarity signal for judging the polarity of the input. An up/down counter performs an up count in accordance with the pulse signal of the bipolar VCO when the polarity signal is positive, while performs a down count when the polarity signal is negative. As a result, the count of the up/down counter becomes the digital data of the angle φ(t) per se.

The digital data of the obtained angle φ(t) are converted to the digital data of the sine signal Sin φ(t) and the cosine signal Cos φ(t) by the sine/cosine ROM and are converted to analog signals at the D/A converter. The loop filter has an integration characteristic and has an infinitely large DC gain, so the normal value of the input must be zero for the finite output. Accordingly, the angle φ(t) changes so as to follow the angle θ(t).

For reference, see Japanese Unexamined Patent Publication (Kokai) No. 11-83544.

The angle detection method using the zero cross point of signals as shown in FIG. 31 in a two-phase excitation two-phase output type resolver has the following disadvantages.

FIG. 34 is a graph showing an example of signal waveforms of portions in the circuit shown in FIG. 31. In the example of FIG. 34, the count of the clock pulse CP is started from a time t1 when the zero cross point of the signal $V_P$ occurs. The count ends at a time t2 when the zero cross point of the signal $V_N$ occurs. This count reflects the angle θ(t) and can be used as the digital value of the angle as it is. One count is extracted at the time t2.

In the circuit shown in FIG. 31, when the angle θ(t) quickly changes, it cannot be strictly defined at which point of time the digital value of angle obtained at the time t2 is detected as the data. This is because the zero cross point of the signal $V_P$ indicates the state of the signal $V_P$ at the time t1, and the zero cross point of the signal $V_N$ indicates the state of the signal $V_N$ at the time t2, therefore the angle θ(t) of the phase difference between the two can be only defined as the angle around the time t1 and t2 at most. Further, the output of the data of the angle at the time t2 means that a delay clearly occurs until the angle is detected and the data is obtained. In addition, data can be obtained only once for each cycle of the excitation frequency, so the continuous change of the angle cannot be grasped. Due to such a disadvantage, an R-D converter finding an angle by a zero cross point is not suited to, for example, an application where it is necessary to find the angle of a shaft rotating at a high speed in real time.

Another disadvantage of the method using the zero cross point of the signals is that this method lacks a high tolerance against an external noise. This is because when even slight noise enters near the zero cross point, the time of the zero cross point fluctuates.

On the other hand, the R-D converter shown in FIG. 32 is characterized in that that the output is obtained in real time. The up/down counter constantly holds the data of the angle φ(t). There exists a delay due to the angle φ(t) following the angle θ(t), but usually the delay is sufficiently short with respect to the mechanical movement of the angle θ(t). Further, this system compares the entire waveforms, therefore even if part has external noise superimposed on it, it is not susceptible to it as in zero cross detection.

However, the R-D converter shown in FIG. 32 has the disadvantages that the processing is complex and the circuit scale is large and as a result the power consumption is large and the cost is high. Namely, a complex bipolar VCO or up/down counter is needed. Further, in order to obtain a 12 bit resolution, a large capacity sine/cosine ROM having a resolution of at least 11 bits, desirably 12 bits and precision, and a D/A converter having a high resolution are required.

FIG. 35 is a graph for explaining the resolution necessary for the sine/cosine ROM and the D/A converter. In order to decompose an angle 2π by 12 bits, when considering the maximum inclination of the sine wave, a resolution of 1/π of 12 bits is necessary. Namely, when 2π is decomposed to 212 the maximum value of the step of the output becomes "$1/(2^{12}/\pi)$". Accordingly, 10 bits are slightly insufficient, and 11 bits are necessary. When considering other error factors, 12 bits are desirable if desiring to give some extra margin. If simply provided by a table of the ROM, a considerably large sized memory is necessary. There is also the technique of reducing the amount of memory used by interpolation etc. In any case, this requires both an advanced large sized analog circuit and digital circuit, consumes large electric power, and is therefore expensive.

A bipolar VCO must start oscillating from zero frequency, therefore is difficult to realize as a circuit. In addition, a dead zone easily occurs near zero frequency, so there is the disadvantage that phase lock loop control becomes unstable.

An analog multiplier circuit is an element restricting the system performance. As the analog multiplier circuit, the circuit shown in FIG. 36 called a "Gilbert type multiplier circuit" is used for general purposes. This circuit is an analog function circuit widely used for example as a mixer of a wireless communication circuit (frequency mixing circuit). This circuit adeptly utilizes the characteristics of a bipolar transistor so as to be able to operate up to a high frequency with a very simple circuit. However, the absolute precision does not reach the required level for a function circuit for high precision signal processing such as an R-D converter requiring a precision of for example 12 bits or more. The dynamic range of the input of this circuit is for example about 20 mVp-p. The input conversion offset voltage with respect to that is typically about 1 to 2 mV. Accordingly, as the absolute precision, about 10% is just the guaranteed range. There is also the method of enlarging the dynamic range by an emitter feedback resistor or other means, but the offset voltage also increases, therefore the relative precision is not enhanced that much. Even when using trimming or another method together for a circuit solution, it is very difficult to guarantee an absolute precision of 1%. Accordingly, a precision of about 8 bits can be achieved, but this is far from 12 bits. For this reason, in the high precision R-D converter, it was necessary to use a multiplication type D/A converter etc. in place of a Gilbert type multiplier circuit to avoid the restrictions on precision of the multiplier circuit. Accordingly, the means for realizing the analog multiplier circuit becomes a factor inducing an increase of the power consumption and an increase of cost in order to achieve a high precision.

SUMMARY OF THE INVENTION

It is desirable to provide an angle detection signal processing apparatus which is simply configured, yet is able to find a high precision angle in real time.

According to a first aspect of invention, there is provided an angle detection signal processing apparatus for acquiring information of a first angle based on a detection output of a resolver including a first angle detection signal containing an amplitude of a first excitation signal having a first frequency (for example a frequency $\omega_o$ in a first embodiment) modulated by a signal of a cosine function having a first angle and a second angle detection signal comprised of an amplitude of a second excitation signal having the first frequency modulated by a signal of a sine function having the first angle, including a signal processing unit, a first phase lock unit, a second phase lock unit, and a phase difference computation unit.

The signal processing unit outputs a first signal and a second signal having the first frequency and, at the same time, having a phase difference in accordance with the first angle based on the first angle detection signal and the second angle detection signal. The first phase lock unit generates a first phase locked signal locking the phase to the first signal and outputs first data indicating a phase angle of the first phase locked signal. The second phase lock unit generates a second phase locked signal locking the phase to the second signal and outputs second data indicating a phase angle of the second phase locked signal. The phase difference computation unit computes a phase difference between the first phase locked signal and the second phase locked signal based on the first data and the second data.

The mode of operation of the first aspect of the invention will be explained next. In the signal processing unit, the first signal and the second signal having the first frequency and, at the same time, having the phase difference in accordance with the first angle based on the first angle detection signal and the second angle detection signal are generated. In the first phase lock unit, the first phase locked signal obtained by locking the phase to the first signal is generated and the first data indicating the phase angle of the first phase locked signal is output. In the second phase lock unit, the second phase locked signal obtained by locking the phase to the second signal is generated and the second data indicating the phase angle of the second phase locked signal is output. Further, in the phase difference computation unit, the phase difference between the first phase locked signal and the second phase locked signal based on the first data and the second data is computed.

Due to this, the phase difference between the first signal and the second signal has a value in accordance with the first angle. Further, the phase difference between the first phase locked signal and the second phase locked signal phase-locked in these signals has a value in accordance with the phase difference between the first signal and the second signal. Accordingly, the phase difference between the first phase locked signal and the second phase locked signal has a value in accordance with the first angle. Namely, the phase difference of the result of computation of the phase difference computation unit has a value in accordance with the first angle.

In the first and second phase lock units, the phases are locked to signals both having the first frequency, therefore, even if the first angle becomes a constant value of the frequency zero, the first and second phase locked signals are controlled so as to have the first frequency. For this reason, it is not necessary to provide a means oscillating at the frequency zero like for example a bipolar VCO in order to output the first and second data indicating the phase angles of the first and second phase locked signals.

Further, the phase difference between the first signal and the second signal is not found from the time difference at the zero cross point, but is found based on the first and second data successively output at the first and second phase lock units, therefore, it becomes possible to acquire the information of the first angle in real time. Further, this system is not susceptible to external noise in comparison with the method of using the zero cross point.

According to a second aspect of the invention, there is provided the first aspect of the invention where the first excitation signal and the second excitation signal are signals of a cosine function having the first frequency. In this case, the signal processing unit outputs a complex signal containing the first angle detection signal as a real component and the second angle detection signal as an imaginary component to the first phase lock unit as the first signal and, at the same time, outputs a complex signal comprised of the first angle detection signal as the real component and a signal obtained by inverting the polarity of the second angle detection signal as the imaginary component to the second phase lock unit as the second signal.

The first phase lock unit and the second phase lock unit have phase angle data generation units, complex signal processing units, and feedback units. The phase angle data generation unit generates data repeated in a cycle in accordance with the input feedback control signal and indicating the phase angle in the cycle as the first data or the second data. The complex signal processing unit generates a signal in accordance with a deflection angle of the complex signal obtained when multiplying the first complex signal input from the signal processing unit and the second complex signal including a first signal component and a second signal component having phase angles in accordance with the data generated at the phase angle data generation unit and orthogonal to each other and having a frequency set at a predetermined polarity. The feedback unit generates a feedback control signal for feedback control so that the deflection angle is converged to a constant value in accordance with the signal generated in the complex signal processing unit.

The mode of operation of the second aspect invention will be explained next. As explained above, the data generated at the phase angle data generation unit is repeated in a cycle in accordance with the feedback control signal and indicates the phase angle within the cycle. For this reason, both of the first signal component and the second signal component having phase angles in accordance with this data have frequencies in accordance with the feedback control signal. Namely, the second complex signal is a complex signal having a frequency of a magnitude in accordance with the feedback control signal and, at the same time, having a frequency set at the predetermined polarity. The complex signal processing unit generates a signal in accordance with the deflection angle of the complex signal obtained when multiplying this second complex signal and the first complex signal. The deflection angle of the complex signal obtained when multiplying the second complex signal and the first complex signal is equal to the deflection angle comprised of the deflection angle of the first complex signal and the deflection angle of the second complex signal added together. For this reason, the complex signal processing unit generates a signal in accordance with this added deflection angle.

Then, the feedback unit generates the feedback control signal for feedback control so that the deflection angle obtained by the addition is converged to a constant value (for example zero) in accordance with the signal generated at the complex signal generation unit.

The deflection angle becoming constant corresponds to the deflection angle becoming constant in terms of time and the frequency becoming zero. Accordingly, in order to converge the above added deflection angle to the constant value, the first complex signal and the second complex signal must have magnitudes equal to each other and have positive and negative inverse polarities.

For this reason, when the second complex signal has a negative frequency, the frequency of the second complex signal is controlled so that this negative frequency cancels the positive frequency of the first complex signal. When the second complex signal has a positive frequency, the frequency of the second complex signal is controlled so that this positive frequency cancels the negative frequency of the first complex signal.

Contrary to this, when the second complex signal and the first complex signal have frequencies having the same polarity, the above added deflection angle always has a frequency and cannot be converged to a constant value. For this reason, in this case, the feedback control does not work and the frequency of the second complex signal does not follow the frequency of the first complex signal.

From the above description, both of the second complex signals with phases locked at the first and second phase lock units become signals locked in phases with respect to frequency components of a specific polarity (inverse polarity to the predetermined polarity) included in the input first complex signal.

The first complex signal (the first signal) input to the first phase lock unit has the first angle detection signal comprised of the amplitude of the signal of the cosine function having the first frequency modulated by a signal of a cosine function having the first angle as a real component and the second angle detection signal comprised of the amplitude of the signal of the cosine function having the first frequency modulated by the signal of the sine function having the first angle as an imaginary component. This complex signal has the first frequency and has positive and negative frequency components with signs different from each other.

Further, the first complex signal (the second signal) input to the second phase lock unit is a complex signal comprised of the first angle detection signal as a real component and the polarity inverted signal of the second angle detection signal as an imaginary signal. This complex signal also has the first frequency and has positive and negative frequency components with signs different from each other.

Note that when comparing the signal components having frequencies of the same polarity between these first signal and second signal, there is a phase difference in accordance with the first angle for both of the positive and negative frequencies. For this reason, the second complex signals of the first and second phase lock units phase-locked to such first and second signals described above have a phase difference in accordance with the first angle in the same way as above. Accordingly, the phase difference computed by the phase difference computation unit based on the first data and the second data indicating the phase difference of these two second complex signals has a value in accordance with the first angle.

Note that, the phase angle data generation unit may have a signal generation unit for generating a signal having a frequency in accordance with the input feedback control signal and a counter having a predetermined bit length for dividing the frequency of the signal generated in the signal generation unit as well and may output the count of the counter as the first data or the second data as well.

Further, the complex signal processing unit may generate a signal in accordance with the real component or the imaginary component of the complex signal obtained when multiplying the first complex signal and the second complex signal as a signal in accordance with the deflection angle as well. It is also possible if the feedback unit generates the feedback control signal for feedback control so that the signal generated in the complex computation unit is converged to a constant value.

In this case, the complex signal processing unit may have a complex signal generation unit, a first computation unit, a second computation unit, and a second computation unit as well. In the complex signal generation unit, the first computation unit generates the first signal component and the second signal component having phase angles in accordance with the data generated at the phase angle data generation unit and orthogonal to each other. The first computation unit multiplies the first signal component generated in the complex signal generation unit and the real component of the first complex signal with each other. The second computation unit multiplies the second signal component generated in the complex signal generation unit and the imaginary component of the first complex signal with each other. The third computation unit computes a sum or a difference of the results of computation of the first computation unit and the second computation unit.

According to the above configuration, in the complex signal generation unit, the first signal component and the second signal component having phase angles in accordance with the data generated at the phase angle data generation unit and orthogonal to each other are generated. In the first computation unit, the first signal component generated in the complex signal generation unit and the real component of the first complex signal are multiplied with each other. In the second computation unit, the second signal component generated in the complex signal generation unit and the imaginary component of the first complex signal are multiplied with each other. In the third computation unit, the sum or difference of the results of computation of the first computation unit and the second computation unit is computed. This result of computation of the sum or difference becomes a signal corresponding to the real portion or the imaginary portion of the complex signal obtained when multiplying the first complex signal and the second complex signal.

Alternatively, the complex signal processing unit may have a fourth computation unit, a fifth computation unit, and a sixth computation unit. The fourth computation unit selects a weight coefficient in accordance with an instantaneous value of the first signal component at a predetermined phase angle within an angular range of a destination of movement from among a plurality of weight coefficients when the phase angle indicated by the data of the phase angle data generation unit shifts to another angular range among a plurality of angular ranges forming parts of one cycle and multiplies the same with the real component of the first complex signal. The fifth computation unit selects a weight coefficient in accordance with an instantaneous value of the second signal component at a predetermined phase angle within the angular range of the destination of movement from among a plurality of weight coefficients when the phase angle indicated by the data of the phase angle data generation unit shifts to another angular range among a plurality of angular ranges forming part of one cycle and multiplies the same with the imaginary component of the first complex signal. The sixth computation unit computes the sum or difference of the results of computation of the fourth computation unit and the fifth computation unit.

According to the above configuration, when the phase angle indicated by the data of the phase angle data generation unit shifts to another angular range among a plurality of angular ranges forming part of one cycle, the weight coefficient in accordance with the instantaneous value of the first signal component at a predetermined phase angle within the angular range of the destination of movement is selected from among a plurality of weight coefficients and multiplied with the real component of the first complex signal. By this, the multiplication result of the first signal component and the real component of the first complex signal is obtained. In the fifth computation unit, when the phase angle indicated by the data of the phase angle data generation unit shifts to another angular range among a plurality of angular ranges forming part of one cycle, the weight coefficient in accordance with the instantaneous value of the second signal component at the predetermined phase angle within the angular range of the related destination of movement is selected from among a plurality of weight coefficients and multiplied with the imaginary component of the first complex signal. By this, the multiplication result of the second signal component and the imaginary component of the first complex signal is obtained. Then, in the sixth computation unit, when the sum or difference of the multiplication results of the fourth computation unit and the fifth computation unit is computed, the result of computation becomes the signal corresponding to the real portion or the imaginary portion of the complex signal obtained when multiplying the first complex signal and the second complex signal.

According to a third aspect of the invention, there is provided the second aspect of the invention where the first excitation signal is a signal of a cosine function having the first frequency, and the second excitation signal is a signal of a sine function having the first frequency. In this case, the signal processing unit outputs the difference between the first angle detection signal and the second angle detection signal as the first signal to the first phase lock unit and, at the same time, outputs the sum of the first angle detection signal and the second angle detection signal as the second signal to the second phase lock unit. The first phase lock unit and the second phase lock unit have phase angle data generation units, phase detection units, and feedback units. The phase angle data generation unit generates data repeated in a cycle in accordance with the input feedback control signal and indicating the phase angle within the cycle as the first data or the second data. The phase detection unit detects the phase difference between the phase locked signal having the phase angle in accordance with the data generated at the phase angle data generation unit and the input signal from the signal processing unit. The feedback unit generates the feedback control signal for feedback control so that the phase difference detected at the phase detection unit is converged to a constant value.

The mode of operation of the third aspect of the invention will be explained next. In the first phase lock unit, the feedback control acts so that the phase difference between the first signal input from the signal processing unit and the first phase locked signal is converged to a constant value. Further, in the second phase lock unit, the feedback control acts so that the phase difference between the second signal input from the signal processing unit and the second phase locked signal is converged to a constant value. For this reason, the phase difference between the first phase locked signal and the second phase locked signal computed in the phase difference computation unit has a value in accordance with the phase difference between the first signal and the second signal. On the other hand, the first signal is the difference between the first angle detection signal containing the amplitude of a signal of a cosine function having the first frequency modulated by a signal of a cosine function having the first angle and the second angle detection signal containing the amplitude of a signal of a sine function having the first frequency modulated by a signal of a sine function having the first angle. Further, the second signal is the sum of this first angle detection signal and the second angle detection signal. For this reason, there is a phase difference in accordance with the first angle between the first signal and the second signal. Accordingly, the information of the first angle is acquired from the phase difference computed in the phase difference computation unit.

Note that, in the third aspect of the invention, the phase angle data generation unit may have a signal generation unit for generating a signal having a frequency in accordance with the input feedback control signal and a counter for dividing the frequency of the signal generated in the signal generation unit as well and may output the count of the counter as the first data or the second data as well.

Further, the phase detection unit may select the weight coefficient in accordance with the instantaneous value of the phase locked signal at a predetermined phase angle within the angular range of the destination of movement from among a plurality of weight coefficients when the phase angle indicated by the data of the phase angle data generation unit shifts to another angular range among a plurality of angular ranges forming part of one cycle and multiply the selected weight coefficient with the input signal from the signal processing unit as well. Due to this, the multiplication result of the input signal from the signal processing unit and the phase locked signal is obtained.

According to a fourth aspect of the invention, there is provided an angle detection signal processing apparatus for acquiring information of a first angle based on a detection output of a resolver including a first angle detection signal containing an amplitude of a first excitation signal having a first frequency modulated by a signal of a cosine function having the first angle and a second angle detection signal containing an amplitude of a second excitation signal having the first frequency modulated by a signal of a sine function having the first angle, including a first phase angle data generation unit, a signal processing unit, a phase lock unit, and a phase difference computation unit.

The first phase angle data generation unit generates first data indicating the phase angle of the excitation signal having the first frequency to be supplied to the resolver. The signal processing unit outputs the signal having the phase difference in accordance with the first angle with respect to the phase angle indicated by the first data and, at the same time, having the first frequency based on the first angle detection signal and the second angle detection signal. The phase lock unit generates the phase locked signal obtained by locking the phase to the output signal of the signal processing unit and outputs the second data indicating the phase angle of the phase locked signal. The phase difference computation unit computes the difference between the phase angle indicated by the first data and the phase angle indicated by the second data.

The mode of operation of the fourth aspect of the invention will be explained next. In the first phase angle data generation unit, the first data indicating the phase angle of the excitation signal to be supplied to the resolver is generated. In the signal processing unit, the signal having the phase difference in accordance with the first angle with respect to the phase angle indicated by the first data and, at the same time, having the first frequency based on the first angle detection signal and the second angle detection signal is output. In the phase lock unit, the phase locked signal obtained by locking the phase to the output signal of the signal processing unit is generated, and the second data indicating the phase angle of the phase locked signal is output. Then, in the phase difference computation unit, the difference between the phase angle indicated by the first data and the phase angle indicated by the second data is computed.

Due to this, the difference between the phase angle of the excitation signal indicated by the first data and the phase angle of the signal output from the signal processing unit has a value in accordance with the first angle. Further, the difference between the phase angle of the phase locked signal obtained by locking the phase to the output signal of the signal processing unit and the phase angle of the signal output from the signal processing unit has a value in accordance with the first angle. Accordingly, the difference between the phase angle of the excitation signal indicated by the first data and the phase angle of the phase locked signal indicated by the second data has a value in accordance with the first angle. Namely, the phase difference of the results of computation of the phase difference computation unit has a value in accordance with the first angle.

In the phase lock unit, the phase is locked to the signal having the first frequency, therefore, even if the first angle becomes a constant value of the frequency zero, the phase locked signal is controlled so as to have the first frequency. For this reason, it is not necessary to provide a means oscillating at a frequency zero like for example the bipolar VCO in order to output the second data indicating the phase angle of the phase locked signal.

Further, the phase difference between the output signal of the signal processing unit and the excitation signal is not found by the time difference of the zero cross point, but is found based on the first and second data output time by time at the first phase angle data generation unit and the phase lock unit, therefore it becomes possible to acquire the information of the first angle in real time. Further, the system is resistant to external noise in comparison with the method of using the zero cross point.

According to a fifth aspect of the invention, there is provided the fourth aspect of the invention where the first excitation signal and the second excitation signal are signals of cosine functions having the first frequency. The signal processing unit outputs the complex signal containing the first angle detection signal as the real component and the second angle detection signal as the imaginary component. The phase lock unit has a second phase angle data generation unit, a complex signal processing unit, and a feedback unit. The second phase angle data generation unit generates data repeated in a cycle in accordance with the input feedback control signal and indicates the phase angle within the cycle as the second data. The complex signal processing unit generates a signal in accordance with the deflection angle of the complex signal obtained by multiplying the first complex signal input from the signal processing unit and a second complex signal including the first signal component and the second signal component having phase angles in accordance with the second data generated at the second phase angle data generation unit and orthogonal to each other and having a frequency set at the predetermined polarity. The feedback unit generates a feedback control signal for feedback control so that the deflection angle is converged to a constant value in accordance with the signal generated in the complex signal processing unit.

The mode of operation of the fifth aspect of the invention will be explained next. The second complex signal of the phase lock unit becomes a signal obtained by locking the phase with respect to the component having a frequency of a specific polarity (a polarity inverse to the predetermined polarity) included in the input above first complex signal in the same way as the first and second phase lock units in the previously explained second aspect of the invention. On the other hand, the first complex signal is a complex signal comprised of the first angle detection signal containing the amplitude of the signal of the cosine function having the first frequency modulated by a signal of a cosine function having the first angle as a real component and the second angle detection signal containing the amplitude of the signal of the cosine function having the first frequency modulated by a signal of a sine function having the first angle as an imaginary component. This complex signal has the first frequency. The frequency component thereof having the positive polarity has a phase difference in accordance with the first angle with respect to the excitation signal. Further, the frequency component having the negative polarity has a phase difference in accordance with the first angle with respect to the excitation signal. For this reason, the second complex signal obtained by locking the phase with respect to the frequency component having one polarity in the first complex signal has a phase difference in accordance with the first angle with respect to the excitation signal. Accordingly, by computing the difference between the phase angle of the excitation signal indicated by the first data and the phase angle of the second complex signal indicated by the second data at the phase difference computation unit, it becomes possible to acquire information of the first angle from the result of computation.

According to a sixth aspect of the invention, there is provided the fourth aspect of the invention wherein the first excitation signal is a signal of a cosine function having the first frequency, and the second excitation signal is a signal of a sine function having the first frequency. The signal processing unit outputs the sum or difference of the first angle detection signal and the second angle detection signal to the phase lock unit. The phase lock unit has a second phase angle data generation unit, a phase detection unit, and a feedback unit. The second phase angle data generation unit generates data repeated in a cycle in accordance with the input feedback control signal and indicating the phase angle within the cycle as the second data. The phase detection unit detects the phase difference between the phase locked signal having a phase angle in accordance with the second data generated in the second phase angle generation unit and the input signal from the signal processing unit. The feedback unit generates a feedback control signal for feedback control so that the phase difference detected at the phase difference detection unit is converged to a constant value.

The mode of operation of the sixth aspect of the invention will be explained next. In the phase lock unit, the feedback control acts so that the phase difference between the input signal from the signal processing unit and the phase locked signal is converged to a constant value. Further, the phase locked signal has a phase angle in accordance with the second data generated at the second phase angle data generation unit. For this reason, the second data becomes data in accordance with the phase angle of the input signal from the signal processing unit. On the other hand, the output signal of the signal processing unit is the sum or difference of the first angle detection signal containing the amplitude of the signal of the cosine function having the first frequency modulated by a signal of a cosine function having the first angle and the second angle detection signal comprised of the amplitude of the signal of the sine function having the first frequency modulated by a signal of a sine function having the first angle. Both of the signal of the sum and the signal of the difference have phase differences in accordance with the first angle with the excitation signals (first excitation signal and second excitation signal). For this reason, there is a phase difference in accordance with the first angle between the phase angle of the excitation signal indicated by the first data and the phase angle of the output signal of the signal processing unit indicated by the second data. Accordingly, the information of the first angle is acquired from the phase difference computed at the phase difference computation unit.

According to the present invention, a high precision angle can be found in real time irrespective of its simple configuration not including a bipolar VCO etc.

BRIEF DESCRIPTION OF THE DRAWINGS

These and other objects and features of the present invention will become clearer from the following description of the preferred embodiments given with reference to the accompanying drawings, wherein:

FIGS. 3A and 3B are diagrams showing an example of the configuration of a feedback unit and an example of transmission characteristics thereof;

FIG. 4 is a diagram showing a complex signal expressed on a complex plane;

FIG. 10 is a diagram illustrating the complex signal processing performed in the first embodiment by vectors;

FIGS. 19A to 19D are diagrams showing an example of control of each switch of the sine wave multiplication unit shown in FIG. 18 in a case where there are two weight coefficients;

FIG. 20 is a diagram for explaining the relationship between a transition of the weight coefficient value selected in a time sequence and a sine wave signal;

DESCRIPTION OF THE PREFERRED EMBODIMENTS

Preferred embodiments of the present invention will be described in detail below while referring to the attached figures.

First Embodiment

Figure 1:
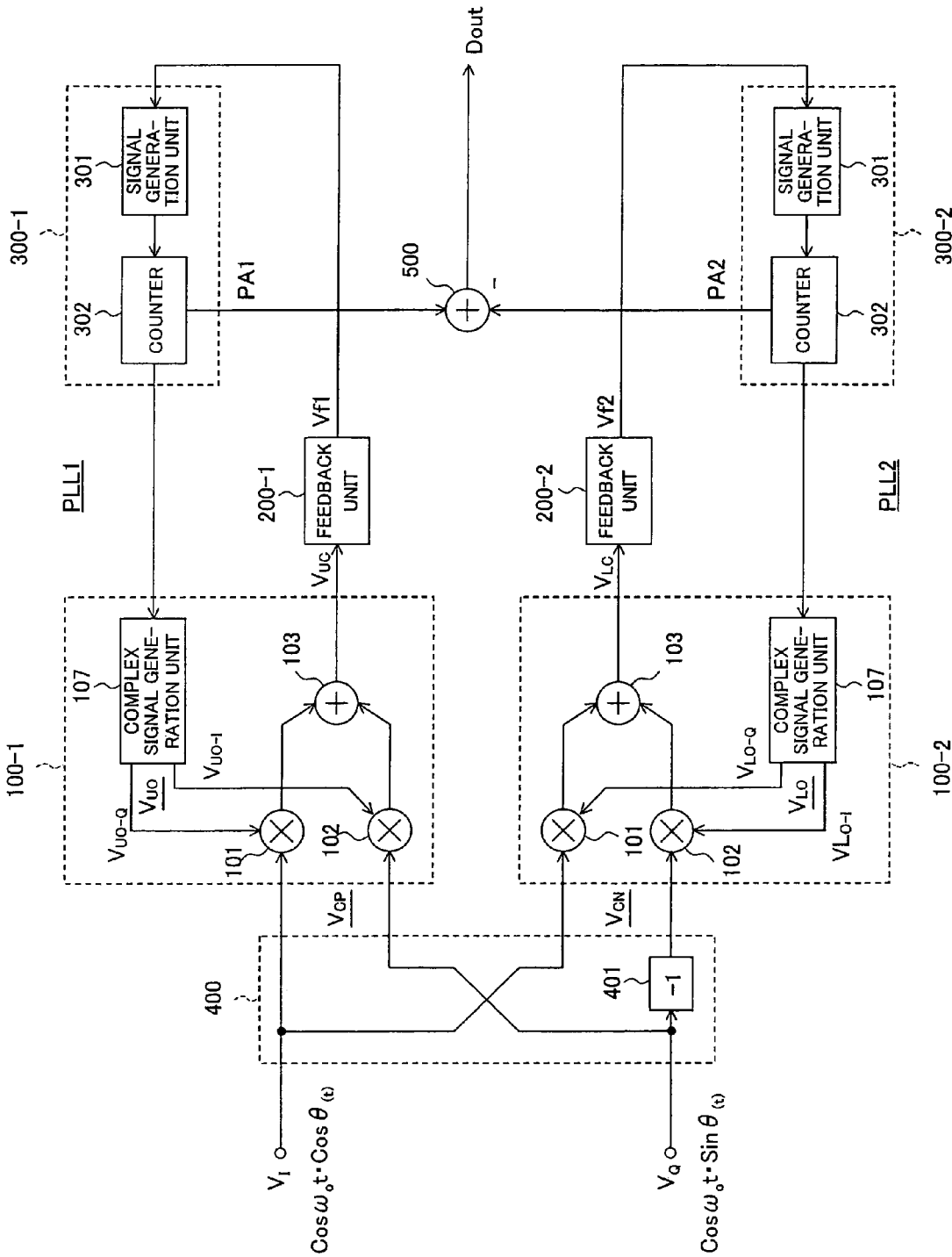
FIG. 1 is a diagram showing an example of the configuration of an angle detection signal processing apparatus according to a first embodiment of the present invention.

FIG. 1 is a diagram showing an example of the configuration of an angle detection signal processing apparatus according to a first embodiment of the present invention. The angle detection signal processing apparatus according to the first embodiment receives as input the angle detection signals indicated by equation (1) and equation (2) output from a 1-phase excitation 2-phase output type resolver:

$V_I = \cos \omega_o t \cdot \cos \theta (t)$ $V_Q = \cos \omega_o t \cdot \sin \theta(t)$ and acquires the information of the angle θ(t). Note that, in the following explanation, the amplitude $V_O$ of the angle detection signal will be defined as "1" and the notation will be omitted.

The angle detection signal processing apparatus shown in FIG. 1 has a signal processing unit 400, first phase lock unit PLL1, second phase lock unit PLL2, and phase difference computation unit 500. The signal processing unit 400 is an embodiment of the signal processing unit of the present invention. The first phase lock unit PLL1 is an embodiment of the first phase lock unit of the present invention. The second phase lock unit PLL2 is an embodiment of the second phase lock unit of the present invention. The phase difference computation unit 500 is an embodiment of the phase difference computation unit of the present invention.

Signal Processing Unit 400

The signal processing unit 400 outputs complex signals $\_V_{CP}$ and $\_V_{CN}$ having the frequency $\omega_o$ and, at the same time, having a phase difference in accordance with the angle θ(t) based on the angle detection signals $V_I$ and $V_Q$.

Note that, in the present specification, the complex signal and the real signal are differentiated by imparting underlines "_" before notations of the complex signals.

The signal processing unit 400, for example as shown in FIG. 1, outputs a complex signal $\_V_{CP}$ comprised of an angle detection signal $V_I$ as a real component and an angle detection signal $V_Q$ as an imaginary component and a complex signal $\_V_{CN}$ comprised of an angle detection signal $V_I$ as a real component and a signal obtained by inverting the polarity of the angle detection signal $V_Q$ as an imaginary component. As will be explained in detail later, the complex signals $V_{CP}$ and $\_V_{CN}$ have components of the positive frequency ($\omega_o$) and the negative frequency ($-\omega_o$). When comparing the frequency components having the same polarity with each other, the phase difference thereof becomes the angle 2×θ(t).

The polarity inversion circuit 401 included in the signal processing unit 400 is a circuit for inverting the polarity of the angle detection signal $V_Q$.

PLL1 and PLL2

The phase lock unit PLL1 generates a complex signal $\_V_{UO}$ obtained by locking the phase to the complex signal $\_V_{CP}$ and outputs data PA1 in accordance with the phase angle of this complex signal $\_V_{UO}$. The phase lock unit PLL2 generates a complex signal $\_V_{LO}$ obtained by locking the phase to the complex signal $\_V_{CN}$ and outputs data PA2 in accordance with the phase angle of this complex signal $\_V_{LO}$.

A usual phase lock circuit locks the phase to the phase of the real signal, while the phase lock units PLL1 and PLL2 lock the phases to the phase of the frequency component having a specific polarity included in the input complex signal. Namely, when the input complex signal has positive and negative frequency components, for example complex signals $\_V_{UO}$ and $\_V_{LO}$ locking the phases to the positive frequency component are generated. Then, the data PA1 and PA2 of the phase angles of the generated complex signals are output.

The detailed configuration of the phase lock units PLL1 and PLL2 will be explained next.

In the example of FIG. 1, the phase lock unit PLL1 has a phase angle data generation unit 300-1, complex signal processing unit 100-1, and feedback unit 200-1. Further, the phase lock unit PLL2 has a phase angle data generation unit 300-2, complex signal processing unit 100-2, and feedback unit 200-2. The phase angle data generation units 300-1 and 300-2 are embodiments of the phase angle data generation unit of the present invention. The complex signal processing units 100-1 and 100-2 are embodiments of the complex signal processing unit of the present invention. The feedback units 200-1 and 200-2 are embodiments of the feedback unit of the present invention.

The phase angle data generation unit 300-1 generates data repeated in a cycle in accordance with a feedback control signal Vf1 input from the feedback unit 200-1 and indicating the phase angle in the cycle as the data PA1 of the phase angle explained above.

The phase angle data generation unit 300-1 has, for example, a signal generation unit 301 and counter 302. The signal generation unit 301 is an embodiment of the signal generation unit of the present invention. The counter 302 is an embodiment of the counter of the present invention.

The signal generation unit 301 is a circuit for generating a signal having a frequency in accordance with the feedback control signal Vf1 and is comprised using for example a voltage controlled oscillator (VCO).

The counter 302 is a circuit for dividing the frequency of the signal generated in the signal generation unit 301 and outputs a count having a predetermined bit length n. For example, it repeatedly outputs the count incremented one by one from "0" to "$2^n-1$". The counter 302 outputs the count of this counter 302 as the previously explained data PA1 of the phase angle.

The phase angle data generation unit 300-2 generates data repeated in a cycle in accordance with a feedback control signal Vf2 input from the feedback unit 200-2 and indicating the phase angle in the cycle as the data PA2 of the phase angle explained above. The phase angle data generation unit 300-2 also is configured using for example the above explained signal generation unit 301 and counter 302 and outputs the count of the counter 302 as the data PA2 of the phase angle.

The complex signal processing unit 100-1 generates a signal $V_{UC}$ in accordance with the deflection angle of the complex signal obtained by multiplying the complex signal $\_V_{CP}$ input from the signal processing unit 400 and the complex signal $\_V_{UO}$ including the signal components $V_{UO-I}$ and $V_{UO-Q}$ having phase angles ($\omega_o t+\omega(t)$) in accordance with the data PA1 generated in the phase angle data generation unit 300-1 and orthogonal to each other and having a frequency set at a predetermined polarity (for example negative). As the signal $V_{UC}$ in accordance with this deflection angle, for example, it generates a signal in accordance with the real component or the imaginary component of the complex signal obtained when complex multiplying the complex signal $\_V_{CP}$ and the complex signal $\_V_{UO}$.

The complex signal processing unit 100-1 has, for example, multiplication units 101 and 102, an adder unit 103, and a complex signal generation unit 107. The multiplication unit 101 is an embodiment of the first computation unit of the present invention. The multiplication unit 102 is an embodiment of the second computation unit of the present invention. The adder unit 103 is an embodiment of the third computation unit of the present invention. The complex signal generation unit 107 is an embodiment of the complex signal generation unit of the present invention.

The complex signal generation unit 107 generates signal components $V_{UO-I}$ and $V_{UO-Q}$ having phase angles in accordance with the data PA1 generated at the phase data generation unit 300-1 and orthogonal to each other. The frequency of the complex signal comprised of the signal component $V_{UO-I}$ as the real component, and the signal component $V_{UO-Q}$ as the imaginary component is set up so as to have the predetermined polarity (for example negative).

The complex signal generation unit 107 converts data of phase angle to data of amplitude by using a ROM having, for example, sine/cosine amplitude data as a table and converts that to an analog signal by the D/A converter to thereby generate the signal components $V_{UO-I}$ and $V_{UO-Q}$.

Figure 2A:
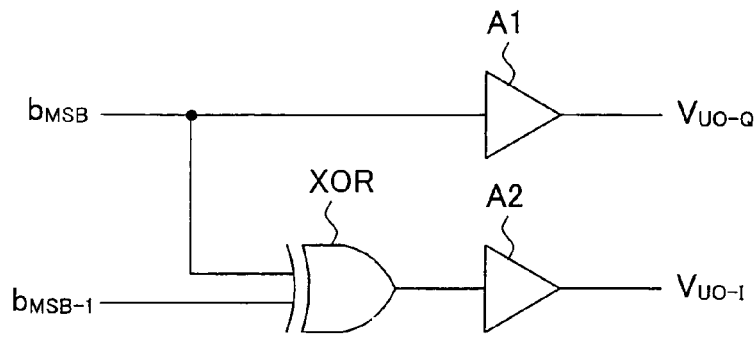
FIGS. 2A to 2C are diagrams showing an example of the configuration of a complex signal generation unit.
Figure 2B:
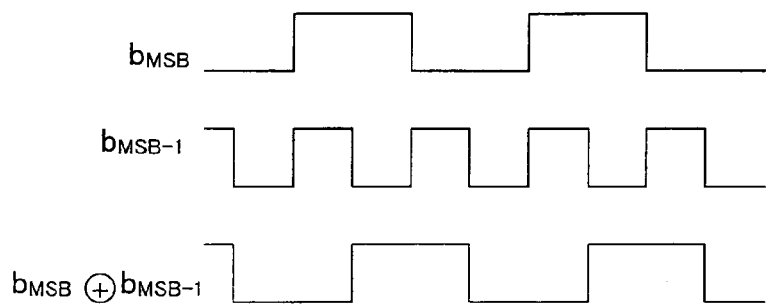
Figure 2C:
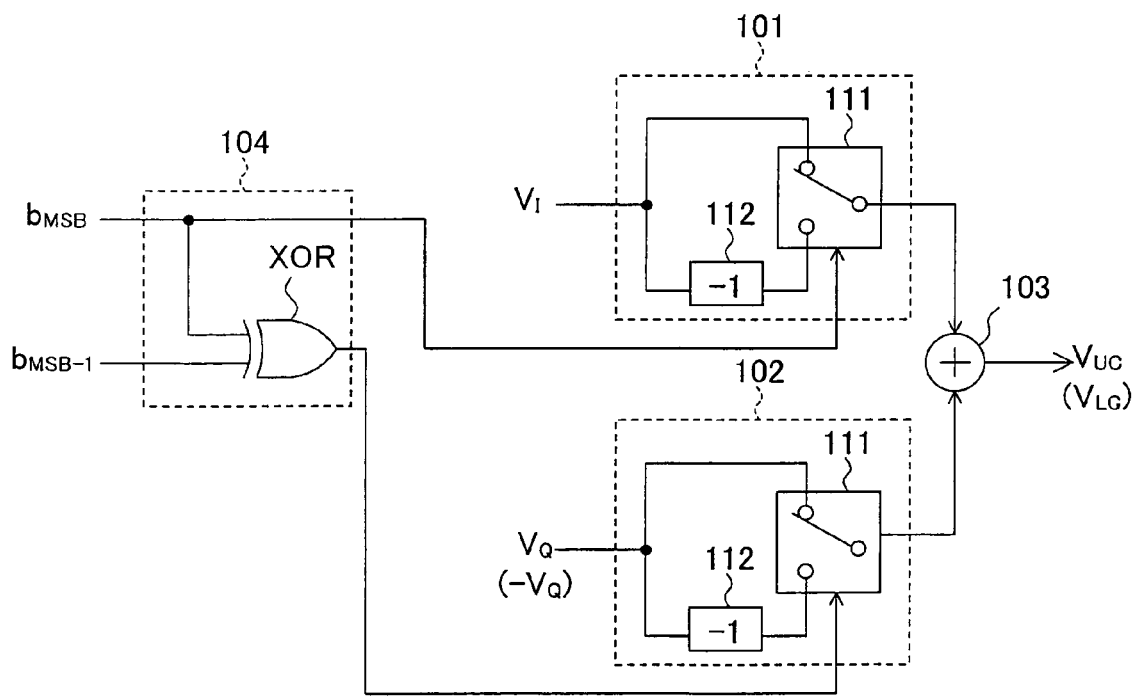

Further, the complex signal generation unit 107 may generate rectangular signal components $V_{UO-I}$ and $V_{UO-Q}$ having phases offset by ¼ cycle by using a simple circuit as shown in FIGS. 2A to 2C as well. FIGS. 2A to 2C are diagrams showing an example of the configuration of the complex signal generation unit 107. The complex signal generation unit 107 can be configured by using for example an exclusive logical OR circuit XOR and amplifiers 1 and A2 as shown in FIG. 2A. The exclusive logical OR circuit XOR computes the exclusive OR logic of the most significant bit $b_{MSB}$ of the count of the counter 302 and the lower significant bits $b_{MSB-a}$ thereof. The amplifier A1 outputs a rectangular signal having a positive polarity when the bit $b_{MSB}$ is "1" and having a negative polarity when the bit $b_{MSB}$ is "0" and having the same amplitudes when positive and negative as the signal component $V_{UO-Q}$. The amplifier A2 outputs a signal $V_{UO-I}$ having a positive polarity when the bit $b_{MSB}$ is "1" and having a negative polarity when the bit $b_{MSB}$ is "0" and having the same amplitudes when positive and negative. According to such a circuit, as seen also from the pattern of the logical values shown in FIG. 2B, rectangular signals having phases offset by ¼ cycle can be generated.

When using such a rectangular signal, harmonic components are included in the multiplication result, but as will be explained in detail later, in a case when the angle θ(t) relatively slowly changes or a case when the band of the phase lock unit is narrow etc., the harmonic components can be sufficiently attenuated by the feedback unit 200-1, therefore, the required sufficient precision can be obtained.

Note that, the circuit shown in FIG. 2A corresponds to the simplest binary pseudo-sine wave multiplication shown in FIG. 2C when viewed in correspondence with multiplication using a pseudo-sine wave explained in the later embodiment. In the example of FIG. 2C, each of the multiplication units 101 and 102 is provided with a switch circuit 111 and a polarity inversion circuit 112. The switch circuit 111 of the multiplication unit 101 outputs the angle detection signal $V_I$ as it is when the bit $b_{MSB-1}$ is "1" and outputs the angle detection signal $V_I$ after inverting the polarity at the polarity inversion circuit 112 when the bit $b_{MSB-1}$ is "0". The switch circuit 111 of the multiplication unit 102 outputs the angle detection signal $V_Q$ (or $-V_Q$) when the output of the exclusive logical OR circuit XOR is "1", while inverts the polarity of the angle detection signal $V_I$ (or $-V_Q$) at the polarity inversion circuit 112 and outputs the same when the output of the XOR is "0".

The multiplication unit 101 multiplies the signal component $V_{UO-Q}$ generated at the complex signal generation unit 107 and the angle detection signal $V_I$ of the real component of the complex signal $\_V_{CP}$. The multiplication unit 101 may be configured by using an analog multiplier, for example, a Gilbert type multiplier circuit, or may use a multiplication type D/A converter. Alternatively, as shown in FIG. 2C, it may be configured to switch the polarity by using a switch circuit and a polarity judgment circuit.

The multiplication unit 102 multiplies the signal component $V_{UO-I}$ generated in the complex signal generation unit 107 and the angle detection signal $V_Q$ of the imaginary component of the complex signal $\_V_{CP}$. The multiplication unit 102 may also be configured by an analog multiplier or multiplication type D/A converter in the same way as the multiplication unit 101 or may be configured by using a switch circuit and a polarity judgment circuit as shown in FIG. 2C.

The adder unit 103 outputs the sum of the multiplication results of the multiplication units 101 and 102 as the signal $V_{UC}$ explained above. The signal $V_{UC}$ output from the adder unit 103 becomes a signal corresponding to the imaginary component of the complex signal obtained when complexly multiplying the complex signals $\_V_{CP}$ and $\_V_{UO}$.

Note that when outputting the real component of the complex multiplication result, a configuration computing the difference of multiplication results of the multiplication units 101 and 102 and outputting the same may also be employed.

The complex signal processing unit 100-2 generates a signal $V_{LC}$ in accordance with the deflection angle of the complex signal obtained when multiplying the complex signal $\_V_{CN}$ input from the signal processing unit 400 and the complex signal $\_V_{LO}$ including the signal components $V_{LO-I}$ and $V_{LO-Q}$ having phase angles $(\omega_o t-\phi(t))$ in accordance with the data PA2 generated in the phase angle data generation unit 300-2 and orthogonal to each other and having a frequency set at a predetermined polarity (for example negative). As the signal $V_{LC}$ in accordance with this deflection angle, for example, it generates a signal in accordance with the real component or the imaginary component of the complex signal obtained when complexly multiplying the complex signals $\_V_{CN}$ and $\_V_{LO}$. The complex signal processing unit 100-2 may be configured by using, for example, multiplication units 101 and 102, an adder unit 103, and a complex signal generation unit 107 the same as that explained above. In this case, it generates a signal $V_{LC}$ corresponding to the imaginary component of the complex signal obtained when complexly multiplying the complex signals $\_V_{CN}$ and $\_V_{LO}$.

The feedback unit 200-1 generates a feedback control signal Vf1 for feedback control so that the deflection angle of the complex signal obtained as the multiplication result of the complex signals $\_V_{CP}$ and $\_V_{UO}$ is converged to a constant value in accordance with the signal $V_{UO}$ generated in the complex signal processing unit 100-1.

The feedback unit 200-1 is configured as for example a filter circuit amplifying the signal $V_{UC}$ generated at the complex signal processing unit 100-1 with a predetermined transmission characteristic.

FIG. 3A is a diagram showing an example of the configuration of the feedback unit 200-1, and FIG. 3B is a diagram showing an example of the transmission characteristic thereof. The feedback unit 200-1 shown in FIG. 3A has operation amplifier OP1, resistors R1 and R2, and capacitors C1 and C2. A serial circuit of a resistor R2 and a capacitor C2 and a capacitor C1 are connected in parallel between a negative side input terminal (−) and the output of the operation amplifier OP1, and a positive side input terminal (+) is connected to the ground. The input signal of the feedback unit 200-1 is input to the negative side input terminal (−) of the operation amplifier OP1 via the resistor R1. The output signal of the feedback unit 200-1 is output from the output terminal of the operation amplifier OP1. According to this configuration, as shown in the transmission characteristic of FIG. 3B, the lower the frequency, the larger the gain of the feedback unit 200-1. The gain becomes very large in accordance with the open loop gain of the operation amplifier OP1 in the case of a direct current.

In this way, when the DC gain of the feedback unit 200-1 becomes very large, the output signal $V_{UC}$ of the complex signal processing unit 100-1 must become zero in the normal state. In this case, in the state when the output signal $V_{UC}$ is zero, the phase of the complex signal $\_V_{UO}$ is locked to the complex signal $\_V_{CP}$. The feedback unit 200-2 generates a feedback control signal Vf2 for feedback control so that the deflection angle of the complex signal obtained as the multiplication result of the complex signals $\_V_{CP}$ and $\_V_{LO}$ is converged to a constant value in accordance with the signal $V_{LC}$ generated in the complex signal processing unit 100-2. The feedback unit 200-2 can also be configured by a filter circuit having a transmission characteristic where the DC gain becomes large in the same way as for example the complex signal processing unit 100-1.

Phase Difference Computation Unit 500

The phase difference computation unit 500 computes the phase difference between the complex signal $\_V_{UO}$ and the complex signal $\_V_{LO}$ based on the data PA1 and PA2 of the phase angles output from the phase lock units PLL1 and PLL2.

The complex signals $\_V_{CP}$ and $\_V_{CN}$ have a phase difference $(2\times\theta(t))$ in accordance with the angle $\theta(t)$ as will be explained later, therefore the complex signals $\_V_{UO}$ and $\_V_{LO}$ obtained by locking phases to them also have the phase difference $(2\times\theta(t))$ in accordance with the angle $\theta(t)$. For this reason, the information of the angle $\theta(t)$ can be acquired from the phase difference obtained as a result of computation of the phase difference computation unit 500.

Here, an explanation will be given of the operation of the angle detection signal processing apparatus according to the first embodiment having the above configuration.

First, an explanation will be given of the basic operation by the signal processing unit 400, the phase lock units PLL1 and PLL2, and the phase difference computation unit 500.

The signal processing unit 400 outputs the complex signals $\_V_{CP}$ and $\_V_{CN}$ having the frequency $\omega_o$ and, at the same time, having a phase difference in accordance with the angle $\theta(t)$ based on the angle detection signals $V_I$ and $V_Q$. The phase lock unit PLL1 generates the complex signal $\_V_{UO}$ obtained by locking the phase to the complex signal $\_V_{CP}$ and outputs the data PA1 in accordance with the phase angle of this complex signal $\_V_{UO}$ ($\omega_o t+\phi(t)=\omega_o t+\theta(t)$ at the time of locking). The phase lock unit PLL2 generates the complex signal $\_V_{LO}$ obtained by locking the phase to the complex signal $\_V_{CN}$ and outputs the data PA2 in accordance with the phase angle of this complex signal $\_V_{LO}$ ($\omega_o t-\phi(t)=\omega_o t-\theta(t)$ at the time of locking). The phase difference computation unit 500 computes the phase difference between the complex signals $\_V_{UO}$ and $\_V_{LO}$ $(2\times\theta(t))$ based on the data PA1 and PA2. For example, the difference between the data PA1 and PA2 of the counts of the counter 302 is computed.

In this way, in the phase lock units PLL1 and PLL2, the phases are locked to the signal having the frequency $\omega_o$, therefore, even if the angle $\theta(t)$ becomes a constant value of the frequency zero, the complex signals $\_V_{UO}$ and $\_V_{LO}$ are controlled so as to have the frequency $\omega_o$. Accordingly, it is not necessary to provide means oscillating at the frequency zero like for example the bipolar VCO in order to output the data PA1 and PA2 in accordance with the phase angles of the complex signals $\_V_{UO}$ and $\_V_{LO}$. Further, the phase difference between the complex signals $\_V_{CP}$ and $\_V_{CN}$ is not found by the time difference at the zero cross point, but is found based on the data PA1 and PA2 output time by time at the phase lock units PLL1 and PLL2, therefore it becomes possible to acquire the information of the angle $\theta(t)$ in real time. Further, the system becomes resistant to external noise in comparison with the method using the zero cross point.

Next, a detailed explanation will be given of the phase lock operation (complex phase lock operation) of the complex signals in the phase lock units PLL 1 and PLL2.

When explaining the complex phase lock operation, first, an explanation will be given of the relationship between the real signal and the complex signal.

The complex frequency $\omega s$ is defined as follows:

$$e^{j\omega_s t}=\cos\omega_s t+j\cdot\sin\omega_s t \quad (9)$$

A complex signal is defined on a complex plane, and therefore cannot be simply expressed as a real signal, but can be defined as a set of two signals by dividing it to a real component $\cos\omega st$ and an imaginary component $\sin\omega st$.

FIG. 4 is a diagram showing a complex signal expressed on a complex plane. As shown in FIG. 4, a complex signal can be considered as a vector on a complex plane rotating about the origin at an angular speed $\omega$. The real portion of the complex signal becomes the cosine component, and the imaginary portion becomes the sine component.

As compared with such a complex signal, a usual signal existing in the real world as a single signal is called a "real signal" in the present specification.

Below, it will be considered how real signals of the sine wave and the cosine wave are expressed as complex signals when viewing them as complex signals. The cosine wave and the sine wave of the real signals can be expressed by the following equations:

$$\cos \omega_s t = (e^{j\omega st} + e^{-j\omega st})/2 \quad (10)$$

$$\sin \omega_s t = (e^{j\omega st} - e^{-j\omega st})/2j \quad (11)$$

As clear from this equation, it is seen that a real signal is expressed as the sum of two complex signals having symmetric positive and negative frequencies.

Figure 5:
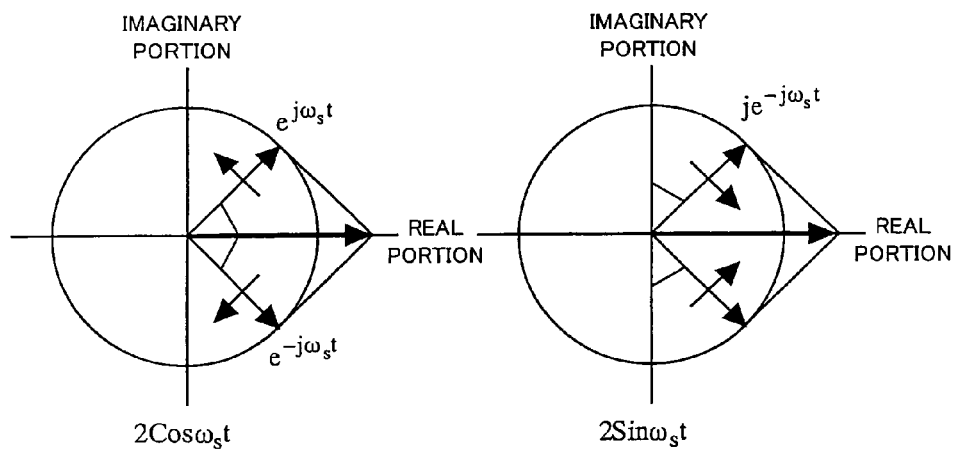
FIG. 5 is a diagram expressing a real signal as a vector on a complex plane.

On the complex plane of FIG. 4, the positive frequency is a vector turning in the counterclockwise direction, and the negative frequency is defined as a vector turning in the clockwise direction. When illustrating the relationships of equation (10) and equation (11) based on this definition, they become like those shown in FIG. 5. The real signal 2 Cos ωst is the sum of the complex signal $e^{j\omega st}$ having the positive frequency and the complex signal $e^{-j\omega st}$ having the negative frequency. When drawing this on the complex plane, as shown in the left diagram of FIG. 5, it can be expressed as the sum of two vectors rotating in reverse directions to each other. Two vectors overlap on the real axis at the time t=0 and always becomes linearly symmetric with respect to the real axis even when rotating along with the elapse of time. For this reason, when combining two vectors, the imaginary portion is always cancelled and becomes zero, and only the real portion remains.

In the same way, the real signal 2 Sin ωst is the sum of the complex signal $-je^{j\omega st}$ having the positive frequency and the complex signal $je^{-j\omega st}$ having the negative frequency. As shown in the right diagram of FIG. 5, it always becomes linearly symmetric with respect to the real axis, so the imaginary portion is still always cancelled and becomes zero, and only the real portion remains when combining two vectors.

Figure 6:
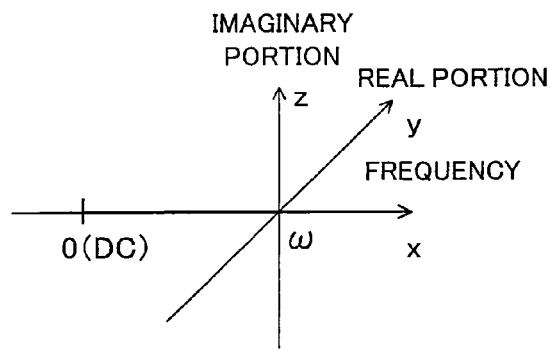
FIG. 6 is a diagram expressing the vector of a complex signal using a frequency axis.
Figure 7A:
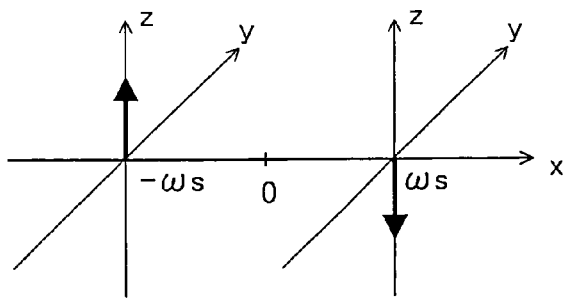
FIGS. 7A and 7B are diagrams illustrating a sine wave signal and a cosine wave signal at a time t=0 by vectors on complex planes.
Figure 7B:
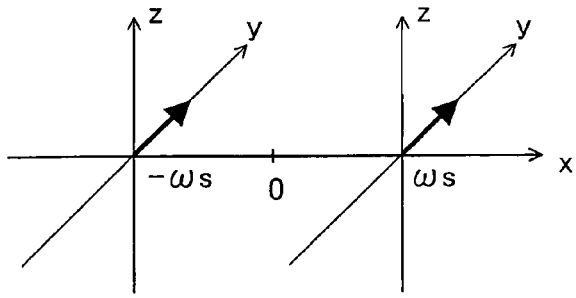

In order to express this as the stationary vector, use is made of a coordinate system shown in FIG. 6. In the coordinate system of FIG. 6, an x-axis expressing the angular frequency or the frequency of the complex signal is provided in a direction vertical to a complex plane formed by a z-axis expressing the imaginary portion and a y-axis expressing the real portion. FIGS. 7A and 7B are diagrams illustrating the sine wave signal and the cosine wave signal at the time t=0 as the vectors on the complex plane (z-y plane). Note that all of the phases when the time t=0 are deemed zero. FIG. 7A shows the vector of the cosine wave signal Cos ωst, and FIG. 7B shows the vector of the sine wave signal Sin ωst.

In this way, no matter what the real signal is, it includes two complex signals having positive and negative symmetric frequencies when viewed as a complex signal. These vectors rotate in reverse directions to each other along with the elapse of time. The imaginary portions are always cancelled by each other, so there is no imaginary portion in the real signal of the sum of the two.

This completes the explanation of the relationship between a real signal and a complex signal.

The phase lock units PLL1 and PLL2 handle the input signals as complex signals, generate complex signals in which the phases are locked to either of the positive frequency component or negative frequency component of this complex signal, and obtain the data PA1 and PA2 in accordance with the phase angle thereof.

The data PA1 generated in the phase angle data generation unit 300-1 is data repeated in a cycle in accordance with the feedback control signal Vf1 and indicates the phase angle in the cycle. For example, the count of the counter 302 repeats the change from "0" to "2"'" in the cycle in accordance with the feedback control signal Vf1. For this reason, both of the orthogonal signal components $V_{UO-I}$ and $V_{UO-Q}$ having phase angles in accordance with this data PA1 have frequencies in accordance with the feedback control signal Vf1. Namely, the complex signal $\_V_{UO}$ is a complex signal which has a frequency having a magnitude in accordance with the feedback control signal Vf1 and has a polarity set at the predetermined polarity.

The complex signal processing unit 100-1 generates the signal $V_{UC}$ in accordance with the deflection angle of the complex signal obtained when multiplying the complex signal $\_V_{CP}$ and the complex signal $\_V_{UO}$. It is set that the complex signal $\_V_{CP}$ has the positive frequency, and the complex signal $\_V_{UO}$ has the negative frequency as shown in the following equations:

$$V_{CP} = V_a \cdot e^{j(\omega_o t + \theta(t))} \quad (12)$$

$$V_{UO} = e^{-j(\omega_o t + \phi(t))} \quad (13)$$

When multiplying them, they become as shown in the following equation:

$$V_{CP} \cdot V_{UO} = V_a \cdot e^{j(\theta(t) - \phi(t))} \quad (14)$$

The deflection angle of the complex signal shown in equation (14) is "θ(t)−φ(t)". The feedback unit 200-1 generates the feedback control signal Vf1 so that this deflection angle approaches a constant value (for example zero). For example, it is set that the complex signal processing unit 100-1 outputs the imaginary component of the complex signal shown in equation (14):

Sin(θ(t)−φ(t))

as the signal $V_{UC}$. In this case, when the DC gain of the feedback unit 200-1 is made very large as shown in FIG. 3B, the feedback control constantly acts so that the following stands:

$$V_{UC} = \sin(\theta(t) - \phi(t)) = 0$$

For this reason, the phases of the complex signals $\_V_{CP}$ and $\_V_{UO}$ are locked so that the angles θ(t) and φ(t) become substantially equal.

Namely, the deflection angle of the complex signal obtained when multiplying the complex signals $V_{CP}$ and $\_V_{UO}$ becomes equal to the deflection angle (θ(t)−φ(t)) obtained by adding the deflection angle ($\omega_o$t+θ(t)) of the complex signal $\_V_{CP}$ and the deflection angle ($\omega_o$t+φ(t)) of the complex signal $\_V_{UO}$. The complex signal processing unit 100-1 generates the signal $V_{UC}$ in accordance with the deflection angle (θ(t)−φ(t)) obtained by adding them. Then, the feedback unit 200-1 generates the feedback control signal Vf1 for the feedback control so that the added deflection angle converges to a constant value (for example zero) in accordance with the signal $V_{UC}$ generated at the complex signal processing unit 100-1. As a result, the phase of the complex signal $\_V_{UO}$ is locked to the phase of the complex signal $\_V_{CP}$.

The deflection angle becoming constant corresponds to the deflection angle being constant in time and the frequency becoming zero. Accordingly, in order to make the added deflection angle converge to a constant value, the complex signals $\_V_{CP}$ and $\_V_{UO}$ must have frequencies having magnitudes equal to each other and have positive and negative inverse polarities.

For example, as shown in equation (13), when the complex signal $\_V_{UO}$ has a negative frequency, the frequency of the complex signal $\_V_{UO}$ is controlled so that this negative frequency cancels the positive frequency of the complex signal $\_V_{CP}$. When the complex signal $\_V_{UO}$ has a positive frequency, the frequency of the complex signal $\_V_{UO}$ is controlled so that this positive frequency cancels the negative frequency of the complex signal $\_V_{CP}$. Contrary to this, when the complex signals $\_V_{CP}$ and $\_V_{UO}$ have frequencies having the same polarity, the above described added deflection angle always has a frequency and cannot be converged to a constant value. For this reason, in this case, the feedback control does not act, and the phase of the complex signal $\_V_{UO}$ does not follow the complex signal $\_V_{CP}$.

It is set that both of the complex signals $\_V_{CP}$ and $\_V_{UO}$ have positive frequencies.

$$V_{CP} = V_a \cdot e^{j(\omega_o t + \theta(t))} \quad (15)$$

$$V_{UO} = e^{j(\omega_o t + \phi(t))} \quad (16)$$

When multiplying them, they become as in the following equation:

$$V_{CP} \cdot V_{UO} = V_a \cdot e^{j(2\omega_o t + \theta(t) + \phi(t))} \quad (17)$$

In this case, a frequency such as the angular frequency $2\omega_o$ remains in the deflection angle of the complex signal as the multiplication result. This cannot be converged to a constant value. For this reason, the phase of the complex signal $\_V_{UO}$ cannot be locked to the complex signal $\_V_{CP}$.

Accordingly, the phase lock units PLL1 and PLL2 generate complex signals $\_V_{UO}$ and $\_V_{LO}$ obtained by locking phases to only components having frequencies having specific polarities (for example positive polarities) included in the complex signals $\_V_{CP}$ and $\_V_{CN}$ as the input.

This completes the explanation of the complex phase lock operation in the phase lock units PLL1 and PLL2.

The phase lock units PLL1 and PLL2 generate complex signals $\_V_{UO}$ and $\_V_{LO}$ obtained by locking phases to frequency components having predetermined polarities (for example positive frequency components) of the complex signals $\_V_{CP}$ and $\_V_{CN}$ by this complex phase lock operation. Then, they output data PA1 and PA2 of the phase angles of the complex signals $\_V_{UO}$ and $\_V_{LO}$. The phase difference computation unit 500 computes the phase difference between the complex signals $\_V_{UO}$ and $\_V_{LO}$ based on the data PA1 and PA2 of the phase angles and acquires information concerning the phase difference between frequency components having the predetermined polarities in the complex signals $\_V_{CP}$ and $\_V_{CN}$ from this result of computation.

Therefore, next, an explanation will be given of the reason why the frequency components having predetermined polarities in these complex signals $\_V_{CP}$ and $\_V_{CN}$ have a phase difference in accordance with the angle $\theta(t)$.

The output signals $V_I$ and $V_Q$ of a 1-phase excitation 2-phase output type resolver having a simple structure are given by the following equations L:

$$V_I = \cos \omega_o t \cdot \cos \theta_{(t)} = 1/2\{\cos(\omega_o t + \theta_{(t)}) + \cos(\omega_o t - \theta_{(t)})\} \quad (18)$$

$$V_Q = \cos \omega_o t \cdot \sin \theta_{(t)} = 1/2\{\sin(\omega_o t + \theta_{(t)}) - \sin(\omega_o t - \theta_{(t)})\} \quad (19)$$

As previously explained, the formation of signals as shown in equations (5) and (6) from these signals is the task of a certain type of R-D (resolver-digital) conversion signal processing circuit.

Figure 8A:
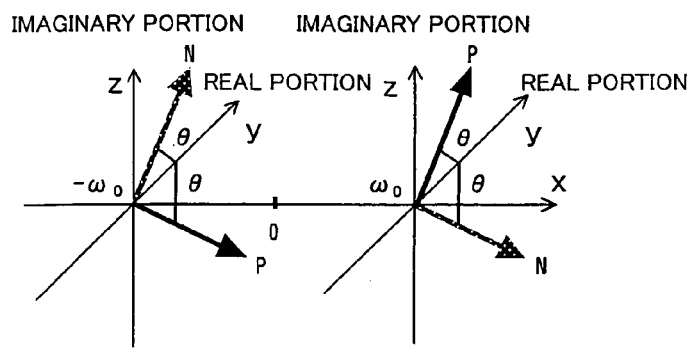
FIGS. 8A to 8C are diagrams expressing two output signals of a resolver as vectors of complex frequencies.
Figure 8B:
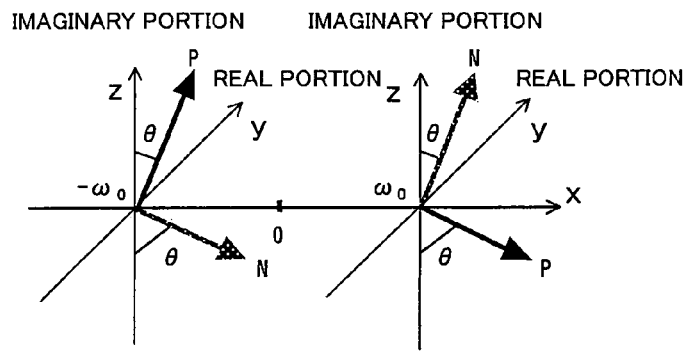
Figure 8C:
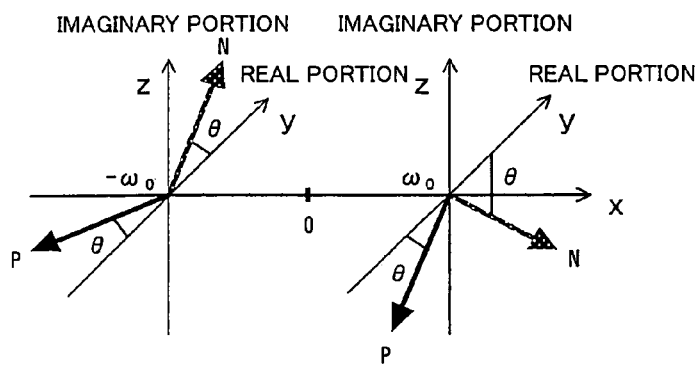

FIGS. 8A to 8C express the output signals $V_I$ and $V_Q$ of the resolver as vectors of complex frequencies. "P" and "N" in FIGS. 8A to 8C express the relationships between the polarity of the frequency $\omega_o$ and the polarity of the angle e. Namely, a vector in which the angle $\theta(t)$ turns in the counterclockwise direction at the positive frequency $\omega_o$ is defined as a positive signal vector ($\omega_o t + \theta(t)$), and a vector in which the angle $\theta(t)$ turns in the clockwise direction is defined as a negative signal vector ($\omega_o t - \theta(t)$). These are indicated by the notations "P" and "N". Further, a vector in which the angle $\theta(t)$ turns in the clockwise direction at a negative frequency $-\omega_o$ is defined as a positive signal vector ($-\omega_o t - \theta(t)$), and a vector in which the angle $\theta(t)$ turns in the counterclockwise direction is defined as a negative signal vector ($-\omega_o t + \theta(t)$). These are indicated by the notations "P" and "N". In other words, a vector in which the polarities of the frequency $\omega_o$ and the angle $\theta$ are equal is expressed as "P", and a vector in which the polarities of the frequency $\omega_o$ and the angle $\theta$ are different is expressed as the negative vector "N".

As shown in FIGS. 8A and 8B, the output signals $V_I$ and $V_Q$ per se of the resolver can not be separated as they are since the positive signal vector and the negative signal vector exist mixed at the same frequency.

Therefore, returning to 2-phase excitation 2-phase output, the vector of "Sin $\omega_o t \times$ Sin $\theta(t)$" can be expressed as in FIG. 8C. It was previously explained that this signal can be easily converted to "Cos($\omega_o t + \theta(t)$)" and "Cos($\omega_o t - \theta(t)$)" by computing the sum and difference of "Cos $\omega_o t \times$ Cos $\theta(t)$". Here, when comparing "Cos $\omega_o t \times$ Sin $\theta(t)$" of FIG. 8B and "Sin $\omega_o t \times$ Sin $\theta(t)$" of FIG. 8C taking note of the positive frequency, it is seen that this can be converted to "Sin $\omega_o t \times$ Sin $\theta(t)$" by rotating "Cos $\omega_o t \times$ Sin $\theta(t)$" in the clockwise direction by 90°, that is, -90°.

Figure 9:
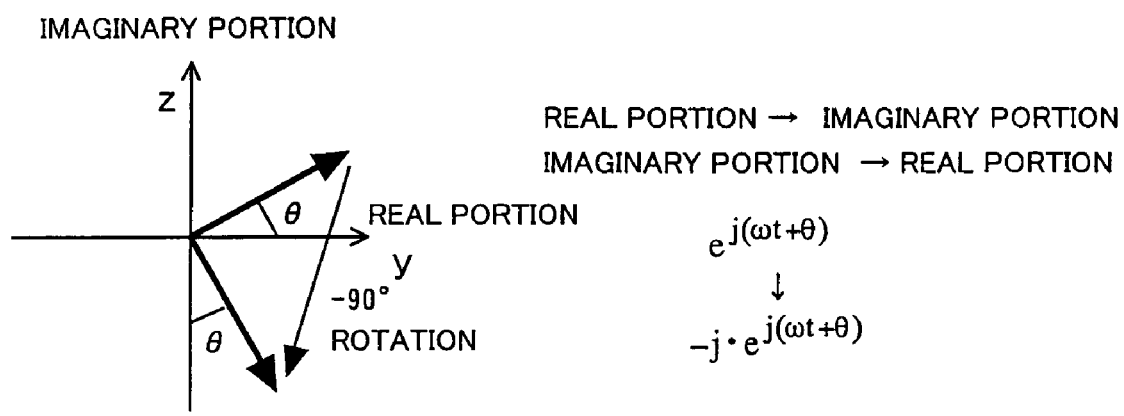
FIG. 9 is a diagram for explaining an operation for rotating a vector by −90°.

In order to rotate the vector by -90°, the operation as shown in FIG. 9 is carried out. Namely, the real portion should be made the negative imaginary portion, and the imaginary portion should be made the real portion.

From the above consideration, "Cos $\omega_o t \times$ Sin $\theta(t)$" is rotated by -90° by the operation of FIG. 9, and the signal obtained by this rotation and "Cos $\omega_o t \times$ Cos $\theta(t) \times$ are added and subtracted. FIG. 10 illustrates the situation of the above computation by vectors. Looking at the results of computation of the lowest stage of FIG. 10, components having the same frequency in two complex signals obtained by the addition and subtraction have a phase difference of $2 \times \theta'$.

However, in the complex signals of the result of computation shown in FIG. 10, there are vectors inversely rotating with positive and negative frequencies. Therefore, when only the signal component of the positive frequency is extracted by the above-explained phase lock operation, signals equivalent to those in equations (5) and (6) can be obtained.

Figure 11:
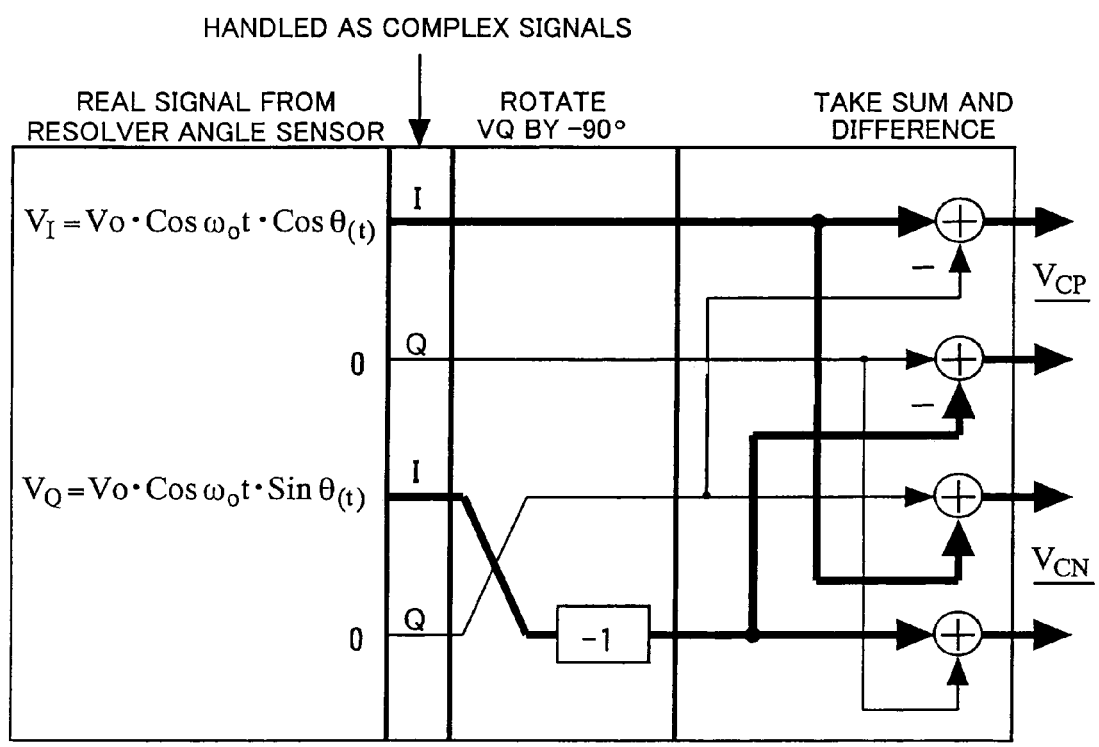
FIG. 11 is a diagram illustrating the complex signal processing shown in FIG. 10 by blocks.

FIG. 11 shows the signal processing explained as the diagram. Here, the output signals $V_I$ and $V_Q$ of the resolver are handled as complex signals. The signals $V_I$ and $V_Q$ per se are real signals, therefore the imaginary component is zero. Next, in order to rotate the signal $V_Q$ by -90°, the real portion and the imaginary portion are replaced by each other, and the imaginary portion is inverted. When adding/subtracting them as complex signals, the subtraction output signal $\_V_{CP}$ and the addition output signal $\_V_{CN}$ shown in FIG. 10 are obtained.

In FIG. 11, the route indicated by the bold line is followed by the output signal of the resolver. However, the route indicated by the thin line is the imaginary portion of the original signal. The signal does not actually exist. Accordingly, when eliminating the route, the signal processing of FIG. 11 can be simplified as in FIG. 12.

Figure 12:
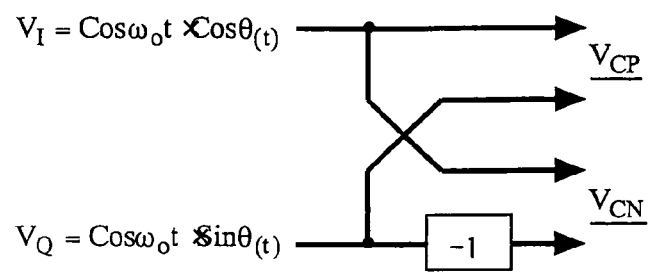
FIG. 12 is a diagram simplifying a flow of the signal in the block diagram shown in FIG. 11.

When expressing the signal processing of FIG. 12 by the equations, it becomes as follows.

$$\underline{V_{CP}} = V_I + j \cdot V_Q \tag{20}$$
$$= 1/4\{e^{j\omega t} + e^{-j\omega t}\}\{e^{j\theta(t)} + e^{-j\theta(t)}\} +$$
$$j(1/4)\{e^{j\omega t} + e^{-j\omega t}\}\{-j \cdot e^{j\theta(t)} + j \cdot e^{-j\theta(t)}\}$$
$$= (1/2)e^{j\theta(t)}\{e^{j\omega t} + e^{-j\omega t}\}$$
$$= 1/2\{e^{j(\omega t+\theta(t))} + e^{-j(\omega t+\theta(t))}\}$$

$$\underline{V_{CN}} = V_I - j \cdot V_Q \tag{21}$$
$$= 1/4\{e^{j\omega t} + e^{-j\omega t}\}\{e^{j\theta(t)} + e^{-j\theta(t)}\} -$$
$$j(1/4)\{e^{j\omega t} + e^{-j\omega t}\}\{-j \cdot e^{j\theta(t)} + j \cdot e^{-j\theta(t)}\}$$
$$= (1/2)e^{-j\theta(t)}\{e^{j\omega t} + e^{-j\omega t}\}$$
$$= 1/2\{e^{j(\omega t-\theta(t))} + e^{-j(\omega t+\theta(t))}\}$$

As seen also from equations (20) and (21), the phase difference between the frequency components having the same polarity becomes "2×θ(t)" in both the positive and negative case. The reason why the frequency components having the same polarity of the complex signals $\_V_{CP}$ and $\_V_{CN}$ have the phase difference "2×θ(t)" was explained above.

Next, an explanation will be given of how the output signals $V_{UC}$ and $V_{LC}$ of the complex signal processing units 100-1 and 100-2 become signals in accordance with the difference between the angle θ(t) and the angle φ(t) by using equations.

When the complex signals $\_V_{UO}$ and $\_V_{CP}$ and the complex signals $\_V_{LO}$ and $\_V_{CN}$ are complexly multiplied by assuming that both of the complex signals $\_V_{UO}$ and $\_V_{LO}$ have the negative frequencies $\omega_o$, they become as shown in the following equations:

$$\underline{V_{CP}} \cdot \underline{V_{UO}} = (V_I + j \cdot V_Q) \cdot j \cdot e^{-j(\omega_o t+\varphi(t))} \tag{22}$$
$$= j/2\{e^{j(\omega t+\theta(t))} + e^{-j(\omega t+\theta(t))}\} \cdot e^{-j(\omega_o t+\varphi(t))}$$
$$= j/2\{e^{j(\theta(t)-\varphi(t))} + e^{-j(2\omega_o t-\theta(t)+\varphi(t))}\}$$

$$\underline{V_{CN}} \cdot \underline{V_{LO}} = (V_I + j \cdot V_Q) \cdot j \cdot e^{-j(\omega_o t+\varphi(t))} \tag{23}$$
$$= j/2\{e^{j(\omega t-\theta(t))} + e^{-j(\omega t+\theta(t))}\} \cdot e^{-j(\omega_o t-\varphi(t))}$$
$$= j/2\{e^{j(-\theta(t)+\varphi(t))} + e^{-j(2\omega_o t+\theta(t)-\varphi(t))}\}$$

On the other hand, the multiplication of the complex numbers is expressed as follows.

$$\underline{C} = C_I + j \cdot C_Q \tag{24}$$
$$= \underline{A} \cdot \underline{B}$$
$$= (A_I + j \cdot A_Q)(B_I + j \cdot B_Q)$$
$$= A_I \cdot B_I - A_Q \cdot B_Q + j \cdot (A_I \cdot B_Q + A_Q \cdot B_I)$$

Figure 13A:
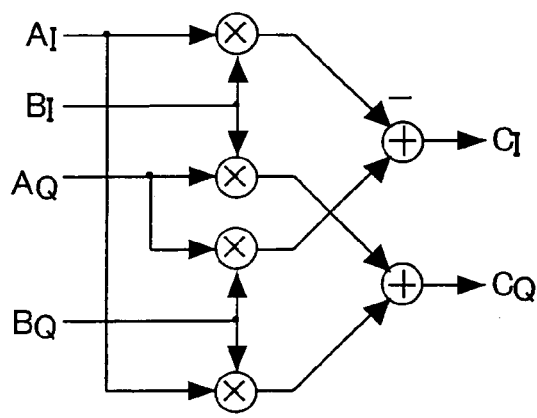
FIGS. 13A and 13B are diagrams for explaining multiplication of complex signals.
Figure 13B:
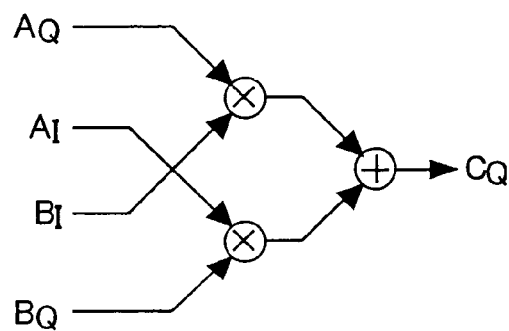

When expressing the computation of equation (24) by a diagram, it becomes as shown in FIG. 13A. Among these complex multiplication results, the signals which are actually necessary are the real signals input to the phase angle data generation units 300-1 and 300-2. For this reason, the complex signal processing units 100-1 and 100-2 may be provided with the configuration of FIG. 13B extracting only the computation portion of the imaginary portion in FIG. 13A. Namely, from FIG. 13B, two multiplication units (101, 102) and one adder unit (103) may be provided.

The real component $V_{UO\text{-}I}$ and the imaginary component $V_{UO\text{-}Q}$ of the complex signal $\_V_{UO}$ and the real component $V_{LO\text{-}I}$ and the imaginary component $V_{LO\text{-}Q}$ of the complex signal $\_V_{LO}$ are expressed as in the following equations.

$$V_{UO\text{-}I} = \text{Cos}(\omega_o t + \phi(t)) \tag{25}$$

$$V_{UO\text{-}Q} = -\text{Sin}(\omega_o t + \phi(t)) \tag{26}$$

$$V_{LO\text{-}I} = \text{Cos}(\omega_o t - \phi(t)) \tag{27}$$

$$V_{LO\text{-}Q} = -\text{Sin}(\omega_o t - \phi(t)) \tag{28}$$

When the computation is carried out by applying the signals expressed by these equations to the circuit shown in FIG. 1 together with the angle detection signals $V_I$ and $V_Q$ expressed by equations (3) and (4), the output signals $V_{UC}$ and $V_{LC}$ of the complex signal processing units 100-1 and 100-2 are expressed as in the following equations.

$$V_{UC} = V_I \cdot V_{UO-Q} + V_Q \cdot V_{UO-I} \tag{29}$$
$$= -\text{Cos}\omega_o t \cdot \text{Cos}\theta_{(t)} \cdot \text{Sin}(\omega_o t + \varphi(t)) +$$
$$\text{Cos}\omega_o t \cdot \text{Sin}\theta_{(t)} \cdot \text{Cos}(\omega_o t + \varphi(t))$$
$$= (1/2)\{\text{Sin}(\theta_{(t)} - \varphi_{(t)}) - \text{Sin}(2\omega_o t - \theta_{(t)} + \varphi(t))\}$$

$$V_{LC} = V_I \cdot V_{LO-Q} + V_Q \cdot V_{LO-I} \tag{30}$$
$$= -\text{Cos}\omega_o t \cdot \text{Cos}\theta_{(t)} \cdot \text{Sin}(\omega_o t + \varphi(t)) -$$
$$\text{Cos}\omega_o t \cdot \text{Sin}\theta_{(t)} \cdot \text{Cos}(\omega_o t - \varphi(t))$$
$$= (1/2)\{\text{Sin}(-\theta_{(t)} + \varphi_{(t)}) - \text{Sin}(2\omega_o t + \theta_{(t)} - \varphi(t))\}$$

The equations (29) and (30) reliably express the imaginary portions of equations (22) and (23). It is seen that signals reflecting the angles θ(t) and φ(t) are obtained. The second terms of equations (29) and (30) are high frequency components of the frequency $2\omega_o$ and attenuate by the filter function of the feedback unit 200-1. For this reason, both components of first term:

$$\text{Sin}(\theta(t) - \phi(t))$$

become the feedback control signals Vf1 and Vf2, and the feedback control acts so that "θ(t)=φ(t)" stands.

As explained above, according to the angle detection signal processing apparatus according to the present embodiment, the phase lock units PLL1 and PLL2 lock the phase so as to follow not the angle θ(t) for detection, but the phase angle $\omega_o t \pm \theta(t)$ having the offset of the frequency $\omega_o t$. For this reason, if the excitation frequency $\omega_o t$ is set sufficiently high with respect to the frequency of the angle θ(t), in the phase lock units PLL1 and PLL2, the phase angle $\omega_o t \pm \theta(t)$ at which the phase lock operation is carried out does not become zero. The rotation of the machine is extremely low when seen at this frequency. For example, 500 Hz really becomes a rotation speed up to 30,000 rpm. Accordingly, when converting the frequency $\omega_o$ to frequency and setting it at for example several kHz or more, usually such a problem is not caused.

Conventionally, in a one-phase excitation two-phase output type resolver having a simple structure, the angle θ(t) was found by configuring a phase locked loop that follows not the phase angle $\omega_o t \pm \theta(t)$, but the angle θ(t) for detection. In that case, the angle θ(t) changes in the positive and negative directions or stops and becomes the DC value. For this reason, the VCO mounted on the phase locked loop had to be a bipolar type able to express the positive and negative values including the DC value. Further, also the counter must have the function of an up/down counter.

Accordingly, according to the present embodiment, a configuration in which the structure is complex, the circuit scale is large, and the power consumption is large, for example, a bipolar VCO or up/down type counter can be eliminated.

Further, in the present embodiment, the phase lock units PLL1 and PLL2 perform the phase lock operation so as to follow the phase angle $\omega_o t \pm \theta(t)$ having the offset of the frequency $\omega_o t$ with respect to the angle $\theta(t)$ for detection. For this reason, even if the resolver is stationary, the phase lock units PLL1 and PLL2 will continuously turn with the frequency $\omega_o t$, therefore a high resolution can be obtained for the phase angle even if there is no resolution for the amplitude.

Conventionally, the phase output $\phi(t)$ from the VCO follows the angle $\theta(t)$, therefore the cosine signal Cos $\phi(t)$ and the sine signal Sing $\phi(t)$ input to the multipliers are required to have high resolution. For example, in order to obtain the angle resolution of 12 bits, an at least 11 bit resolution is required for the cosine signal Cos $\phi(t)$ and the sine signal Sin $\phi(t)$. This is intuitively clear also from the fact that following a phase with a high angle resolution is impossible unless the DC signal has a high resolution when the resolver stops and the cosine signal Cos $\phi(t)$ and the sine signal Sing $\phi(t)$ become the constant value (DC). In this way, conventionally, it was necessary to output the correct cosine signal Cos $\phi(t)$ and sine signal Sin $\phi(t)$, therefore a ROM having a large capacity for storing the waveform data, a D/A converter having a high resolution, a multiplication type D/A converter having little offset, etc. were regarded as necessary.

According to the present embodiment, a configuration in which the structure is complex, the circuit is large, and the power consumption is large such as a ROM having a large capacity, a D/A converter, and a multiplication type D/A converter having a high resolution can be eliminated.

In this way, according to the present embodiment, a complex digital function such as a waveform data ROM and up/down counter and a special function circuit such as a multiplication type D/A converter and bipolar VCO are not needed, and an angle detection signal processing apparatus having a high performance can be achieved with a simple system. By this, it becomes possible to configure the angle detection signal processing apparatus of the resolver extremely simply with small hardware, and a great reduction of the power consumption and reduction of costs can be achieved. Further, by the simplification of the hardware, the reliability can be improved.

Further, in the present embodiment, the necessity for the signal locking the phase to the input signal being strictly a sine wave in the phase lock unit is eliminated. In an extreme case, it may be a rectangular wave as well as shown in FIG. 2. In the case of a rectangular wave, the third order harmonic is included, therefore this is not suitable for high speed detection or detection of an angle having a high rate of change over time, but there is the advantage that the circuit configuration can be greatly simplified.

In addition, it also possible if the signal locking the phase to the input signal in the phase lock unit be for example a step wave or a rectangular wave in the extreme case. Therefore, as will be explained too in the later embodiments, it also becomes possible to use an analog multiplier circuit of a type not multiplying analog signals, but switching the polarity and the weight coefficient by a switch. By this, it becomes possible to strikingly ease the restriction of the precision due to the analog multiplier circuit explained above.

Further, conventionally, it was necessary to use a two-phase excitation two-phase output type resolver having a complex structure or perform complex signal processing in the one excitation two-phase output type resolver in order to obtain the signal of the phase angle $\omega_o t \pm \theta(t)$, but according to the present embodiment, by using the phase lock operation of a complex signal of locking the phase to only a frequency component having a specific polarity, the information of the phase angle $\omega_o t \pm \theta(t)$ can be acquired from the output signal of the 1 excitation 2-phase output type resolver by a very simple hardware configuration.

In addition, according to the method of the present embodiment, the information of the angle $\theta(t)$ can be obtained based on the data PA1 and PA2 of the phase angle $\omega_o t \pm \theta(t)$ which is updated with each instant, therefore angle detection in real time becomes possible and, at the same time, durability against the external noise can be greatly improved when compared with the method of finding the phase difference from the time difference of the zero cross point.

Second Embodiment

Figure 14:
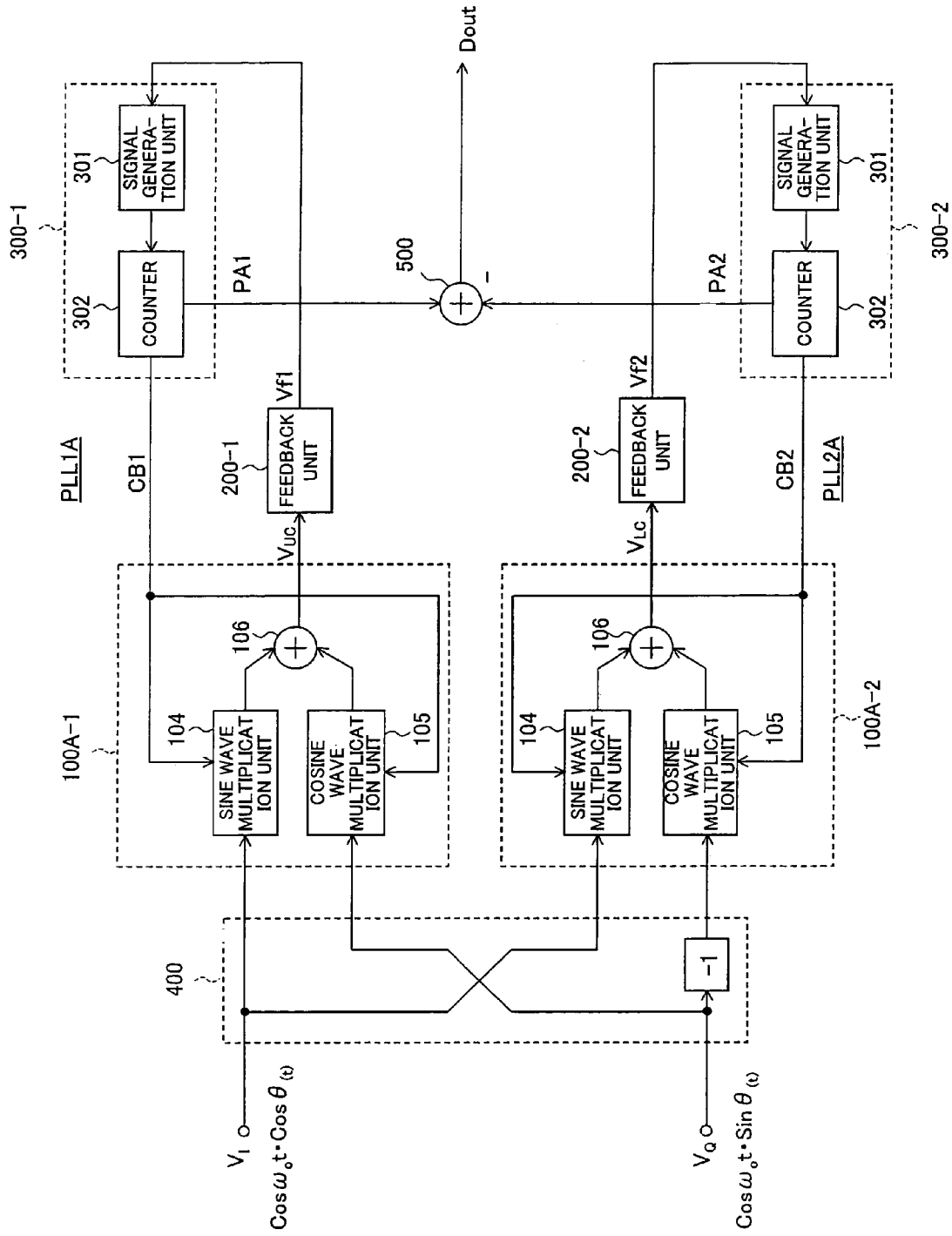
FIG. 14 is a diagram showing an example of the configuration of the angle detection signal processing apparatus according to a second embodiment of the present invention.

Next, an explanation will be given of a second embodiment of the present invention. FIG. 14 is a diagram showing an example of the configuration of an angle detection signal processing apparatus according to the second embodiment of the present invention.

Figure 15:
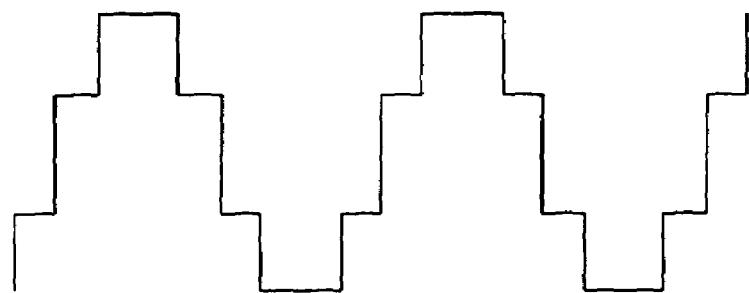
FIG. 15 is a diagram for explaining multiplication of step waves.

As an important characteristic feature of the present invention explained in the previous embodiment, it can be explained that the signal-having the phase locked to the input signal in the phase lock unit, that is, the amplitude information of the signal multiplied with the input signal, does not strictly have to be a sine wave. For example, an example where the complex signal generation unit 107 shown in FIG. 2 receives as input the rectangular wave is shown. Further, when the harmonics are to be reduced more, for example, also a step wave as shown in FIG. 15 may be used. The 4-value step wave shown in FIG. 16 is set so that the amplitude stepwise changes in a cycle of ⅛ of the signal cycle and becomes equivalent to that obtained by sampling the signal values of the sine wave at the time of change and holding the same by primary holding.

Figure 16:
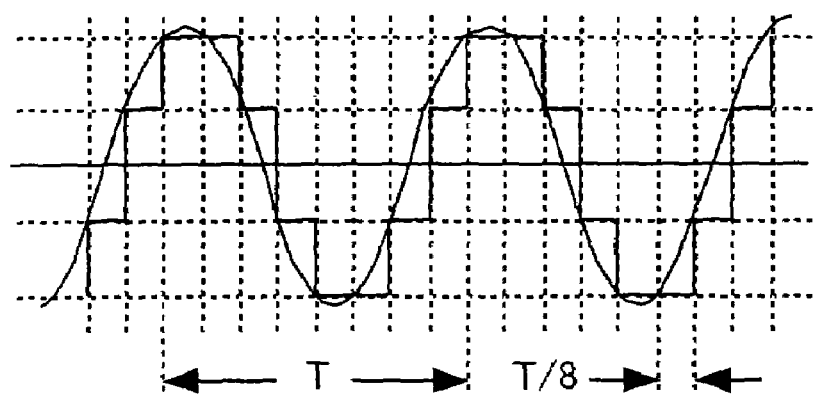
FIG. 16 is a diagram for explaining a relationship between a step wave and a sine wave on which it is based.
Figure 17:
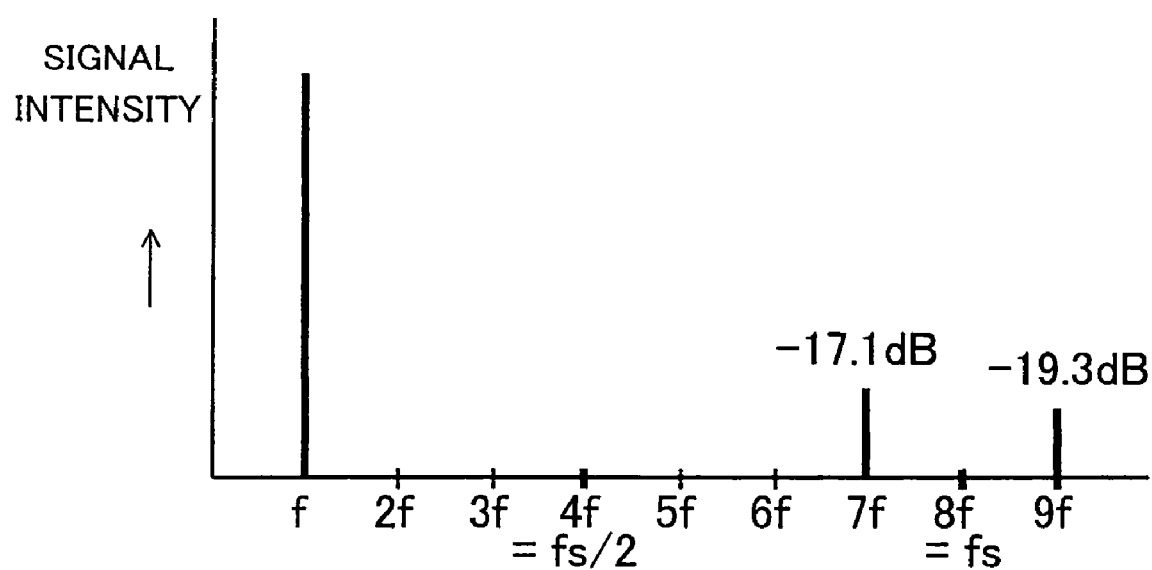
FIG. 17 is a diagram showing an example of a frequency spectrum of the four values of step waves shown in FIG. 16.

FIG. 17 shows the frequency spectrum of the step wave shown in FIG. 16. This signal is equal to that obtained by sampling a sine wave in 8 times the cycle, therefore, 8 times the sine wave frequency f becomes the sampled frequency, and 4 times becomes the Nyquist frequency. Accordingly, the spectrum stands also at frequencies 7f and 9f around the frequency 8f. There is nothing between the basic frequency f and the frequency 7f generated by the sampling. By the same effect as that by the primary holding, the 7th order harmonic (7f) and the 9th order harmonic (9f) attenuate by 17.1 dB and 19.3 dB with respect to the basic wave. In this example, the step wave has 4 values. Further, for example, when it has 8 values, the lowest harmonic becomes 15th order. In that case, it is equivalent to 16 times the sampling. As will be explained later, typically, sufficient precision can be obtained even by a 4-value step wave in many cases. A signal having such a stepwise waveform will be called a "pseudo-sine wave" in the following description.

The angle detection signal processing apparatus according to the present embodiment uses the pseudo-sine wave as explained above for multiplication in the phase lock unit.

In the angle detection signal processing apparatus shown in FIG. 14, the complex signal processing units 100-1 and 100-2 in the angle detection signal processing apparatus shown in FIG. 1 are replaced by the complex signal processing units 100A-1 and 100A-2 explained next. The rest of the configuration is the same. Further, the complex signal processing units 100A-1 and 100A-2 have the same configuration, therefore only the complex signal processing unit 100A-1 will be explained in the following description.

The complex signal processing unit 100A-1 has a sine wave multiplication unit 104, cosine wave multiplication unit 105, and adder unit 106. The basic waves of the coefficient multiplied at the sine wave multiplication unit 104 and the cosine wave multiplication unit 105 are orthogonal to each other. For example, the basic wave of the coefficient multiplied at the sine wave multiplication unit 104 corresponds to the sine wave of the counter data PA1, and the basic wave of the coefficient multiplied at the cosine wave multiplication unit 105 corresponds to the cosine wave of the counter data PA1.

Note that, the sine wave multiplication unit 104 is an embodiment of the fourth computation unit of the present invention. The cosine wave multiplication unit 105 is an embodiment of the fifth computation unit of the present invention. The adder unit 106 is an embodiment of the sixth computation unit of the present invention.

The adder unit 106 adds a multiplication result S104 of the sine wave multiplication unit 104 and a multiplication result S105 of the cosine wave multiplication unit 105 explained later to generate a signal $V_{UC}$.

The sine wave multiplication unit 104 selects the weight coefficient in accordance with the instantaneous value of the signal component $V_{UO\text{-}Q}$ at the predetermined phase angle within the angular range of the destination of movement from among a previously set plurality of weight coefficients when the phase angle indicated by the data PA1 of the phase angle data generation unit shifts to another angular range among a plurality of angular ranges forming part of one cycle and multiplies that with the real component (angle detection signal $V_I$) of the complex signal $V_{CP}$. When a pseudo-sine wave is multiplied, for example, based on the data PA1 generated at the phase angle data generation unit 300-1, the weight coefficient in accordance with the instantaneous value for each 1/k (k indicates a whole multiple of a positive 4; the same true also for the following description) cycle of the signal component $V_{UO\text{-}Q}$ is switched for each 1/k cycle and multiplied with the real component ($V_I$) of the complex signal $V_{CP}$. Further, when a rectangular wave is multiplied, for example, based on the data PA1 generated at the phase angle data generation unit 300-1, the weight coefficient in accordance with the peak value for each half-cycle of the signal component $V_{UO\text{-}Q}$ is switched for each half-cycle and multiplied with the real component ($V_I$) of the complex signal $V_{CP}$.

The cosine wave multiplication unit 105 selects the weight coefficient in accordance with the instantaneous value of the signal component $V_{UO\text{-}I}$ at the predetermined phase angle within the angular range of the destination of movement from among a previously set plurality of weight coefficients when the phase angle indicated by the data PA1 of the phase angle data generation unit shifts to another angular range among a plurality of angular ranges forming part of one cycle and multiplies that with the imaginary component (angle detection signal $V_Q$) of the complex signal $V_{CP}$. When the pseudo-sine wave is multiplied, for example, based on the data PA1 generated at the phase angle data generation unit 300-1, the weight coefficient in accordance with the instantaneous value for each 1/k cycle of the signal component $V_{UO\text{-}I}$ is switched for each 1/k cycle and multiplied with the imaginary component ($V_Q$) of the complex signal $V_{CP}$. Further, where a rectangular wave is multiplied, for example, based on the data PA1 generated at the phase angle data generation unit 300-1, the weight coefficient in accordance with the peak value for each half-cycle of the signal component $V_{UO\text{-}I}$ is switched for each half-cycle and multiplied with the imaginary component ($V_Q$) of the complex signal $V_{CP}$.

Figure 18:
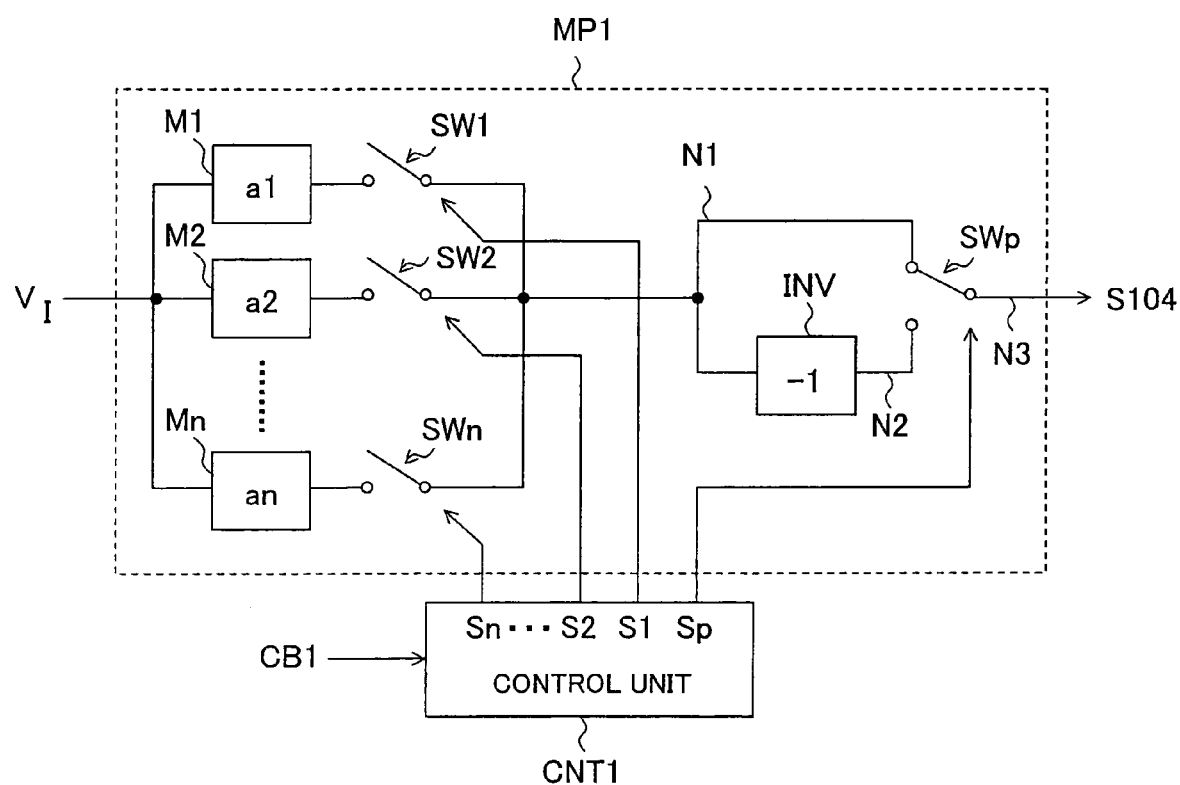
FIG. 18 is a diagram showing an example of the configuration of a sine wave multiplication unit.

FIG. 18 is a diagram showing an example of the configuration of the sine wave multiplication unit 104. The sine wave multiplication unit 104 shown in FIG. 18 has a multiplication unit MP1 and a control unit CNT1. The multiplication unit MP1 has n number of coefficient multiplier circuits M1 to Mn, n number of coefficient selection switches SW1 to SWn, a polarity selection switch SWp, and a polarity inversion circuit INV.

The coefficient multiplier circuits M1, . . . , Mn multiply the weight coefficients a1, . . . , an with the real component $V_I$ of the complex signal $V_{CP}$.

The coefficient selection switches SW1, . . . , SWn have ends connected to the outputs of the coefficient multiplier circuits M1, . . . , Mn and have the other ends connected to a node N1.

The polarity inversion circuit INV inverts the multiplication results of the coefficient multiplier circuits M1, . . . , Mn output to the node N1.

The polarity selection switch SWp selects one of the node N1 connected to the coefficient selection switches SW1, . . . , SWn or the node N2 connected to the output of the polarity inversion circuit INV and connects this to an output node N3. The multiplication result S104 of the sine wave multiplication unit 104 is output from the output node N3.

The control unit CNT1 controls the coefficient selection switches SW1 to SWn and SWp so that the weight coefficient in accordance with the instantaneous value of the signal component $V_{UO\text{-}Q}$ at the predetermined phase angle within the angular range of the destination of movement is selected from among a previously set plurality of weight coefficients when the phase angle indicated by the data PA1 of the phase angle data generation unit shifts to another angular range among a plurality of angular ranges forming part of one cycle.

For example, the coefficient selection switches SW1 to SWn and SWp are controlled so that the weight coefficient in accordance with the instantaneous value for each 1/k cycle of the signal component $V_{UO\text{-}Q}$ is switched for each 1/k cycle by using the data CB1 having a predetermined number of bits from the most significant bit among the data PA1 generated in the phase angle data generation unit 300-1.

FIG. 18 is an example of the configuration of the sine wave multiplication unit 104, but it is possible to give the same configuration as this to the cosine wave multiplication unit 105.

Note that the switching of the weight coefficients by the sine wave multiplication unit 104 and the cosine wave multiplication unit 105 explained above is desirably carried out for each 1/k cycle with respect to 1 cycle of the signal components $V_{UO\text{-}I}$ and $V_{UO\text{-}Q}$ to be multiplied. By this, it becomes possible to use the multiplier circuits having the same weight coefficient in the sine wave multiplication unit 104 and the cosine wave multiplication unit 105 while keeping the phase difference between the signal component $V_{UO-I}$ and the signal component $V_{UO-Q}$ at ¼ cycle.

FIG. 19 is a diagram showing an example of the method of control of the coefficient selection switches SW1 and SW2 and the polarity selection switch SWp in the case where the multiplication unit MP1 is configured by using two coefficient multiplier circuits M1 and M2. In this case, the weight coefficient has 4 values of +a1, −a1, +a2, and −a2. Further, a waveform m0($t$) indicating the transition in time sequence of the weight coefficient becomes a waveform obtained by sampling the signal components ($V_{UO}$, $V_{LO}$) in the sine wave state as illustrated in FIG. 20. The weight coefficient of the multiplier circuit is selected so as to become equal to the sampling value of the signal components ($V_{UO}$, $V_{LO}$) at a point of time when the weight coefficient is switched as shown in for example FIG. 20.

Figure 21:
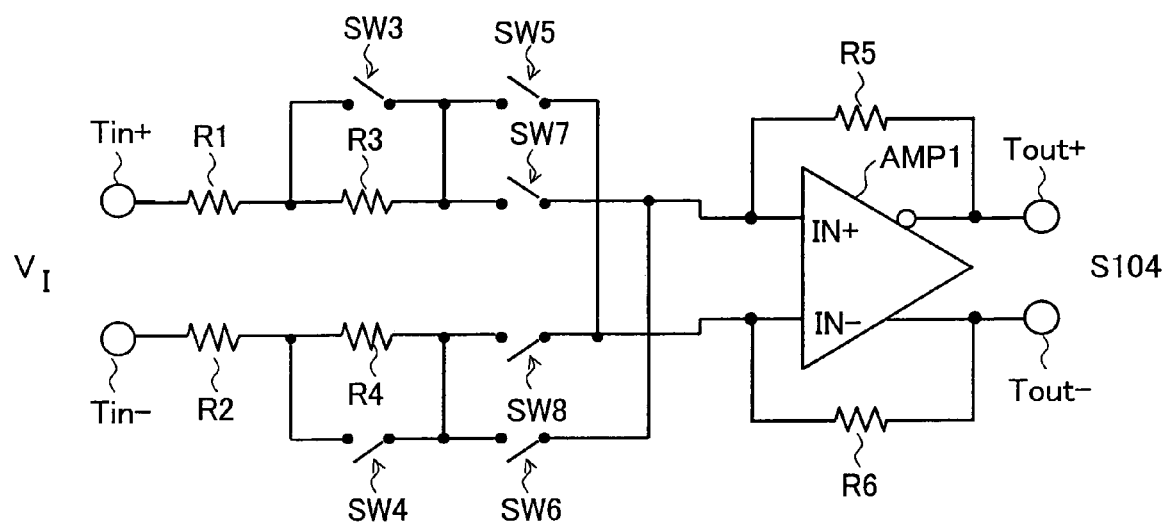
FIG. 21 is a diagram showing an example of the configuration of the multiplication unit in a case where there are two weight coefficients.

When the number of the weight coefficients is two, it is possible to give a very simple configuration as shown in FIG. 21 to the multiplication unit.

FIG. 21 is a diagram showing an example of the configuration of a multiplication unit MP1A when the number of weight coefficients is two. The multiplication unit MP1A shown in FIG. 21 has resistors R1, . . . , R6, coefficient selection switches SW3 and SW4, polarity selection switches SW5, . . . , SW8, and an operation amplifier AMP1.

Between input terminals Tin+ and Tin−, the real component $V_I$ of the complex signal $\_V_{CP}$ is input as the differential signal.

The input terminal Tin+ is connected to first terminals of the polarity selection switches SW5 and SW7 via the serial circuit of the resistors R1 and R3. The other terminal of the polarity selection switch SW5 is connected to a negative side input terminal IN− of the operation amplifier AMP1, and the other terminal of the polarity selection switch SW7 is connected to a positive side input terminal IN+ of the operation amplifier AMP1.

The input terminal Tin− is connected to first terminals of the polarity selection switches SW6 and SW8 via the serial circuit of the resistors R2 and R4. The other terminal of the polarity selection switch SW6 is connected to the positive side input terminal IN+ of the operation amplifier AMP1, and the other terminal of the polarity selection switch SW8 is connected to the negative side input terminal IN− of the operation amplifier AMP1.

The coefficient selection switch SW3 is connected in parallel to the resistor R3, and the coefficient selection switch SW4 is connected in parallel to the resistor R4.

The positive side output terminal of the operation amplifier AMP1 is connected to the output terminal Tout+ and, at the same time, connected to the positive side input terminal IN+ via the resistor R5. The negative side output terminal of the operation amplifier AMP1 is connected to the output terminal Tout− and, at the same time, connected to the negative side input terminal IN− via the resistor R6.

Resistance values of the resistors R1 to R6 are set for example as follows.

Resistors R1, R2 . . . 42.29 kΩ;
Resistors R3, R4 . . . 62.15 kΩ; and
Resistors R5, R6 . . . 40 kΩ.

According to the multiplication unit MP1A shown in FIG. 21, when the coefficient selection switches SW3 and SW4 are turned on, the coefficient value a1 becomes equal to R5/R1. Further, when the coefficient selection switches SW3 and SW4 are turned off, the coefficient value a2 becomes equal to R5/(R1+R3).

Further, when the polarity selection switches SW7 and SW8 are turned off, and the polarity selection switches SW5 and SW6 are turned on, the polarity of the weight coefficient of the multiplication unit MP1A is set up positive. Namely, the output signal S104 gets the same polarity as that of the real component $V_I$.

Figure 22:
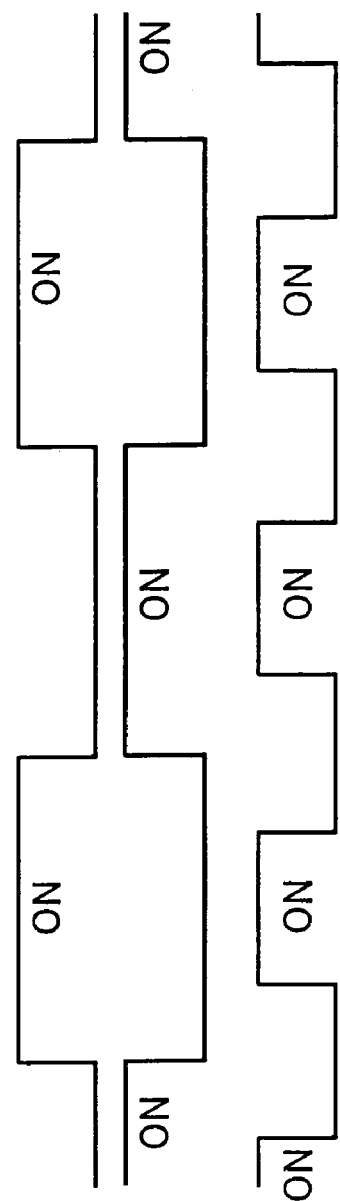
FIGS. 22A to 22D are diagrams showing an example of the control of each switch of the multiplication unit shown in FIG. 21.

Conversely, when the polarity selection switches SW7 and SW8 are turned on and the polarity selection switches SW5 and SW6 are turned off, the polarity of the weight coefficient of the multiplication unit MP1A is set negative. Namely, the output signal S104 becomes an inverse polarity to that of the real component $V_I$. From the above operation, the control of the switches S3 to S8 is carried out as shown in for example FIG. 22.

Figure 23:
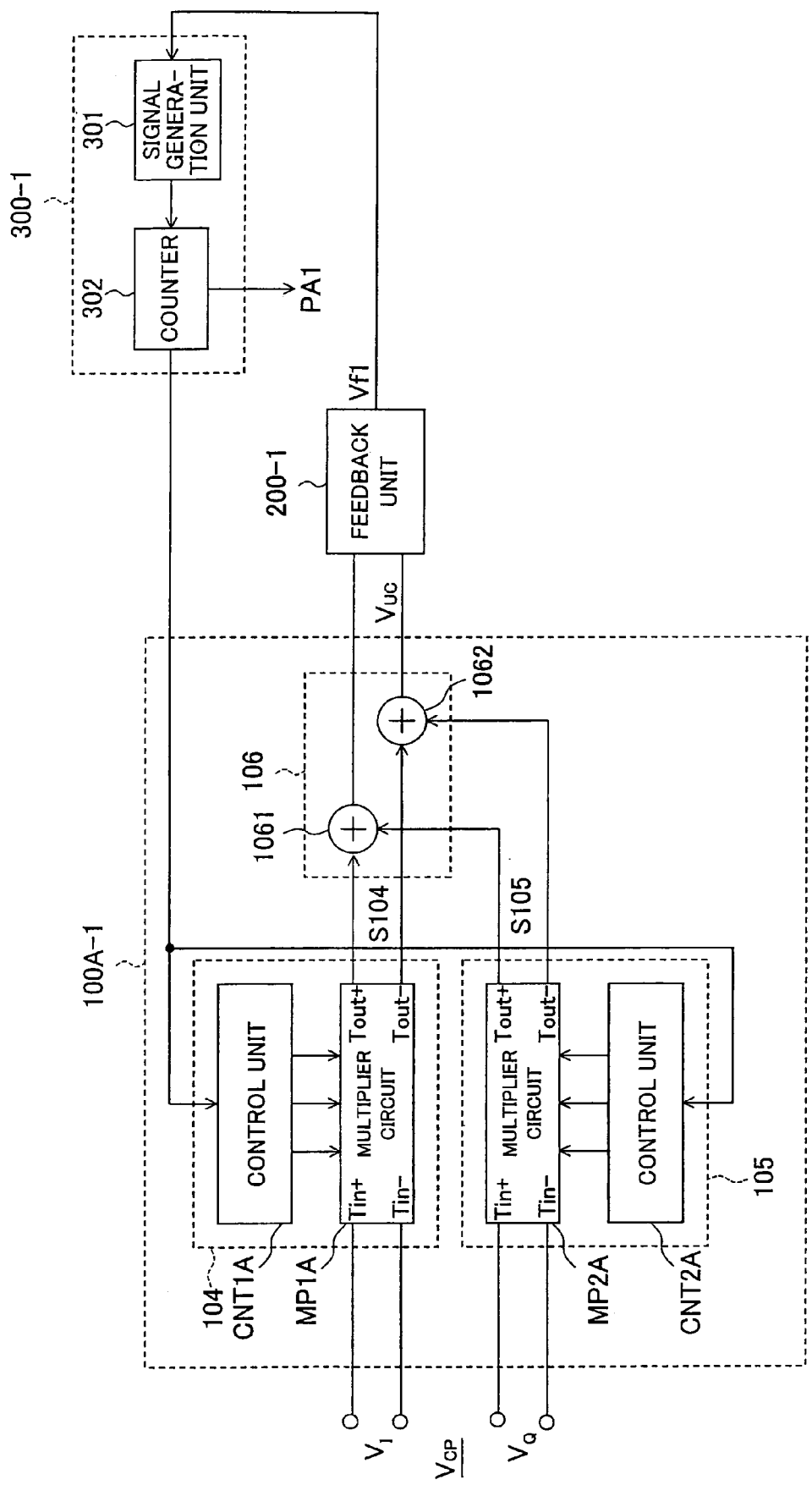
FIG. 23 is a diagram showing an example of the configuration of a phase lock unit where the multiplication unit shown in FIG. 21 is used in the complex signal processing unit.

FIG. 23 shows an example of the configuration of the phase lock unit PLL1A in the case where the multiplication unit shown in FIG. 21 is used in the complex signal processing unit 100A-1.

In the example of FIG. 23, the sine wave multiplication unit 104 has a multiplication unit MP1A and control unit CNT1A, and the cosine wave multiplication unit 105 has a multiplication unit MP2A and control unit CNT2A. The multiplication unit MP2A has the same configuration as that of the multiplication unit MP1A shown in FIG. 21. The control units CNT1A and CNT2A realize multiplication of the real component $V_I$ and the signal component $V_{UO-Q}$ or multiplication of the imaginary component $V_Q$ and the signal component $V_{UO-I}$ by the control of the switch as shown in for example FIG. 22.

In the example of FIG. 23, the adder unit 106 has two adder circuits 1061 and 1062 and adds the differential output signal S104 of the multiplication unit MP1A and the differential output signal S105 of the multiplication unit MP2A. Namely, the adder circuit 1061 adds positive side output signals of the multiplication units MP1A and MP2A to each other and outputs the same as the positive side signal of the signal $V_{UC}$. The adder circuit 1062 adds negative side output signals of the multiplication units MP1A and MP2A to each other and outputs the same as the negative side signal of the signal $V_{UC}$.

As explained above, according to the present embodiment, by using the weight coefficient multiplier circuits using pseudo-sine waves, there is the advantage that the detection precision can be made extremely high. Namely, a weight coefficient can be determined according to for example the ratio of the resistance value, therefore it is also possible to obtain a precision of about 0.1% if the layout is considered well.

Figure 36:
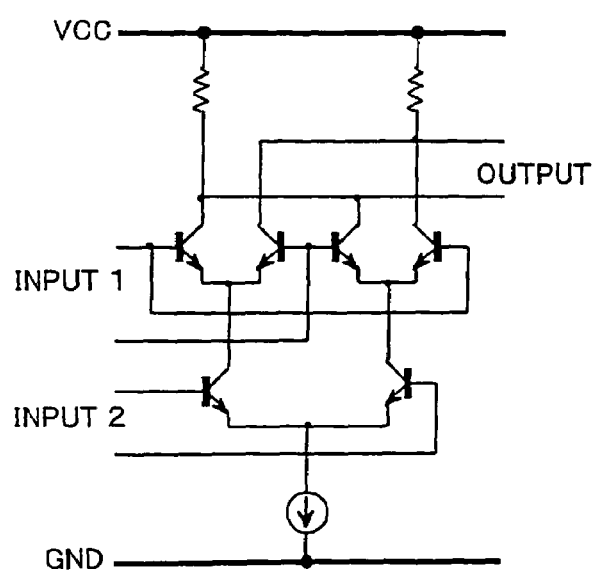
FIG. 36 is a diagram showing an example of the configuration of a Gilbert type multiplier circuit.

Further, in the present embodiment, a weight coefficient multiplier circuit using a pseudo-sine wave can be configured by substantially passive elements except the operation amplifier as in the circuit shown in for example FIG. 21, therefore there is the advantage that the offset voltage can be strikingly made smaller in comparison with the conventional circuit. In the circuit of FIG. 21, the operation amplifier AMP1 generates the offset voltage. When the signal level is 2V and the offset voltage is about 0.2 mV, the signal-to-offset voltage ratio becomes 80 dB. This is an offset smaller than that in the conventional analog multiplier circuit represented by the Gilbert type of FIG. 36 by two to three orders. In order to realize the operation amplifier of the offset of 0.2 mV, considerably careful circuit design and layout are required, but even if the offset is a little worse, there is no problem in 12-bit resolution.

Figure 32:
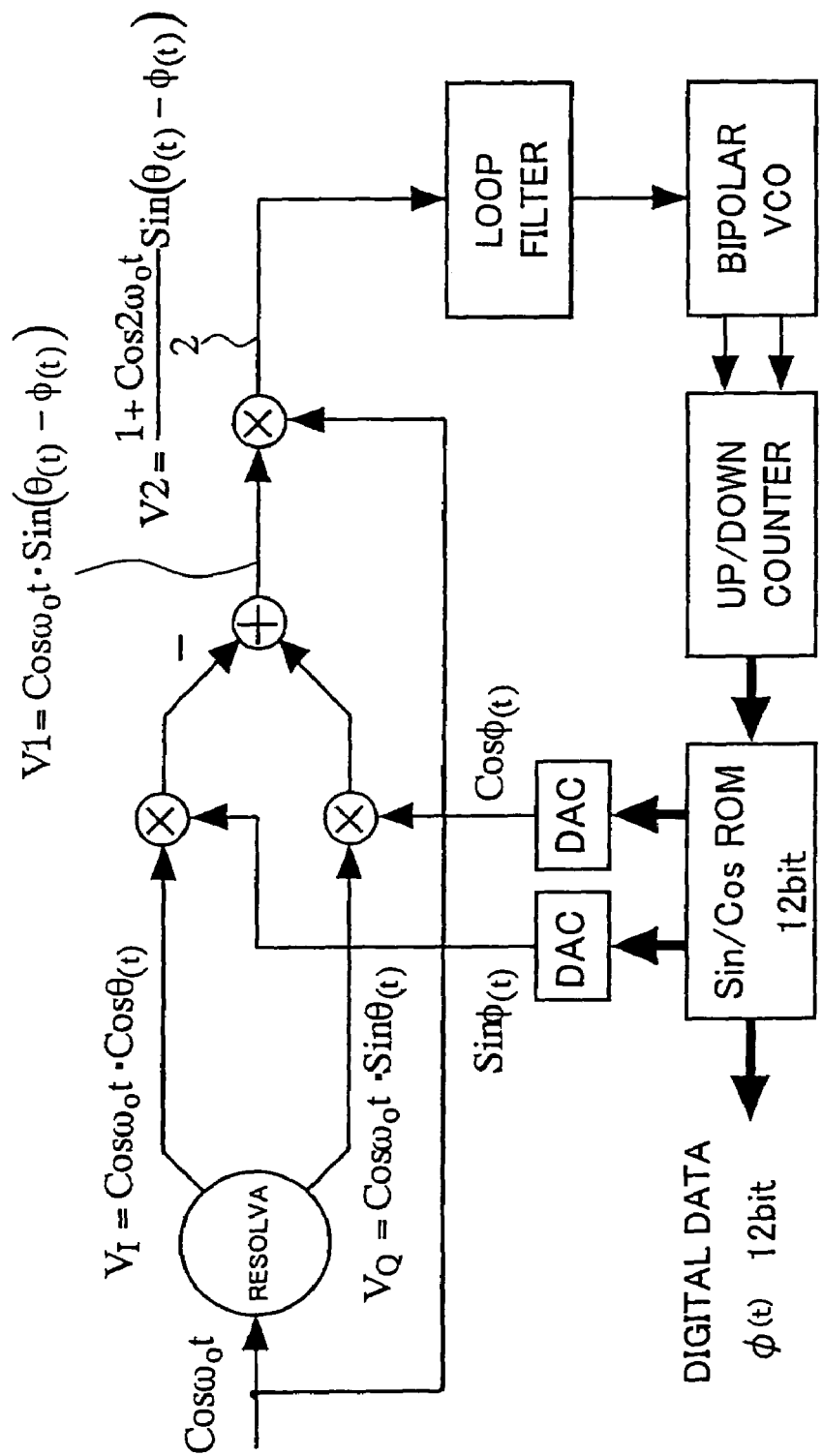
FIG. 32 is a diagram showing an example of the configuration of a conventional angle detection signal processing apparatus used in a 1-phase 2-excitation type resolver.
Figure 33:
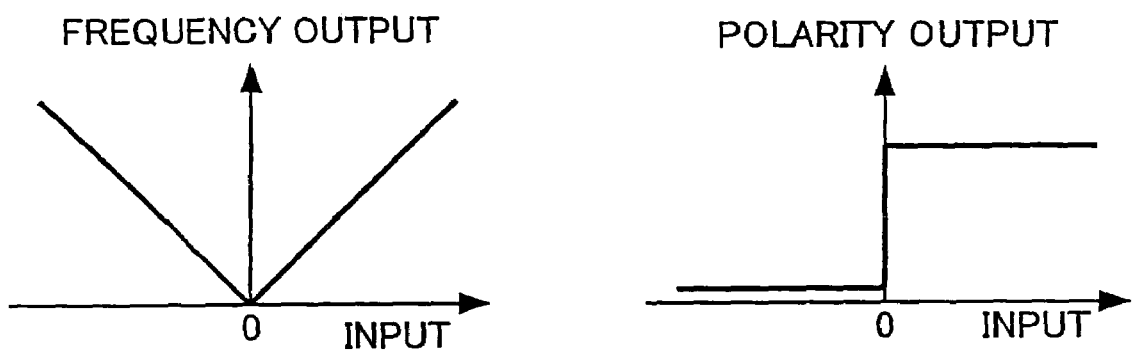
FIG. 33 gives diagrams for explaining an input signal of a bipolar VCO.
Figure 34:
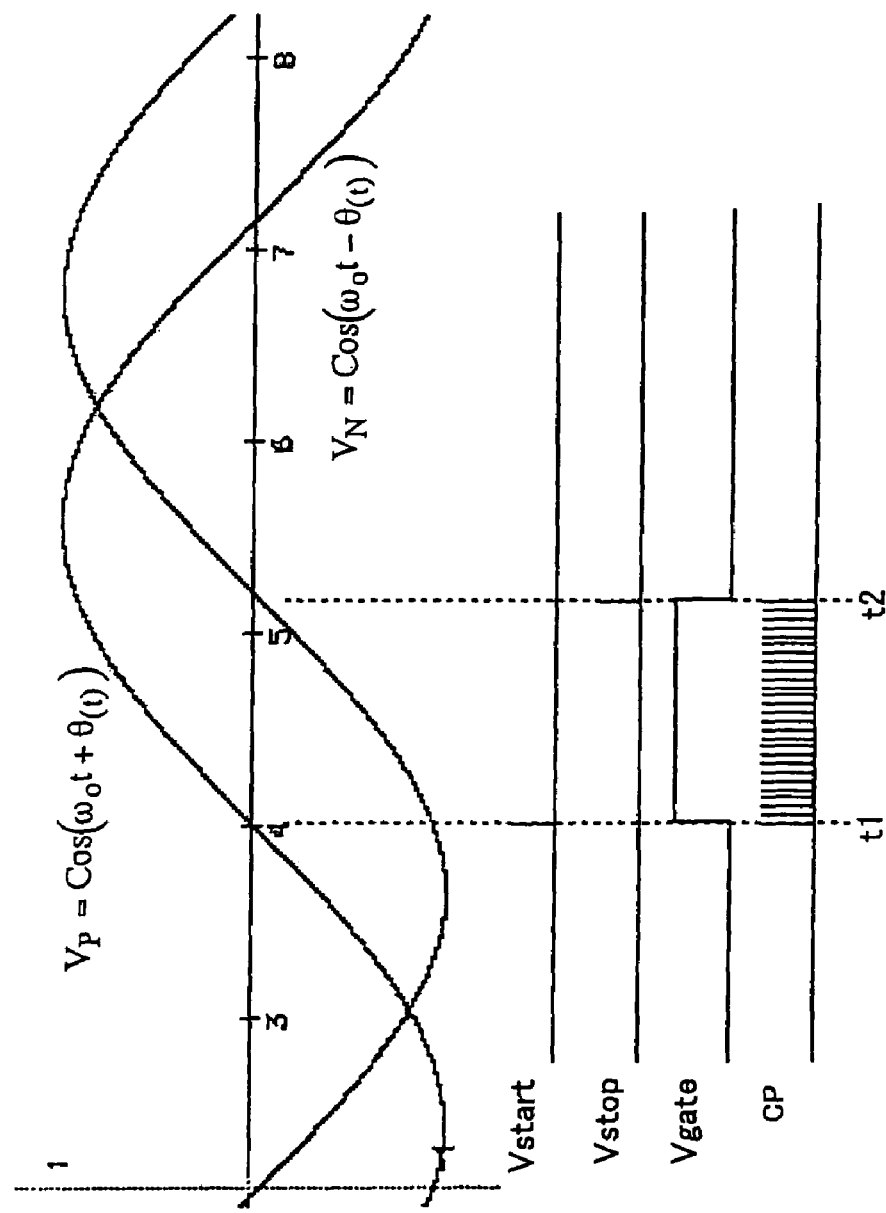
FIG. 34 is a diagram showing an example of a signal waveform of each portion in the angle detection signal processing apparatus shown in FIG. 31.
Figure 35:
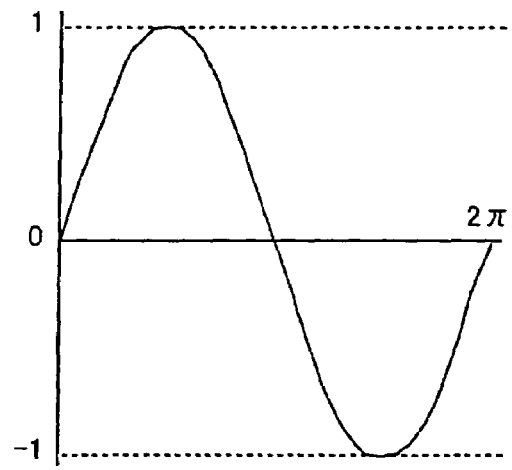
FIG. 35 is a diagram for explaining a resolution required for a sine/cosine ROM and a D/A converter.

The multiplication by the pseudo-sine wave is possible in the present embodiment because the phase lock operation is carried out following not the angle θ($t$), but the phase angle ω$_0$±θ($t$) having the offset of the frequency θ$_o$ in the phase lock unit. When the phase lock operation is carried out following the angle θ(t), no normal operation can be carried out due to quantization distortion. The angle θ(t) is the DC signal when the shaft is stationary, therefore quantization distortion, that is, harmonic distortion, is superimposed on the DC signal. Further, when the angle θ(t) slowly moves, the frequency component thereof is very low, therefore the harmonic enters the band of the phase locked loop and still exerts an adverse influence. This is self-evident when considering that the conventional device shown in FIG. 32 does not function at all if the resolution of the D/A converter generating the cosine signal Cos φ(t) and the sine signal Sin φ(t) is 2 to 3 bits.

In the present embodiment, the phase lock unit operates with the offset of only the frequency $\omega_o$, therefore under any operation condition, there are only harmonics at a high frequency out of the band of the phase locked loop, so there is no longer an adverse influence upon the loop. For example, in a pseudo-sine wave having a 4-value step waveform, the lowest harmonic becomes the 7th order. Therefore, it becomes unnecessary to consider any influence of the harmonics in almost all cases.

Figure 24:
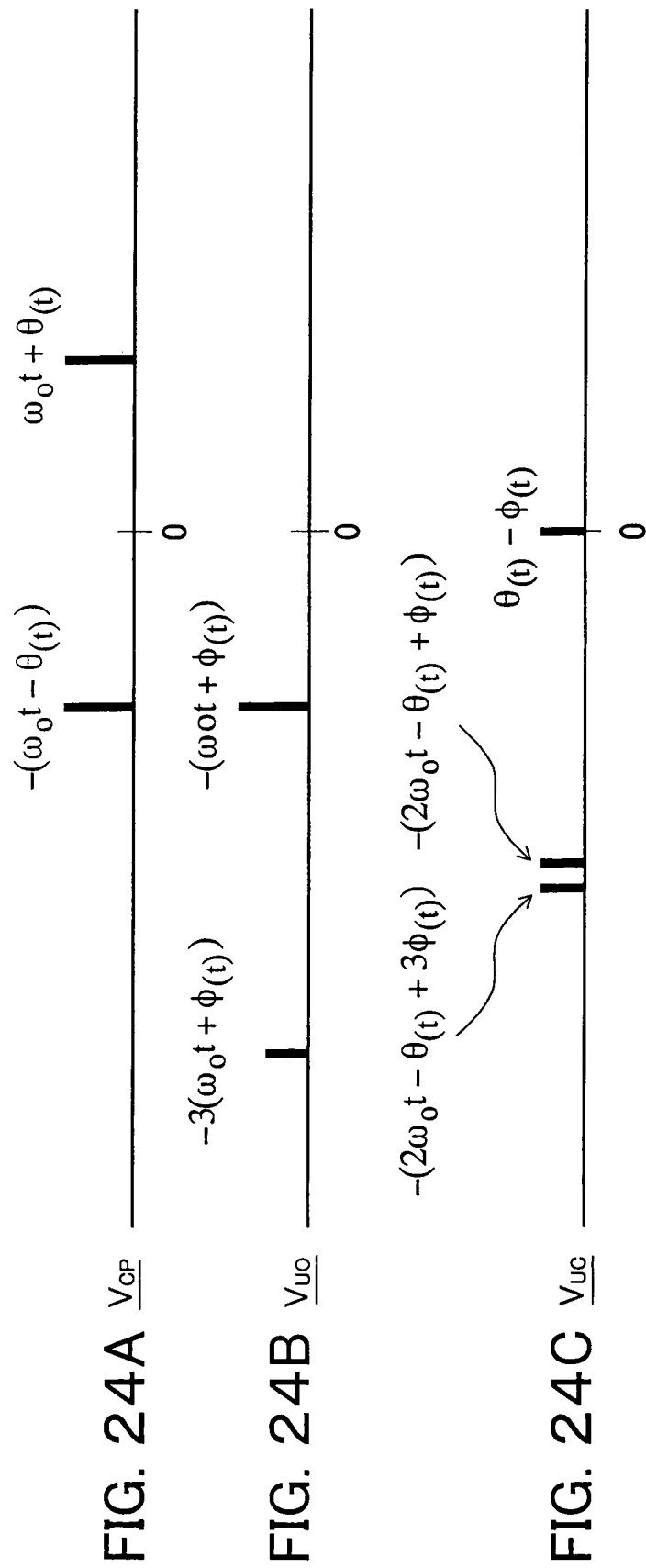
FIGS. 24A to 24C are diagrams showing an example of the frequency spectrum of each signal in a case where a rectangular wave is used for the multiplication in the phase lock unit.

Here, what the pseudo-sine wave become when a rectangular wave is used as an extreme example of a pseudo-sine wave will be simply considered. When a rectangular wave is multiplied, for example as shown in FIG. 2C, the multiplier circuit can be realized by just a function of simply inverting the polarity of the analog signal of the input. When paying attention to only the frequency component of the complex signal $\_V_{CP}$ in the complex signals $\_V_{CP}$ and $\_V_{CN}$ shown in equations (20) and (21) generated by regarding the angle detection signal of the resolver as the complex signal at the complex frequency, as shown in FIG. 24A, "$\omega_o t+\theta(t)$" and "$\omega_o t-\theta(t)$" exist on the positive and negative sides. In this diagram, attention is not paid to the phase. Only the frequency is expressed.

In the complex signal processing unit 100, the object is to obtain "θ(t)−φ(t)" in DC by multiplying "$\omega_o t+\theta(t)$" of FIG. 24(A) and "−($\omega_o t+\theta(t)$)" of FIG. 24(B) (constantly φ(t)=θ(t)). At this time, "−($\omega_o−\theta(t)$)" of the complex signal $\_V_{CP}$ shifts to "−($2\omega_o t-\theta(t)+\phi(t)$)".

Here, when a rectangular wave is used for the complex signal $\_V_{UO}$ of FIG. 24B, there is a third order harmonic "$3(-\omega_o t+\phi(t))$" with respect to "−($\omega_o t+\phi(t)$)". When this component is multiplied with the component "$\omega_o t+\theta(t)$" of the complex signal $\_V_{CP}$, it is converted to "−($2\omega_o t-\theta(t)+\phi(t)$)". "−($2\omega_o t-\theta(t)+3\phi(t)$)" and "−($2\omega_o t-\theta(t)+\phi(t)$)" become almost the same frequency and cannot be discriminated.

The frequency $2\omega_o$ is not always sufficiently higher than the band of the phase lock unit. Accordingly, there is a possibility that these signals have a certain influence on the phase lock unit. "$\omega(2\omega_o t-\theta(t)+\phi(t))$" exists irrespective of the presence/absence of the third order harmonic of the complex signal $\_V_{UO}$, but constantly θ(t)=φ(t)

stands. Therefore, the normal value is $2\omega_o t$ and gives the same fluctuation to the two phase lock units (PLL1, PLL2) irrespective of the angle θ(t). Accordingly, they are cancelled by each other as the same phase modes when finding the difference of the counts of the counter in the phase difference computation unit 500.

Contrary to this, "−($2\omega_o t-\theta(t)+3\phi(t)$)" depends upon the angle θ(t), so does not give the same fluctuation to the two phase lock units (PLL1, PLL2). Accordingly, the influence by that component becomes noise and exerts the adverse influence upon the detection precision. The deterioration of the detection precision due to "−($2\omega_o t-\theta(t)+3\phi(t)$)" once becomes considerably outside of the phase lock band, so there is no such fatal influence in most cases.

However, in a case where a higher resolution is necessary, a case where the band of the phase lock unit is to be extended as much as possible, a case where the frequency of the angle θ(t) becomes very high, that is, a case where it is necessary to envision the machine shaft rotating at an extremely high speed, and other cases, sometimes "−($2\omega_o t-\theta(t)-3\phi(t)$)" per se moves to a considerably low frequency. Accordingly, envisioning such cases, multiplication by the 4-value pseudo-sine wave explained above is desirable. In the 4-value pseudo-sine wave, the lowest harmonic is the 7th order, therefore the consideration as described above is substantially unnecessary. On the other hand, in a case where not that high a resolution is necessary and a case where the band of the phase locked loop is narrow, a multiplier circuit using a rectangular wave is also possible. In this case, the circuit can be greatly simplified.

Third Embodiment

Figure 25:
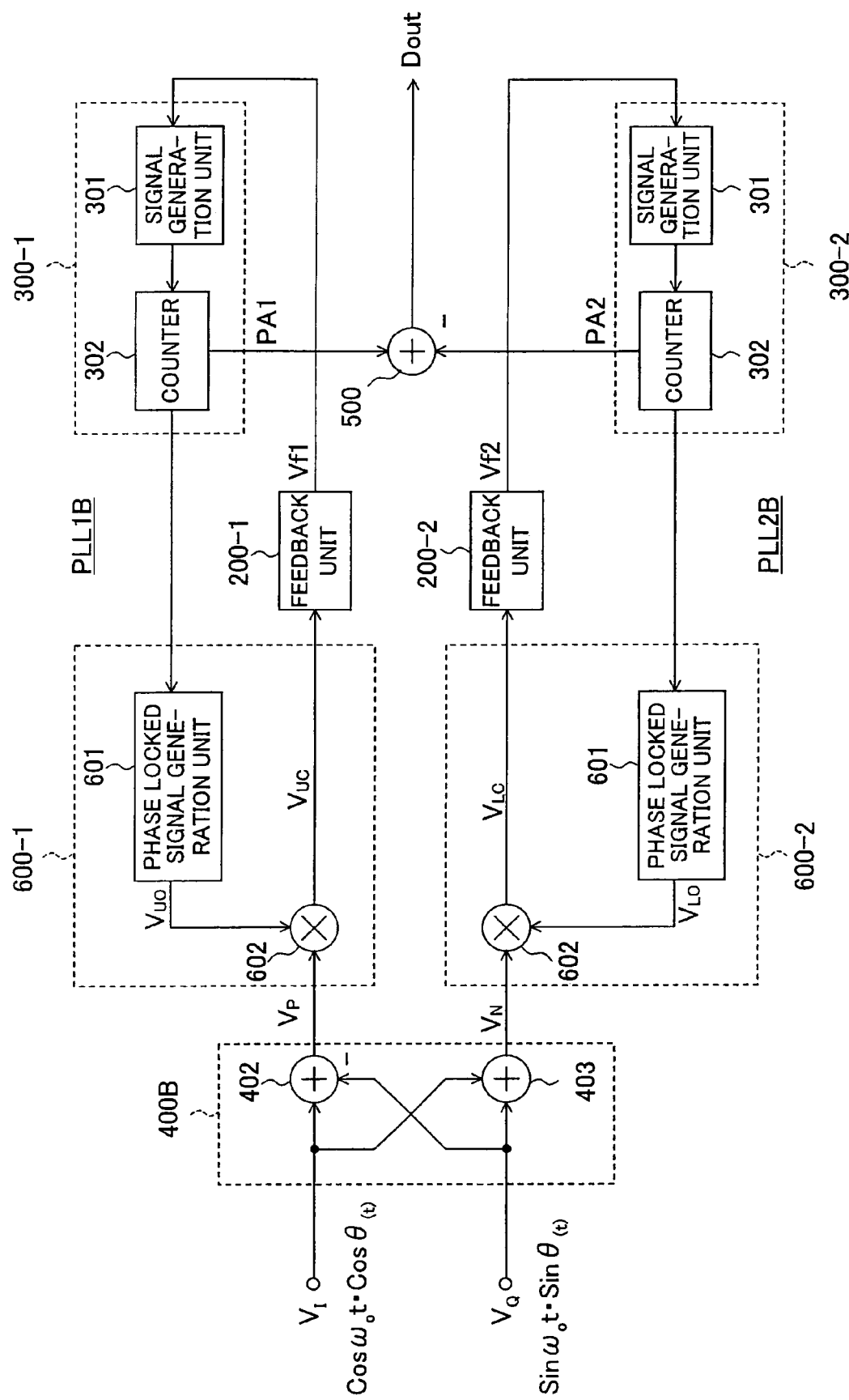
FIG. 25 is a diagram showing an example of the configuration of an angle detection signal processing apparatus according to a third embodiment of the present invention.

Next, an explanation will be given of a third embodiment of the present invention. FIG. 25 is a diagram showing an example of the configuration of an angle detection signal processing apparatus according to the third embodiment of the present invention. The angle detection signal processing apparatus according to the third embodiment receives as input the angle detection signals shown in equation (3) and equation (4) output from a 2-phase excitation 2-phase output type resolver:

$V_I = \cos \omega_o t \cdot \cos \theta(t)$ $V_Q = \sin \omega_o t \cdot \sin \theta(t)$ to acquire the information of the angle θ(t).

The angle detection signal processing apparatus shown in FIG. 25 has a signal processing unit 400B, phase lock units PLL1B and PLL2B, and a phase difference computation unit 500.

Signal Processing Unit 400B

The signal processing unit 400B outputs the difference of the angle detection signals $V_I$ and $V_Q$ as the signal $V_P$ to the phase lock unit PLL1B and, at the same time, outputs the sum of the angle detection signals $V_I$ and $V_Q$ as the signal $V_N$ to the phase lock unit PLL2B. For example, as shown in FIG. 25, the signal processing unit 400B has a subtractor unit 402 and adder unit 403. The subtractor unit 402 subtracts the $V_Q$ from the angle detection signal $V_I$ and outputs the result as the signal $V_P$. The adder unit 403 adds the angle detection signals $V_I$ and $V_Q$ and outputs the result as the signal $V_N$.

PLL1B and PLL2B

The phase lock unit PLL1B generates the phase locked signal $V_{UO}$ locking the phase to the signal $V_P$ output from the signal processing unit 400B and outputs the data PA1 in accordance with the phase angle of this phase locked signal $V_{UO}$. The phase lock unit PLL2B generates the phase locked signal $V_{LO}$ locking the phase to the signal $V_N$ output from the signal processing unit 400B and outputs the data PA2 in accordance with the phase angle of this phase locked signal $V_{LO}$.

Detailed configurations of the phase lock units PLL1 and PLL2 will be explained.

In the example of FIG. 25, the phase lock unit PLL1B has a phase angle data generation unit 300-1, phase detection unit 600-1, and feedback unit 200-1. The phase lock unit PLL2B has a phase angle data generation unit 300-2, phase detection unit 600-2, and feedback unit 200-2. Note that the same notations of the angle detection signal processing apparatuses shown in FIG. 1 and FIG. 25 indicate the same components, so the explanation thereof will be omitted. Further, the phase detection units 600-1 and 600-2 are embodiments of the phase detection unit of the present invention.

The phase detection unit 600-1 detects the phase difference between the phase locked signal $V_{UO}$ having a phase angle in accordance with the data PA1 generated in the phase angle data generation unit 300-1 and the input signal $V_P$ from the signal processing unit 400B.

The phase detection unit 600-1 has a phase locked signal generation unit 601 and the multiplication unit 602 as shown in for example FIG. 25.

The phase locked signal generation unit 601 converts for example the signal of the most significant bit of the count of the counter 302 to a rectangular signal having positive and negative identical amplitudes based on the data PA1 of the phase angle and outputs this as the phase locked signal $V_{UO}$. When such a rectangular signal is used, harmonic components are included in the multiplication result, but as explained by referring to FIG. 24, when the angle θ(t) relatively slowly changes or when the band of the phase lock unit is narrow, the harmonic components can be sufficiently attenuated by the feedback unit 200-1, therefore a good precision can be obtained.

Further, the phase locked signal generation unit 601 may generate the signal components $V_{UO\text{-}I}$ and $V_{UO\text{-}Q}$ by converting data of phase angle to data of amplitude by using a ROM having sine/cosine amplitude data as a table and converting that to the analog signal by a D/A converter as well.

The multiplication unit 602 multiplies the signal component $V_{UO}$ generated at the phase locked signal generation unit 601 and the signal $V_P$ input from the signal processing unit 400 with each other and outputs the signal $V_{UC}$ in accordance with the phase difference of these signals. The multiplication unit 602 may be configured by using an analog multiplier such as a Gilbert circuit or using a multiplication type D/A converter. Alternatively, as shown in FIG. 2C, a configuration of switching the polarity by using a switch circuit and polarity judgment circuit and outputting the same may be used.

The phase detection unit 600-2 detects the phase difference between the phase locked signal $V_{LO}$ having a phase angle in accordance with the data PA2 generated at the phase angle data generation unit 300-2 and the input signal $V_N$ from the signal processing unit 400B. The phase detection unit 600-2 is also configured by using for example a phase locked signal generation unit 601 and multiplication unit 602 the same as those explained above and generates the signal $V_{LC}$ in accordance with the phase difference between the phase locked signal $V_{LO}$ and the signal $V_N$.

Here, an explanation will be given of the operation of the angle detection signal processing apparatus shown in FIG. 25 having the above-explained configuration.

First, the angle detection signals $V_I$ and $V_Q$ of the 2-phase excitation 2-phase type resolver are given by the following equations:

$$V_I = \text{Cos } \omega_o t \cdot \text{Cos } \theta_{(t)} = 1/2\{\text{Cos}(\omega_o t + \theta_{(t)}) + \text{Cos }(\omega_o t - \theta_{(t)})\} \quad (31)$$

$$V_Q = \text{Sin } \omega_o t \cdot \text{Sin } \theta_{(t)} = 1/2\{-\text{Cos}(\omega_o t + \theta_{(t)}) + \cos(\omega_o t - \theta_{(t)})\} \quad (32)$$

These signals are converted to the signals $V_P$ and $V_N$ shown in the following equations by the subtraction/addition of the signal processing unit 400B:

$$V_P = V_I - V_Q = \text{Cos}(\omega_o t + \theta(t)) \quad (33)$$

$$V_N = V_I + V_Q = \text{Cos}(\omega_o t - \theta(t)) \quad (34)$$

The signals $V_P$ and $V_N$ are input to the phase lock units PLL1B and PLL2B explained above. The phase locked signals $V_{UO}$ and $V_{LO}$ generated at the phase locked signal generation units 601 are given by the following equations:

$$\begin{aligned}V_{UC} &= -\text{Cos}(\omega_o t + \theta_{(t)}) \cdot \text{Sin}(\omega_o t + \varphi_{(t)}) \\ &= (1/2)\{\text{Sin}(\theta_{(t)} - \varphi_{(t)}) - \text{Sin}(2\omega_o t + \theta_{(t)} + \varphi_{(t)})\} \\ &\Rightarrow (1/2)\text{Sin}(\theta_{(t)} - \varphi_{(t)})\end{aligned} \quad (37)$$

$$\begin{aligned}V_{LC} &= -\text{Cos}(\omega_o t - \theta_{(t)}) \cdot \text{Sin}(\omega_o t - \varphi_{(t)}) \\ &= (1/2)\{\text{Sin}(-\theta_{(t)} + \varphi_{(t)}) - \text{Sin}(2\omega_o t - \theta_{(t)} - \varphi_{(t)})\} \\ &\Rightarrow (1/2)\text{Sin}(-\theta_{(t)} + \varphi_{(t)})\end{aligned} \quad (38)$$

As a result, these two phase lock units PLL1B and PLL2B operate so that the angle φ(t) follows the angle θ(t). At this time, the data PA1 and PA2 having the phase angles output at the phase angle data generation units 300-1 and 300-2 correspond to the phase angles "$\omega_o t + \phi(t)$" and "$\omega_o t - \phi(t)$". For this reason, by finding for example the difference of the two based on the data PA1 and PA2 of the phase angles, the information of the angle θ(t) sought is obtained.

$$(\omega_o t + \phi_{(t)}) - (\omega_o t - \phi_{(t)}) = 2\phi_{(t)} = 2\theta_{(t)} \quad (39)$$

For example, when the counter 302 is comprised of n number of bits, the data Dout obtained by taking the difference (sum) of them becomes n+1 bits. When dividing this by 2 in order to obtain the angle θ(t), the binary data should be shifted by 1 bit.

As explained above, according the angle detection signal processing apparatus of the present embodiment, in the phase lock unit PLL1B, the feedback control acts so that the phase difference between the input signal $V_P$ from the signal processing unit 400B and the phase locked signal $V_{UO}$ is converged to a constant value. In the same way, in the phase lock unit PLL2B, the feedback control acts so that the phase difference between the input signal $V_N$ from the signal processing unit 400B and the phase locked signal $V_{LO}$ is converged to a constant value. For this reason, the phase difference between the phase locked signals $V_{UO}$ and $V_{LO}$ has a value in accordance with the phase difference between the signals $V_P$ and $V_N$. Further, the phase locked signal $V_{UO}$ has a phase angle in accordance with the data PA1 of the phase angle, and the phase locked signal $V_{LO}$ has a phase angle in accordance with the data PA2 of the phase angle. Therefore, it is possible to compute the phase difference between the phase locked signals $V_{UO}$ and $V_{LO}$ based on the data PA1 and PA2 of the phase angles. Accordingly, the phase difference computation unit 500 computes the phase difference between the signals $V_P$ and $V_N$ based on the data PA1 and PA2 of the phase angles. On the other hand, the phase difference between the signals $V_P$ and $V_N$ is the phase difference of the angle 2×θ(t) as shown in equations (33) and (34). Accordingly, the information of the angle θ(t) can be obtained from the phase difference computed at the phase difference computation unit 500.

Further, in the present embodiment, the phase lock units PLL1B and PLL2B perform the phase lock operation so as to follow the phase angle "$\omega_o t \pm \theta(t)$" having the offset of the frequency $\omega_o t$ with respect to the angle θ(t) for detection.

For this reason, even if the angle θ(t) becomes a constant value of the frequency zero, the phase locked signals $V_{UO}$ and $V_{LO}$ are controlled so as to have the frequency θ$_o$. By this, it is not necessary to provide a means oscillating at the frequency zero like for example a bipolar VCO in order to perform the phase lock operation. Further, the phase lock operation is carried out so as to follow the phase angle "ω$_o$t±θ(t)", therefore a high resolution can be obtained for the phase angle even when there is no resolution for the amplitude. By this, it becomes possible to make the configurations of a ROM having a large capacity and the D/A converter and the multiplication type D/A converter having a high resolution unnecessary.

Further, a high resolution is no longer required for the amplitude, therefore it also becomes possible to form for example the phase locked signals $V_{UO}$ and $V_{LO}$ as rectangular waves, so the configuration can be further simplified.

Figure 31:
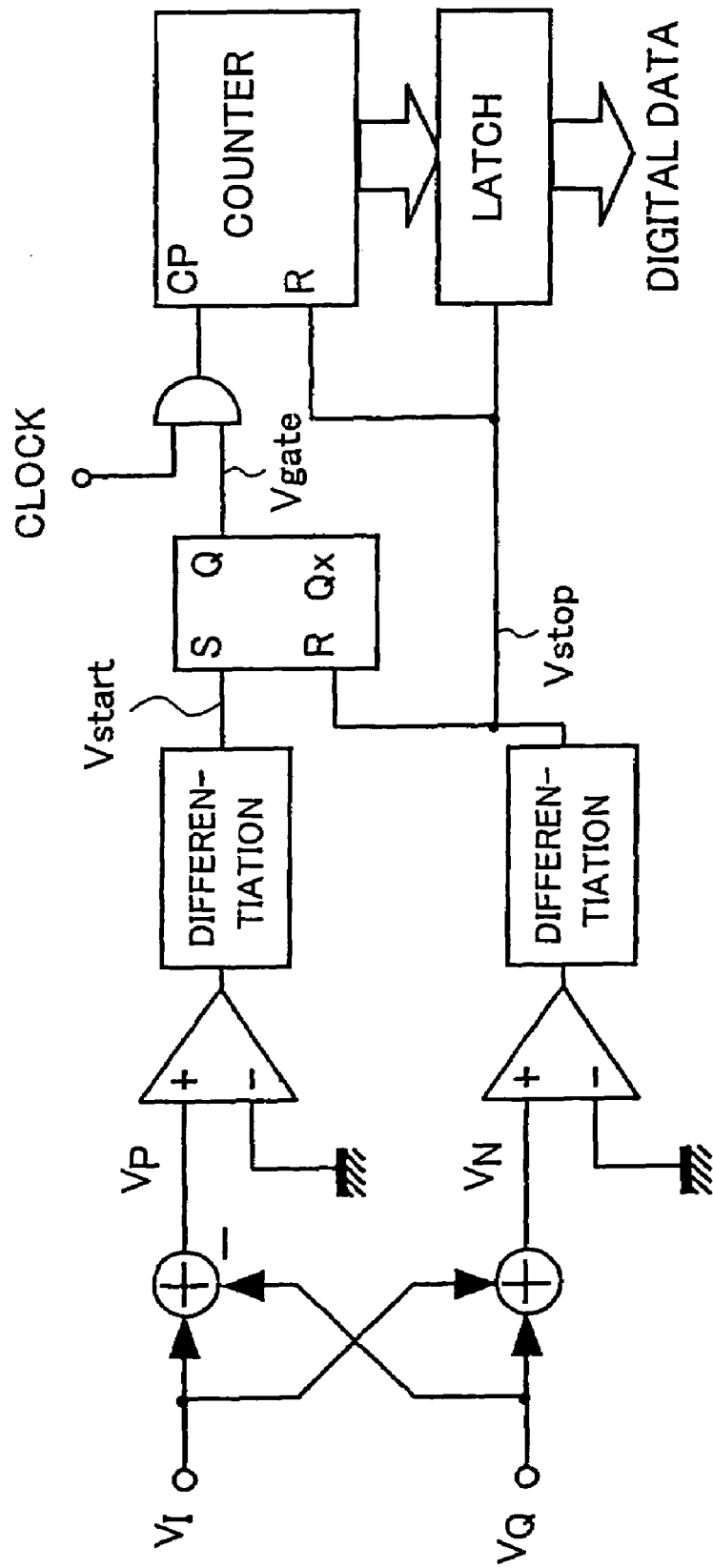
FIG. 31 is a diagram showing an example of the configuration of a conventional angle detection signal processing apparatus used in a 2-phase 2-excitation type resolver.

Further, unlike the measurement of the time difference at the zero cross point shown in FIG. 31, the phase difference of the signals $V_P$ and $V_N$ is found based on the data PA1 and PA2 output at the phase lock units PLL1B and PLL2B with each instant, therefore the information of the angle θ(t) can be acquired in real time. Further, it is possible to obtain resistance to external noise in comparison with the method of using the zero cross point.

Fourth Embodiment

Next, an explanation will be given of a fourth embodiment of the present invention.

Figure 26:
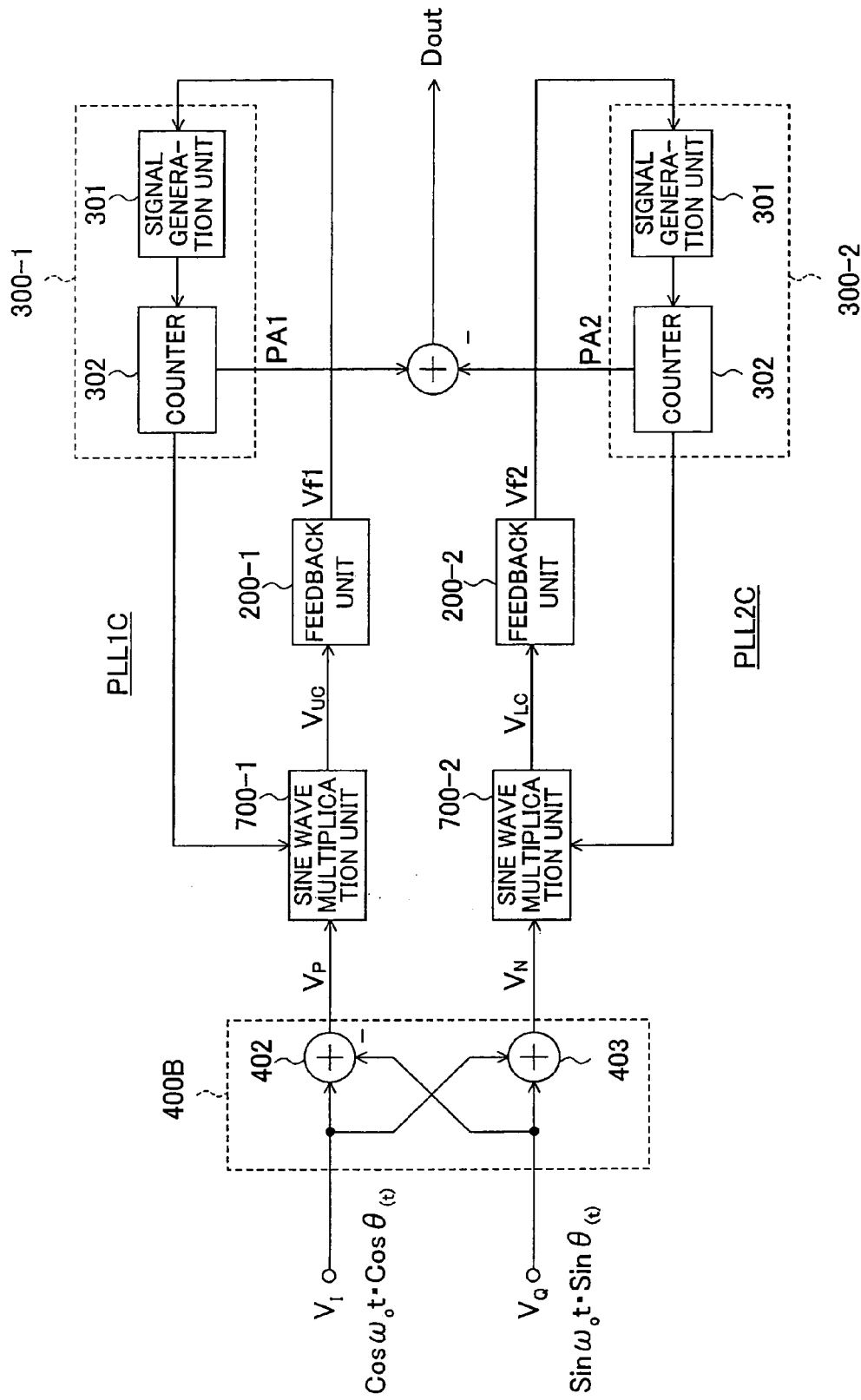
FIG. 26 is a diagram showing an example of the configuration of an angle detection signal processing apparatus according to a fourth embodiment of the present invention.

FIG. 26 is a diagram showing an example of the configuration of the angle detection signal processing apparatus according to the fourth embodiment of the present invention.

In the angle detection signal processing apparatus shown in FIG. 26, the phase detection units 600-1 and 600-2 in the angle detection apparatus shown in FIG. 25 are replaced by sine wave multiplication units 700-1 and 700-2. The rest of the configuration is the same in the two. The sine wave multiplication units 700-1 and 700-2 are embodiments of the phase detection unit of the present invention.

Further, the sine wave multiplication units 700-1 and 700-2 are multiplier circuits using pseudo-sine waves having the same configuration as that of the previously explained sine wave multiplication unit 104. Namely, the sine wave multiplication unit 700-1 selects the weight coefficient in accordance with the instantaneous value of the phase locked signal $V_{UO}$ at a predetermined phase angle within the angular range of the destination of movement from among a plurality of weight coefficients when the phase angle indicated by the data PA1 of the phase angle data generation unit 300-1 shifts to another angular range among a plurality of angular ranges forming part of one cycle and multiplies the selected weight coefficient with the input signal $V_P$ from the signal processing unit 400B. Further, the sine wave multiplication unit 700-2 selects the weight coefficient in accordance with the instantaneous value of the phase locked signal $V_{LO}$ at a predetermined phase angle within the angular range of the destination of movement from among a plurality of weight coefficients when the phase angle indicated by the data PA2 of the phase angle data generation unit 300-2 shifts to another angular range among a plurality of angular ranges forming part of one cycle and multiplies the selected weight coefficient with the input signal $V_N$ from the signal processing unit 400B.

According to the above-explained configuration, the multiplier circuits using pseudo-sine waves are used for the multiplication of the input signals $V_P$ and $V_N$ and the phase locked signals $V_{UO}$ and $V_{LO}$ at the phase lock units, therefore the detection precision can be made extremely high in comparison with the case where an analog multiplier is used.

Further, in the present embodiment, a multiplier circuit of the weight coefficient using a pseudo-sine wave can be configured by substantially passive elements except the operation amplifier like the circuit shown in for example FIG. 21, so the offset voltage can be made strikingly smaller in comparison with the conventional case.

Other than this, the same effects as those by the previously explained angle detection signal processing apparatus shown in FIG. 25 can be exhibited.

Fifth Embodiment

Figure 27:
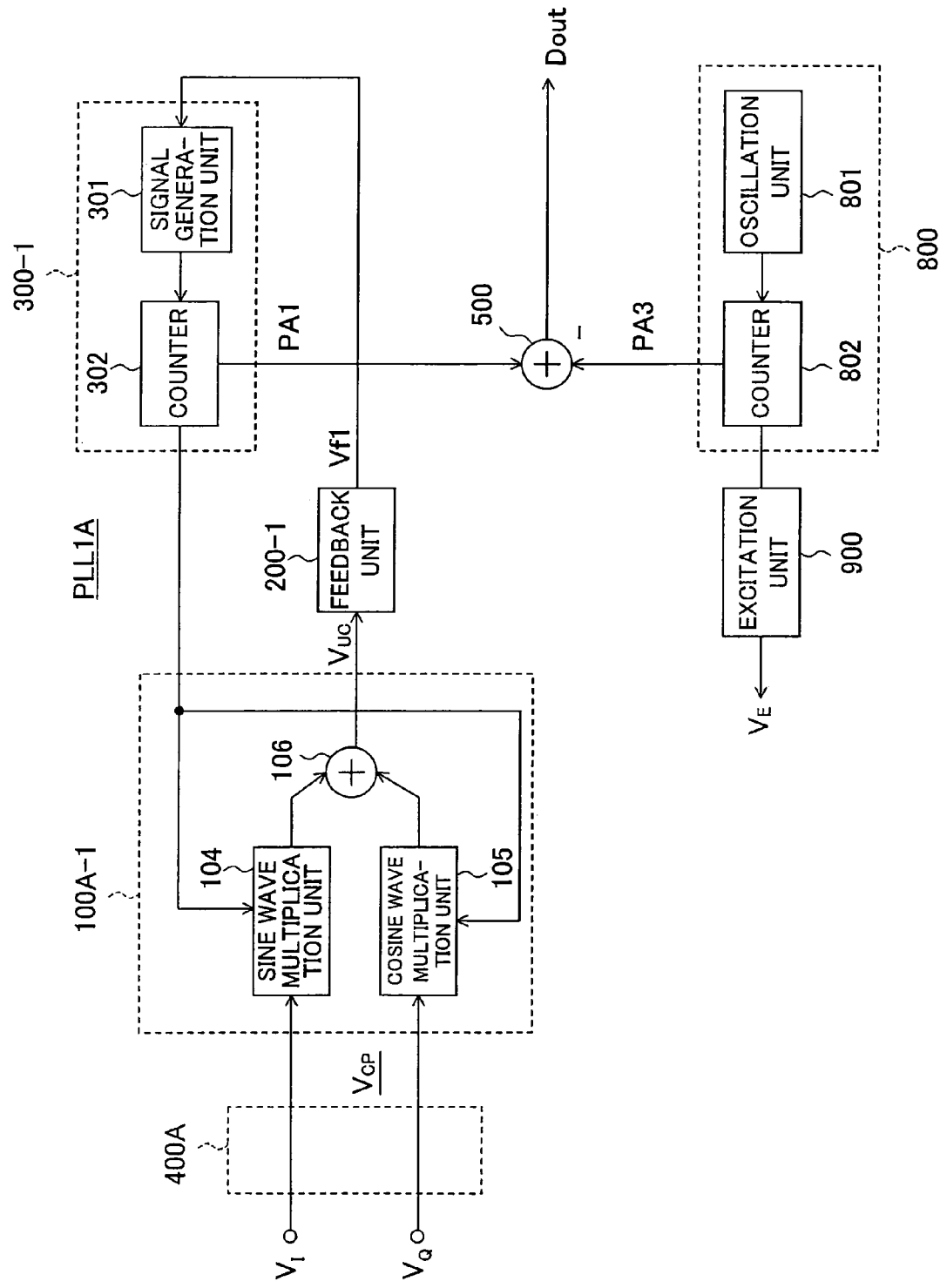
FIG. 27 is a diagram showing an example of the configuration of an angle detection signal processing apparatus according to a fifth embodiment of the present invention.

Next, an explanation will be given of a fifth embodiment of the present invention. FIG. 27 is a diagram showing an example of the configuration of an angle detection signal processing apparatus according to the fifth embodiment of the present invention.

In the embodiments explained above, basically two phase lock units are used, and the information of the angle e (t) is acquired based on the data PA1 and PA2 following the phase angles "ω$_o$t+θ(t)" and "ω$_o$t−θ(t)" having an offset of frequency with respect to the angle θ(t). On the other hand, the excitation signal supplied to the resolver has the phase angle "ω$_o$t", and the phase difference becomes "θ(t)" with respect to the phase angles "ω$_o$t+θ(t)" and "ω$_o$t−θ(t)". Therefore, in the present embodiment, the information of the angle θ(t) is acquired by referring to the phase angle of the excitation supplied to the resolver.

In the angle detection signal processing apparatus shown in FIG. 27, the phase lock unit PLL2A in the angle detection signal processing apparatus shown in FIG. 14 is deleted, the signal processing unit 400 is changed to the signal processing unit 400A, and a phase angle data generation unit 800 is further provided.

The phase angle data generation unit 800 generates the data PA3 indicating the phase angle "ω$_o$t" of the excitation signal VE(=$V_{EO}$·Cos ω$_o$t) of the frequency ω$_o$ supplied to the resolver.

The phase angle data generation unit 800 has an oscillator 801 and counter 802 as shown in for example FIG. 27. The oscillator 801 oscillates at a frequency $2^n$·ω$_o$ with respect to the frequency ω$_o$. The counter 802 is a counter outputting a count having n-bit length, divides in frequency the signal having the frequency $2^n$·ω$_o$ output from the oscillator 801, and generates a signal of the frequency ω$_o$. The count of the counter 802 is output as the data PA3 of the phase angle of the excitation signal.

The excitation unit 900 outputs the excitation signal $V_E$ to be supplied to the 1-phase 2 excitation type resolver based on the signal having the frequency ω$_o$ divided at the counter 802.

The signal processing unit 400A outputs a complex signal of the frequency ω$_o$ having a phase difference in accordance with the angle θ(t) with respect to the phase angle of the excitation signal $V_E$ indicated by the data PA3 based on the angle detection signals $V_I$ and $V_Q$. For example, as shown in FIG. 27, the complex signal $\_V_{CP}$ comprised of the angle detection signal $V_I$ as the real component, and the angle detection signal $V_Q$ as the imaginary component is output.

As shown in equation (20), the phase angle of the signal component having the positive frequency included in the complex signal $\_V_{CP}$ is "ω$_o$t+θ(t)", and the signal component having the negative frequency is "ω$_o$t−θ(t)". The two have a phase difference of the angle θ(t) with respect to the phase angle "$\omega_o t$" of the excitation signal $V_E$.

The phase lock unit PLL1A locks the phase of the oscillation signal to only the frequency component having a specific polarity included in the complex signal $\_V_{CP}$ according to the previously explained complex phase lock operation, therefore the phase angle indicated by the data PA1 has a phase difference of the angle θ(t) with respect to the phase angle "$\omega_o t$" of the excitation signal $V_E$.

Accordingly, at the phase difference computation unit 500, by computing the difference between the phase angle indicated by the data PA1 and the phase angle of the excitation signal $V_E$ indicated by the data PA3, the information of the angle θ(t) is obtained.

Next, an explanation will be given of another embodiment for acquiring the information of the angle θ(t) by referring to the phase angle of the excitation signal.

Figure 28:
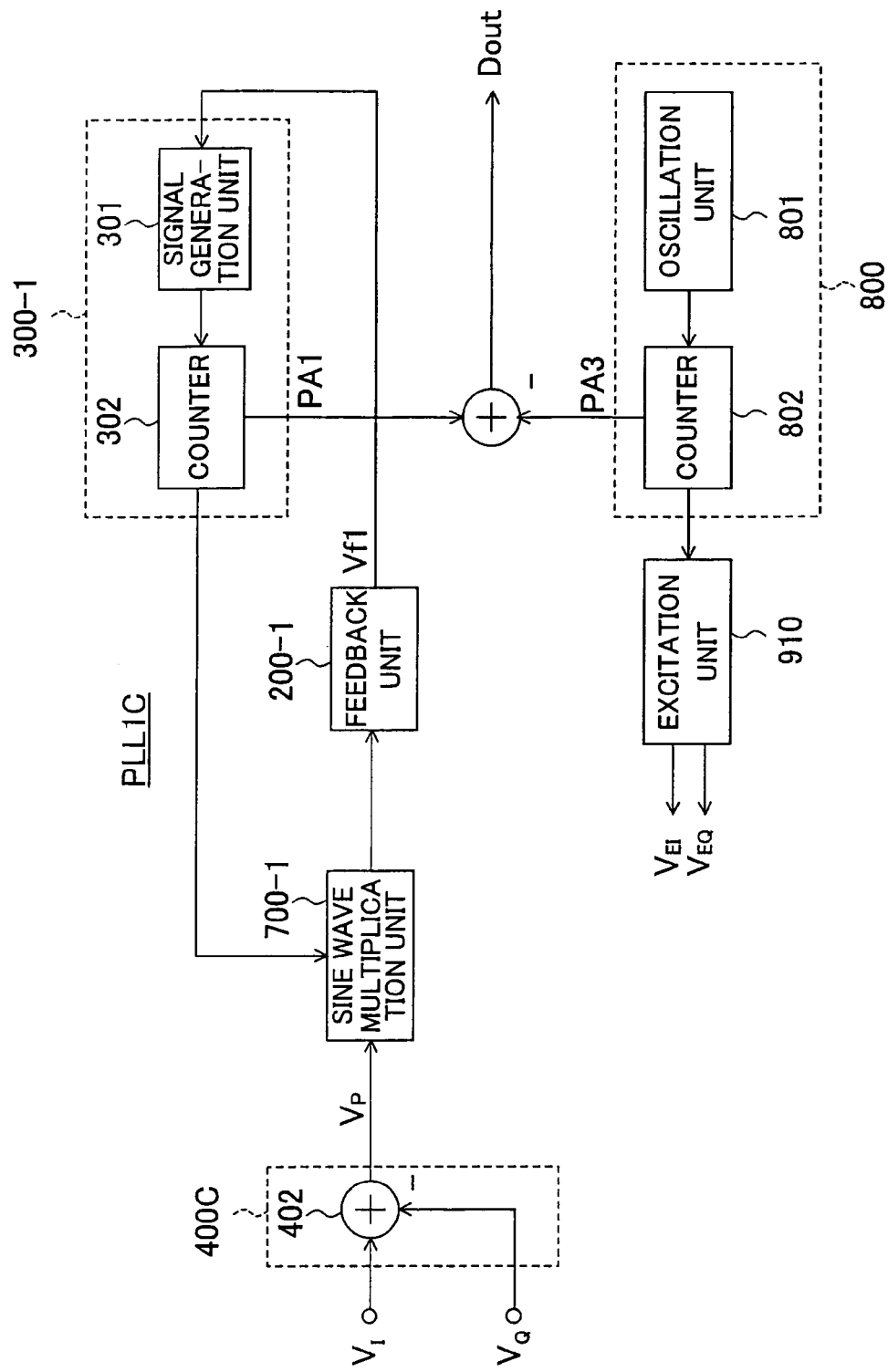
FIG. 28 is a diagram showing another example of the configuration of an angle detection signal processing apparatus according to a fifth embodiment of the present invention.
Figure 29:
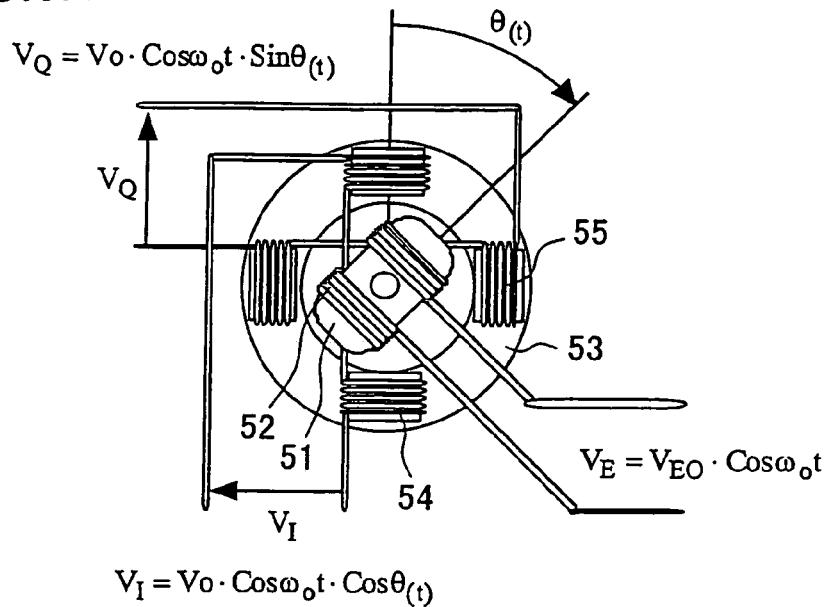
FIG. 29 is a diagram showing an example of the configuration of a 1-phase 2-excitation type resolver.
Figure 30:
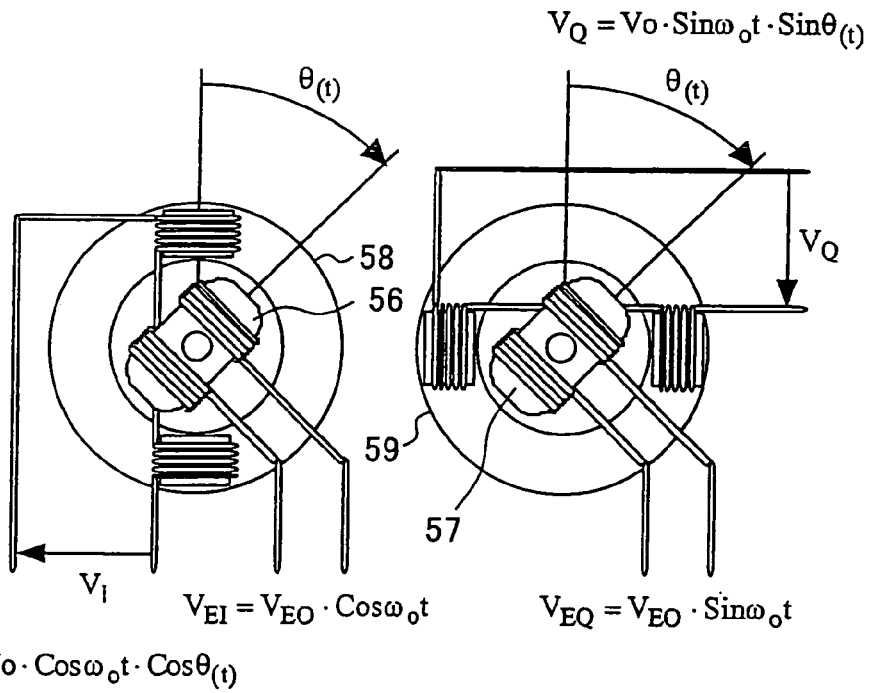
FIG. 30 is a diagram showing an example of the configuration of a 2-phase 2-excitation type resolver.

FIG. 28 is a diagram showing another example of the configuration of the angle detection signal processing apparatus according to the fifth embodiment of the present invention.

In the angle detection signal processing apparatus shown in FIG. 28, the phase lock unit PLL2C in the angle detection signal processing apparatus shown in FIG. 26 is deleted, the signal processing unit 400B is changed to the signal processing unit 400C, and further the above-explained phase angle data generation unit 800 is provided.

The signal processing unit 400C outputs the signal of the frequency $\omega_o$ having a phase difference in accordance with the angle θ(t) with respect to the phase angle of the excitation signal VE indicated by the data PA3 based on the angle detection signals $V_I$ and $V_Q$. For example, as shown in FIG. 28, the signal VP obtained by subtracting $V_Q$ from the angle detection signal $V_I$ is output.

The excitation unit 910 outputs excitation signals $V_{EI}$ and $V_{EQ}$ to be supplied to the 2-phase 2 excitation type resolver based on the signal of the frequency $\omega_o$ divided at the counter 802.

As shown in equation (33), the phase angle "$\omega_o t+θ(t)$" of the signal $V_P$ has a phase difference of the angle θ(t) with respect to the phase angle "$\omega_o t$" of the excitation signals ($V_{EI}$, $V_{EQ}$). The phase lock unit PLL1C locks the phase of the oscillation signal to the phase angle "$\omega_o t+θ(t)$" of the signal $V_P$, therefore the phase angle indicated by the data PA1 has a phase difference of the angle θ(t) with respect to the phase angle "$\omega_o t$" of the excitation signals ($V_{EI}$, $V_{EQ}$). Accordingly, in the phase difference computation unit 500, by computing the difference between the phase angle indicated by the data PA1, and the phase angles of the excitation signals ($V_{EI}$, $V_{EQ}$) indicated by the data PA3, the information of the angle θ(t) is obtained.

As explained above, according to the present embodiment, by referring to the phases of the excitation signals to be supplied to the resolver, the number of the phase lock units can be decreased, therefore it becomes possible to further simplify the configuration in comparison with the previous embodiments.

Note that, in the present embodiment, when there is a phase transition between the excitation input and the detection output in the resolver, the phase of the amount of this transition becomes the offset of the angle data to be detected. For this reason, in the present embodiment, preferably use is made of a resolver having the phase managed well. If a stable constant error occurs, by correcting the angle data so as to cancel this, the reduction of the detection precision can be effectively suppressed. Further, in a field of application where the offset of the phase does not become a problem, for example a field where it is important to catch the change of the phase, the present embodiment is useful.

Some embodiments of the present invention were explained above, but the present invention is not limited to only these aspects and includes a variety of variations.

For example, the angle detection signals $V_I$ and $V_Q$ output from the resolver may be analog signals as well. Those obtained by converting them to digital signals at the A/D converter may be input as well. In the latter case, the phase lock unit of the present invention may be configured by a digital circuit as well. It is also possible to execute the processing of the present invention according to a program by a computer.

It should be understood by those skilled in the art that various modifications, combinations, sub-combinations, and alterations may occur depending on design requirements and other factors insofar as they are within the scope of the appended claims or the equivalents thereof.

The invention claimed is:

1. An angle detection signal processing apparatus for acquiring information of a first angle based on a detection output of a resolver including a first angle detection signal containing an amplitude of a first excitation signal having a first frequency modulated by a signal of a cosine function having a first angle and a second angle detection signal comprised of an amplitude of a second excitation signal having the first frequency modulated by a signal of a sine function having the first angle, said apparatus comprising:

a signal processing unit outputting a first signal and a second signal having the first frequency and, at the same time, having a phase difference in accordance with the first angle based on the first angle detection signal and the second angle detection signal, a first phase lock unit generating a first phase locked signal locking the phase to the first signal and outputting first data indicating a phase angle of the first phase locked signal;

a second phase lock unit generating a second phase locked signal locking the phase to the second signal and outputting second data indicating a phase angle of the second phase locked signal; and a phase difference computation unit computing a phase difference between the first phase locked signal and the second phase locked signal based on the first data and the second data.

2. An angle detection signal processing apparatus as set forth in claim 1, wherein the first excitation signal and the second excitation signal are signals of a cosine function having the first frequency, the signal processing unit outputs a complex signal comprised of the first angle detection signal as a real component and the second angle detection signal as an imaginary component to the first phase lock unit as the first signal and, at the same time, outputs a complex signal comprised of the first angle detection signal as the real component and a signal obtained by inverting the polarity of the second angle detection signal as the imaginary component to the second phase lock unit as the second signal;

each of the first phase lock unit and the second phase lock unit has a phase angle data generation unit generating data repeated in a cycle in accordance with the input feedback control signal and indicating the phase angle in the cycle as the first data or the second data, a complex signal processing unit generating a signal in accordance with a deflection angle of the complex signal obtained when multiplying the first complex signal input from the signal processing unit and the second complex signal including a first signal component and a second signal component having phase angles in accordance with the data generated at the phase angle data generation unit and orthogonal to each other and having a frequency set at a predetermined polarity, and a feedback unit generating a feedback control signal for feedback control so that the deflection angle is converged to a constant value in accordance with the signal generated in the complex signal processing unit.

3. An angle detection signal processing apparatus as set forth in claim 2, wherein the first excitation signal is a signal of a cosine function having the first frequency, the second excitation signal is a signal of a sine function having the first frequency, the signal processing unit outputs the difference between the first angle detection signal and the second angle detection signal as the first signal to the first phase lock unit and, at the same time, outputs the sum of the first angle detection signal and the second angle detection signal as the second signal to the second phase lock unit, and each of the first phase lock unit and the second phase lock unit has a phase angle data generation unit generating data repeated in a cycle in accordance with the input feedback control signal and indicating the phase angle within the cycle as the first data or the second data, a phase detection unit detecting the phase difference between the phase locked signal having the phase angle in accordance with the data generated at the phase angle data generation unit and the input signal from the signal processing unit, and a feedback unit generating a feedback control signal for feedback control so that the phase difference detected at the phase detection unit is converged to a constant value.

4. An angle detection signal processing apparatus as set forth in claim 3, wherein the phase angle data generation unit has:

a signal generation unit generating a signal having a frequency in accordance with the input feedback control signal and a counter dividing the frequency of the signal generated in the signal generation unit and outputs the count of the counter as the first data or the second data.

5. An angle detection signal processing apparatus as set forth in claim 3, wherein the phase detection unit selects the weight coefficient in accordance with the instantaneous value of the phase locked signal at a predetermined phase angle within the angular range of the destination of movement from among a plurality of weight coefficients when the phase angle indicated by the data of the phase angle data generation unit shifts to another angular range among a plurality of angular ranges forming part of one cycle and multiplies the selected weight coefficient with the input signal from the signal processing unit.

6. An angle detection signal processing apparatus as set forth in claim 2, wherein the phase angle data generation unit has a signal generation unit for generating a signal having a frequency in accordance with the input feedback control signal and a counter having a predetermined bit length for dividing the frequency of the signal generated in the signal generation unit, and wherein the phase angle data generation unit outputs the count of the counter as the first data or the second data.

7. An angle detection signal processing apparatus as set forth in claim 2, wherein the complex signal processing unit generates a signal in accordance with the real component or the imaginary component of the complex signal obtained when multiplying the first complex signal and the second complex signal as a signal in accordance with the deflection angle, and the feedback unit generates the feedback control signal for feedback control so that the signal generated in the complex computation unit is converged to a constant value.

8. An angle detection signal processing apparatus as set forth in claim 4, wherein the complex signal processing unit has a complex signal generation unit generating the first signal component and the second signal component having phase angles in accordance with the data generated at the phase angle data generation unit and orthogonal to each other, a first computation unit multiplying the first signal component generated in the complex signal generation unit and the real component of the first complex signal with each other, a second computation unit multiplying the second signal component generated in the complex signal generation unit and the imaginary component of the first complex signal, and a third computation unit computing a sum or a difference of the results of computation of the first computation unit and the second computation unit.

9. An angle detection signal processing apparatus as set forth in claim 7, wherein the complex signal processing unit has:

a fourth computation unit selecting a weight coefficient in accordance with an instantaneous value of the first signal component at a predetermined phase angle within an angular range of a destination of movement from among a plurality of weight coefficients when the phase angle indicated by the data of the phase angle data generation unit shifts to another angular range among a plurality of angular ranges forming parts of one cycle and multiplying the same with the real component of the first complex signal, a fifth computation unit selecting a weight coefficient in accordance with an instantaneous value of the second signal component at a predetermined phase angle within the angular range of the destination of movement from among a plurality of weight coefficients when the phase angle indicated by the data of the phase angle data generation unit shifts to another angular range among a plurality of angular ranges forming part of one cycle and multiplying the same with the imaginary component of the first complex signal, and a sixth computation unit computing the sum or difference of the results of computation of the fourth computation unit and the fifth computation unit.

10. An angle detection signal processing apparatus as set forth in claim 9, wherein the fourth computation unit multiplies the weight coefficient in accordance with the instantaneous value for each 1/k (k indicates a whole multiple of positive 4) of the first signal component with the real component of the first complex signal switched for each 1/k cycle based on the data generated at the phase angle data generation unit, and the fifth computation unit multiplies the weight coefficient in accordance with the instantaneous value for each 1/k of the second signal component with the imaginary component of the first complex signal switched for each 1/k cycle based on the data generated at the phase angle data generation unit.

11. An angle detection signal processing apparatus as set forth in claim 9, wherein the fourth computation unit multiplies the weight coefficient in accordance with the peak value for each half-cycle of the first signal component with the real component of the first complex signal switched for each semicycle based on the data generated at the phase angle data generation unit, and the fifth computation unit multiplies the weight coefficient in accordance with the peak value for each half-cycle of the second signal component with the imaginary component of the first complex signal switched for each semicycle based on the data generated at the phase angle data generation unit.

12. An angle detection signal processing apparatus for acquiring information of a first angle based on a detection output of a resolver including a first angle detection signal comprised of an amplitude of a first excitation signal having a first frequency modulated by a signal of a cosine function having the first angle and a second angle detection signal comprised of an amplitude of a second excitation signal having the first frequency modulated by a signal of a sine function having the first angle, said apparatus comprising a first phase angle data generation unit generating first data indicating a phase angle of the excitation signal having the first frequency to be supplied to the resolver, a signal processing unit outputting a signal having a phase difference in accordance with the first angle with respect to the phase angle indicated by the first data and, at the same time, having a first frequency based on the first angle detection signal and the second angle detection signal, a phase lock unit generating a phase locked signal obtained by locking the phase to the output signal of the signal processing unit and outputting the second data indicating the phase angle of the phase locked signal; and a phase difference computation unit computing the difference between the phase angle indicated by the first data and the phase angle indicated by the second data.

13. An angle detection signal processing apparatus as set forth in claim 12, wherein the first excitation signal and the second excitation signal are signals of cosine functions having the first frequency, the signal processing unit outputs a complex signal comprised of the first angle detection signal as a real component and the second angle detection signal as an imaginary component, and the phase lock unit has a second phase angle data generation unit generating data repeated in a cycle in accordance with the input feedback control signal and indicating the phase angle within the cycle as the second data, a complex signal processing unit generating a signal in accordance with the deflection angle of the complex signal obtained by multiplying the first complex signal input from the signal processing unit and a second complex signal including the first signal component and the second signal component having phase angles in accordance with the second data generated at the second phase angle data generation unit and orthogonal to each other and having a frequency set at the predetermined polarity; and a feedback unit generating a feedback control signal for feedback control so that the deflection angle is converged to a constant value in accordance with the signal generated in the complex signal processing unit.

14. An angle detection signal processing apparatus as set forth in claim 13, wherein the second phase angle data generation unit has a signal generation unit generating a signal having a frequency in accordance with the input feedback control signal and a counter dividing the frequency of the signal generated in the signal generation unit and outputs the count of the counter as the second data.

15. An angle detection signal processing apparatus as set forth in claim 13, wherein the complex signal processing unit generates a signal in accordance with the real component or the imaginary component of the complex signal obtained when multiplying the first complex signal and the second complex signal as a signal in accordance with the deflection angle, and the feedback unit generates the feedback control signal for feedback control so that the signal generated in the complex computation unit is converged to a constant value.

16. An angle detection signal processing apparatus as set forth in claim 15, wherein the complex signal processing unit has:

a fourth computation unit selecting a weight coefficient in accordance with an instantaneous value of the first signal component at a predetermined phase angle within an angular range of a destination of movement from among a plurality of weight coefficients when the phase angle indicated by the data of the second phase angle data generation unit shifts to another angular range among a plurality of angular ranges forming parts of one cycle and multiplying the same with the real component of the first complex signal, a fifth computation unit selecting a weight coefficient in accordance with an instantaneous value of the second signal component at a predetermined phase angle within the angular range of the destination of movement from among a plurality of weight coefficients when the phase angle indicated by the data of the second phase angle data generation unit shifts to another angular range among a plurality of angular ranges forming part of one cycle and multiplying the same with the imaginary component of the first complex signal, and a sixth computation unit computing the sum or difference of the results of computation of the fourth computation unit and the fifth computation unit.

17. An angle detection signal processing apparatus as set forth in claim 12, wherein the first excitation signal is a signal of a cosine function having the first frequency, the second excitation signal is a signal of a sine function having the first frequency, the signal processing unit outputs the sum or difference of the first angle detection signal and the second angle detection signal to the phase lock unit, and a phase lock unit has a second phase angle data generation unit generating data repeated in a cycle in accordance with the input feedback control signal and indicating the phase angle within the cycle as the second data, a phase detection unit detecting the phase difference between the phase locked signal having a phase angle in accordance with the second data generated in the second phase angle generation unit and the input signal from the signal processing unit, and a feedback unit generating a feedback control signal for feedback control so that the phase difference detected at the phase difference detection unit is converged to a constant value.

18. An angle detection signal processing apparatus as set forth in claim 17, wherein the second phase angle data generation unit has a signal generation unit generating a signal having a frequency in accordance with the input feedback control signal and a counter dividing the frequency of the signal generated in the signal generation unit and outputs the count of the counter as the second data.

19. An angle detection signal processing apparatus as set forth in claim 17, wherein the phase detection unit selects the weight coefficient in accordance with the instantaneous value of the phase locked signal at a predetermined phase angle within the angular range of the destination of movement from among a plurality of weight coefficients when the phase angle indicated by the data of the phase angle data generation unit shifts to another angular range among a plurality of angular ranges forming part of one cycle and multiplies the selected weight coefficient with the input signal from the signal processing unit.

* * * * *